(12) United States Patent
Ikriannikov et al.

(10) Patent No.: US 9,319,008 B2
(45) Date of Patent: *Apr. 19, 2016

(54) DIFFERENTIAL OUTPUT INDUCTOR FOR CLASS D AMPLIFIER

(71) Applicant: Versatile Power, Inc., Campbell, CA (US)

(72) Inventors: Alexandr Ikriannikov, Castro Valley, CA (US); David Hoffman, Santa Cruz, CA (US); Noah A. Wilson, Felton, CA (US)

(73) Assignee: Versatile Power, Inc., Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/201,627

(22) Filed: Mar. 7, 2014

(65) Prior Publication Data

US 2014/0312968 A1  Oct. 23, 2014

Related U.S. Application Data

(63) Continuation of application No. 13/344,392, filed on Jan. 5, 2012, now Pat. No. 8,669,809, and a continuation-in-part of application No. 12/605,311, filed on Oct. 23, 2009, now Pat. No. 8,115,366.

(60) Provisional application No. 61/429,974, filed on Jan. 5, 2011, provisional application No. 61/107,982, filed on Oct. 23, 2008, provisional application No. 61/182,325, filed on May 29, 2009.

(51) Int. Cl.
*H03F 3/185* (2006.01)
*B06B 1/02* (2006.01)
*H03F 3/217* (2006.01)
*H03H 7/01* (2006.01)

(52) U.S. Cl.
CPC .............. *H03F 3/185* (2013.01); *B06B 1/0261* (2013.01); *H03F 3/217* (2013.01); *H03H 7/0115* (2013.01); *H03F 2200/03* (2013.01)

(58) Field of Classification Search
USPC ....................................... 330/10, 207 A, 251
See application file for complete search history.

(56) References Cited

U.S. PATENT DOCUMENTS

| | | | | |
|---|---|---|---|---|
| 4,968,948 | A * | 11/1990 | Tokumo et al. | 330/10 |
| 6,653,897 | B2 * | 11/2003 | Sawashi | 330/10 |
| 6,856,192 | B2 * | 2/2005 | Muramatsu | 330/10 |
| 7,355,473 | B2 * | 4/2008 | Wu | 330/10 |
| 7,432,793 | B2 * | 10/2008 | Nussbaum | 336/223 |
| 2013/0044895 | A1 * | 2/2013 | Terwal | 381/94.1 |

* cited by examiner

*Primary Examiner* — Hieu Nguyen
(74) *Attorney, Agent, or Firm* — Terrence J. Edwards; TechLaw Ventures, PLLC

(57) ABSTRACT

A circuit includes a first input terminal for receiving a first pulsed voltage and a second input terminal for receiving a second pulsed voltage. The circuit further includes a load and an LC filter. The LC filter includes a coupled inductor pair that includes a first winding and a second winding magnetically coupled to each other. The first winding is coupled between the first input terminal and the load, and the second winding is coupled between the second input terminal and the load. A frequency of a first current flowing through the first winding is increased by the second pulsed voltage applied to the second winding.

18 Claims, 55 Drawing Sheets

Fig. 23A   Fig. 23B

DIFFERENTIAL OUTPUT INDUCTOR FOR CLASS D AMPLIFIER

CROSS REFERENCE TO RELATED APPLICATIONS

This application is a continuation of co-pending U.S. application Ser. No. 13/344,392, filed Jan. 5, 2012, which claims the benefit of U.S. Provisional Application No. 61/429,974 filed on Jan. 5, 2011, and which is a Continuation-In-Part of U.S. application Ser. No. 12/605,311, filed on Oct. 23, 2009 (now U.S. Pat. No. 8,115,366), which claims the benefit of U.S. Provisional Application No. 61/107,982, filed on Oct. 23, 2008, and U.S. Provisional Application No. 61/182,325, filed on May 29, 2009, which are incorporated by reference for all purposes as if fully set forth herein.

STATEMENT REGARDING FEDERALLY SPONSORED RESEARCH OR DEVELOPMENT

Not applicable.

BACKGROUND

1. Field

This invention relates generally to audio applications and ultrasonic transducers, and more particularly, to a system and method for driving audio speakers and ultrasonic transducers.

2. Description of the Related Art

Ultrasonic transducers have been in use for many years. During that time little change has occurred in the way they are driven. Current driving circuits are based on resonant technology that has many limitations.

Current technology depends on resonant circuits to drive ultrasonic transducers. Resonant circuits are, by definition, designed to operate in a very narrow range of frequencies. Because of this the transducer tolerances are held very tightly to be able to operate with the driving circuitry. In addition, there is no possibility of using the same driving circuit for transducers with different frequencies, and the circuit must be changed for every transducer frequency.

To drive ultrasonic transducers, a method is often required to generate frequencies with high accuracy and very high frequency shifting speed. Tank circuits have been used to address this need. Tank circuits, which comprise a particular transducer coupled to circuitry uniquely configured to work with the transducer, allow the transducer to be driven at the resonance frequency specific to the particular transducer. A draw back with prior art systems and methods is that the circuitry of the tank circuit often cannot be used with another transducer having a different resonance frequency.

There is a need for a system and method for driving any transducer regardless of the resonance frequency of the transducer. Such a system and method may drive multiple transducers each having a different frequency, thereby allowing device manufacturers to take advantage of economies of scale by implementing the same driver with various transducers having different frequencies.

SUMMARY

Briefly and in general terms, the present invention is directed to a system and method for driving ultrasonic transducers.

In aspects of the invention, a circuit includes a first input terminal for receiving a first pulsed voltage, and a second input terminal for receiving a second pulsed voltage. The circuit further includes a load and an LC filter. The LC filter includes a coupled inductor pair that includes a first winding and a second winding magnetically coupled to each other. The first winding is coupled between the first input terminal and the load, and the second winding is coupled between the second input terminal and the load. A frequency of a first current flowing through the first winding is increased by the second pulsed voltage applied to the second winding.

In aspects of the present invention, a method of filtering a signal includes applying a first pulsed voltage to a first winding. A second pulsed voltage is applied to a second winding, wherein the first and second windings are magnetically coupled. An output current is provided to a load coupled between the first and second windings. The output current is sourced from the first winding and sunk at the second winding. A frequency of a first current flowing through the first winding is increased by the second pulsed voltage applied to the second winding.

The features and advantages of the invention will be more readily understood from the following detailed description which should be read in conjunction with the accompanying drawings.

BRIEF DESCRIPTION OF THE DRAWINGS

For proper understanding of the invention, reference should be made to the accompanying drawings, wherein:

FIGS. 23A, 23B, 23C, 23D, 23E, 23F and 23G illustrate various circuits containing various combinations of a D-inductor and filter components according to various embodiments of the invention.

DETAILED DESCRIPTION OF THE PREFERRED EMBODIMENT(S)

Figure 1:
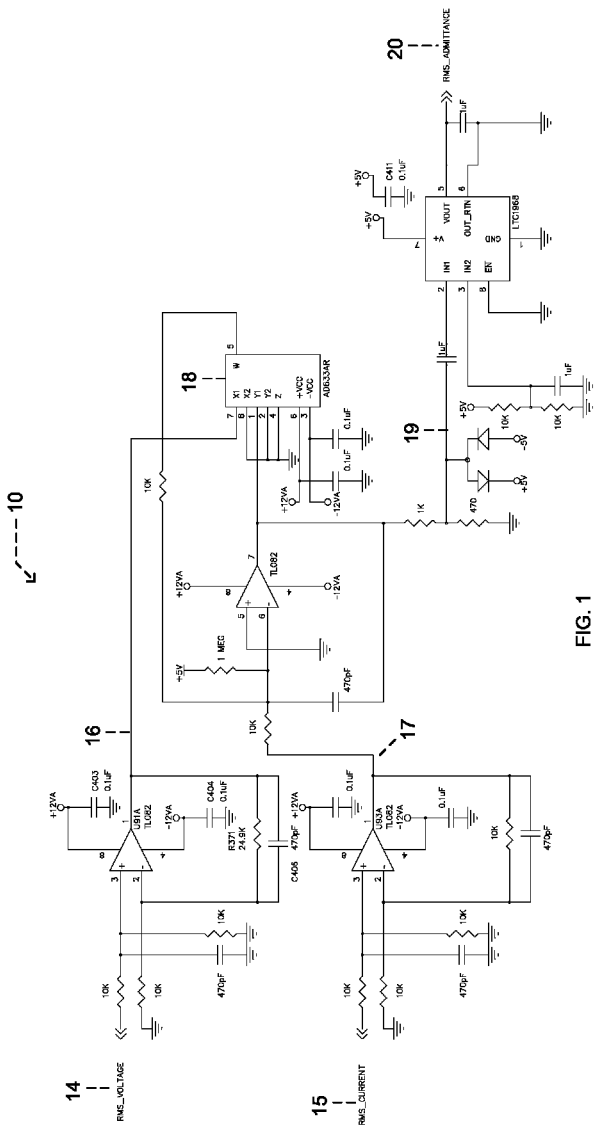
FIG. 1 is a schematic diagram showing a circuit configured to determine admittance according to some embodiments of the invention.

Some embodiments of the present invention involve hardware and software. The hardware may include a switching amplifier to create a sine wave output to an ultrasonic transducer. The ultrasonic transducer can be a piezoelectric transducer. The switching amplifier can be run with high efficiency over a broad range of frequencies and can, therefore, be used to drive transducers of many frequencies. The switching amplifier can also drive transducers that do not have tightly held frequency tolerances thereby reducing transducer production cost. This allows for reduction of production cost due to economies of scale and allows for customers that use different frequency transducers to always be able to use the same driver.

Previous ultrasonic generators have relied on resonant power sources or analog amplifiers to drive the transducer. In some embodiments of the present invention a class D or class E amplifier is used to amplify the output of a digitally controlled AC source. This technique frees the manufacturer and user from the requirement of designing a resonant system around a specific transducer. Instead, this system is usable for any transducer over a broad range of frequencies.

Previous class D and class E amplifiers have used traditional LC or cascaded LC filters to significantly reduce the effects of the class D or E carrier frequency on the signal frequency. In some embodiments of the present invention a two phase output signal is used in conjunction with a coupled transformer to reduce the effect of the carrier frequency to several times lower than could be done with similar size and cost components with the traditional LC type filters.

In some embodiments of the present invention, software could run entirely on low cost, 16-bit, integer-only microcontrollers. The more powerful DSP (digital signal processor) modules typically required in prior art are not required in the present invention, although DSP modules could be used in some embodiments.

A method is required to generate a wide range of frequencies with high accuracy and very high frequency shifting speed. A digital synthesizer could be used in an ultrasonic system to allow rapid and flexible frequency control for output of a frequency generator.

In some embodiments, dead time is minimized in switching circuits in order to minimize the output impedance to the transducer. The phrase "dead time" is the time in power switching circuits when all switching elements are off to prevent cross conduction. When determining the resonant frequency a minimum or maximum admittance is used. The admittance measured will vary much less between in resonance and out of resonance in a low Q system than in a high Q system. The dimensionless parameter "Q" refers to what is commonly referred to in engineering as the "Q factor" or "quality factor." Because Q is directly affected by the impedance of the driving circuit, this impedance must be kept very low. In addition to the commonly considered impedances of the output transformer, driving semiconductors, PCB (printed circuit board) and other directly measurable impedances, Applicants have found that the dead time has a very strong effect on the output impedance of the driver. As such, the switching circuit is configured to have a very small (approximately 50 nanoseconds) dead time. In some embodiments, the switching circuit has a dead time that is greater than or less than 50 nanoseconds.

For optimum operation, it is critical that the transducer be run at or near its resonant frequency point. The resonant frequency point of the transducer is defined as the frequency at which maximum real power is transferred from the drive amplifier to the transducer. Much work has been done to determine the best method for measuring when a transducer is at or near resonance.

Applicants have found that the admittance of the transducer gives a reliable indication of the proximity of the transducer to its resonant frequency point. Admittance is defined as the RMS (root-mean-square) amplitude of the transducer drive current divided by the RSM amplitude of the transducer drive voltage. The circuit 10 shown in FIG. 1 determines the RMS (root mean square) value of the admittance 12 of a driven transducer in real time. The RMS value of the admittance is used for analysis by software contained and run by the hardware. The RMS value of the admittance 12 is obtained from the RMS voltage 14 across the transducer and RMS current 16 supplied to the transducer.

The circuit in FIG. 1 is an example of a circuit that measures the real-time admittance of the load. RMS voltage 14 and RMS Current 15 are filtered. The filtered signals for voltage 16 and current 17 are fed into an analog divider 18 and the resultant output 19 is fed to an RMS converter. The final output 20 is RMS admittance. This is a known means to measure admittance.

Applicants have found that the phase of the transducer also gives a reliable indication of the proximity of the transducer to its resonant frequency point. Phase is defined as the phase angle between the transducer drive voltage and transducer drive current.

Figure 2:
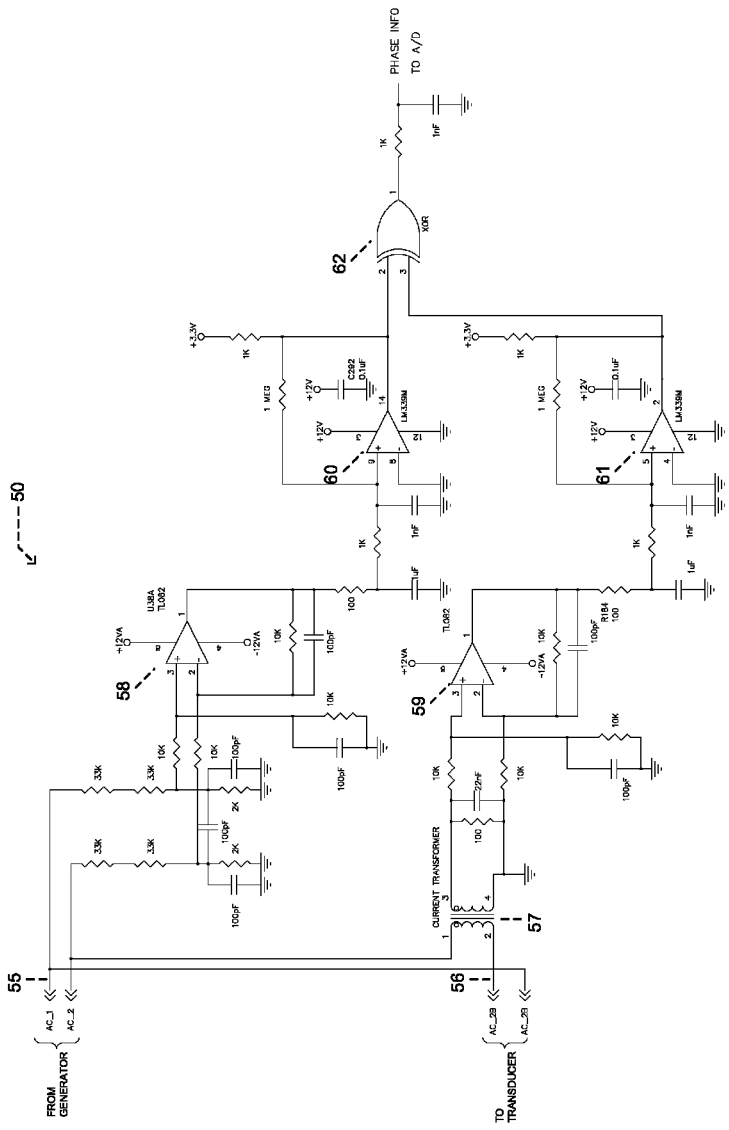
FIG. 2 is a schematic diagram showing a circuit having an exclusive OR gate, the circuit configured to determine a phase angle according to some embodiments of the invention.
Figure 2A:
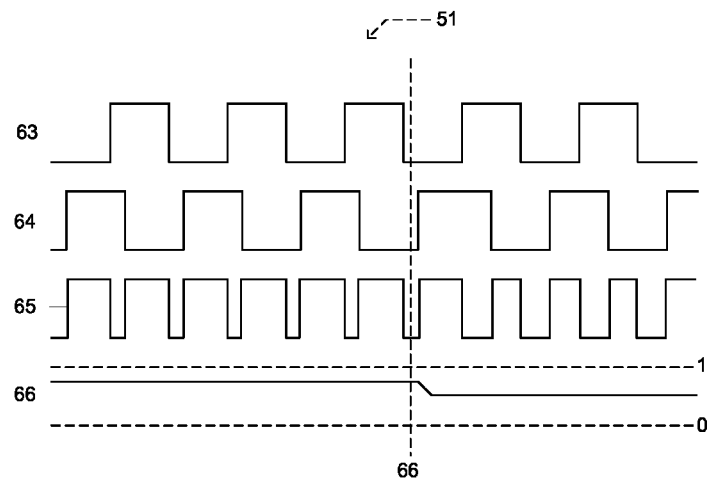
FIG. 2a is a flow diagram showing waveforms into and out of an exclusive OR gate of the circuit of FIG. 2.

The circuit shown in FIG. 2 is an example of a circuit that derives the phase relationship of two input signals. The voltage driving signal from the generator 55 is buffered and filtered by amplifier 57. The current of the generator signal is found by passing the generator output through current transformer 57 and then buffering and filtering this signal through amplifier 59. Each output (current and voltage) is put into a comparator. The output of the comparator will be high when the respective signal is above zero volts and will be low when it is below zero volts. The output of the comparators, therefore, transition when the input signal crosses zero. If the point where each signal crosses zero is compared an indication of the phase relationship will be known. To find this phase relationship and convert it into an analog voltage, an exclusive OR gate 62 is used and is output is passed through a simple RC filter. The waveforms into and out of the exclusive OR gate are shown in FIG. 2a. In this example signal 63 represents the output of the comparator for the voltage and signal 64 represents the output of the comparator for the current signal. The reader can observe that the two signals are out of phase and that the phase relationship changes at time 66. Persons skilled in the art will recognize that the output of an exclusive OR gate will be high when the input signals are different and low when they are the same. Signal 65, therefore, shows the output of the exclusive OR gate. The RC filter effectively integrates the waveform 65 resulting in signal 67. As can be seen, the result is an analog voltage 67 that is proportional to the phase relationship of the two input waveforms, 63, 64. This analog signal 67 is then input to the processor.

Figure 3:
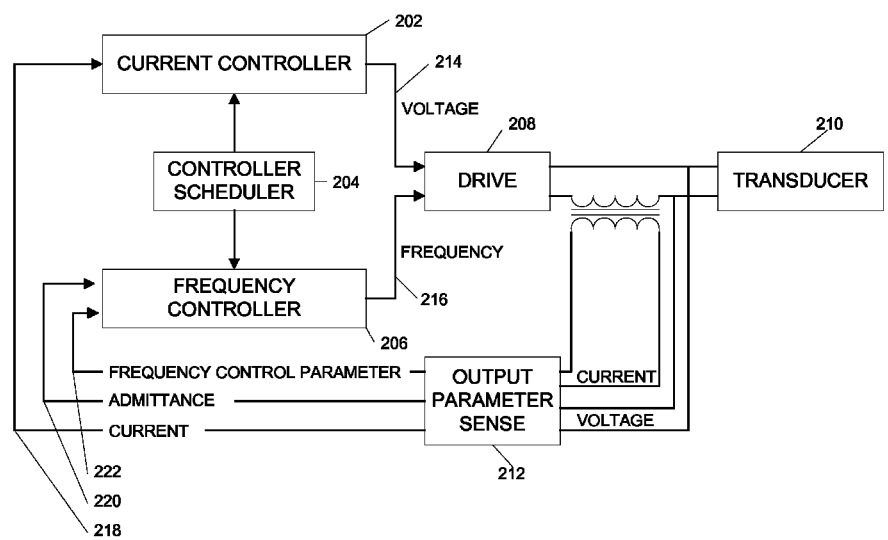
FIG. 3 is a block diagram showing a system for driving a transducer according to some embodiments of the invention.

FIG. 3 depicts a system and method of driving an ultrasonic transducer. The method may be implemented by hardware and software combined to provide adaptive feedback control to maintain optimum conversion of electrical energy provided to the transducer to motion of transducer elements.

In FIG. 3, the system 200 includes two controllers: a current controller 202 that maintains a constant commanded transducer current; and a frequency controller 206 that searches for and tracks the operating frequency. A controller scheduler 204 interleaves the operation of the two controllers 202, 206 to reduce the operation of one controller adversely affecting the operation of the other controller.

The drive 208 provides a drive signal of controlled voltage and controlled frequency to the transducer 210. An output parameter sense circuit 212 senses transducer drive voltage and transducer drive current and generates a measure of current 218, admittance 220, and a frequency control parameter 222. The frequency control parameter is different in different embodiments.

Current 218 is applied as an input to the current controller 202 which generates a voltage 214 applied to the drive 208. The current controller 202 sets the voltage 214 to maintain the current required for correct operation of the transducer 210 in its given application.

The frequency controller 206 performs two functions: frequency scanning and frequency tracking. The frequency scanning function searches for a frequency that is at or near the resonant frequency of the transducer. The frequency tracking function maintains the operating frequency at or near the resonant frequency of the transducer.

When the frequency controller 206 is frequency scanning, admittance 220 is applied to it as an input. The frequency controller sweeps the drive frequency over a range of frequencies appropriate for the transducer and application, searching for the resonant frequency.

When the frequency controller 206 is frequency tracking, a frequency control parameter 222 is applied to it as an input. The frequency controller sets the frequency required for correct operation of the transducer in its given applications.

When the frequency controller 206 performs either frequency scanning or frequency tracking, it applies the calculated frequency 216 to the drive 208.

The drive 208 may include the switching amplifier and switching circuits described above. The frequency controller 206 may include the digital synthesizer described above.

Frequency Controller

As previously mentioned, the frequency controller 206 performs two functions: frequency scanning and frequency tracking.

In many applications, initial application of drive to the transducer at its resonant frequency is critical. When, due to variations in transducer characteristics, applied power levels, and the mechanical load the transducer connects to, the resonant frequency is not a priori known, the frequency controller may perform a frequency scan to establish the drive frequency at or near the resonant frequency.

Figure 4:
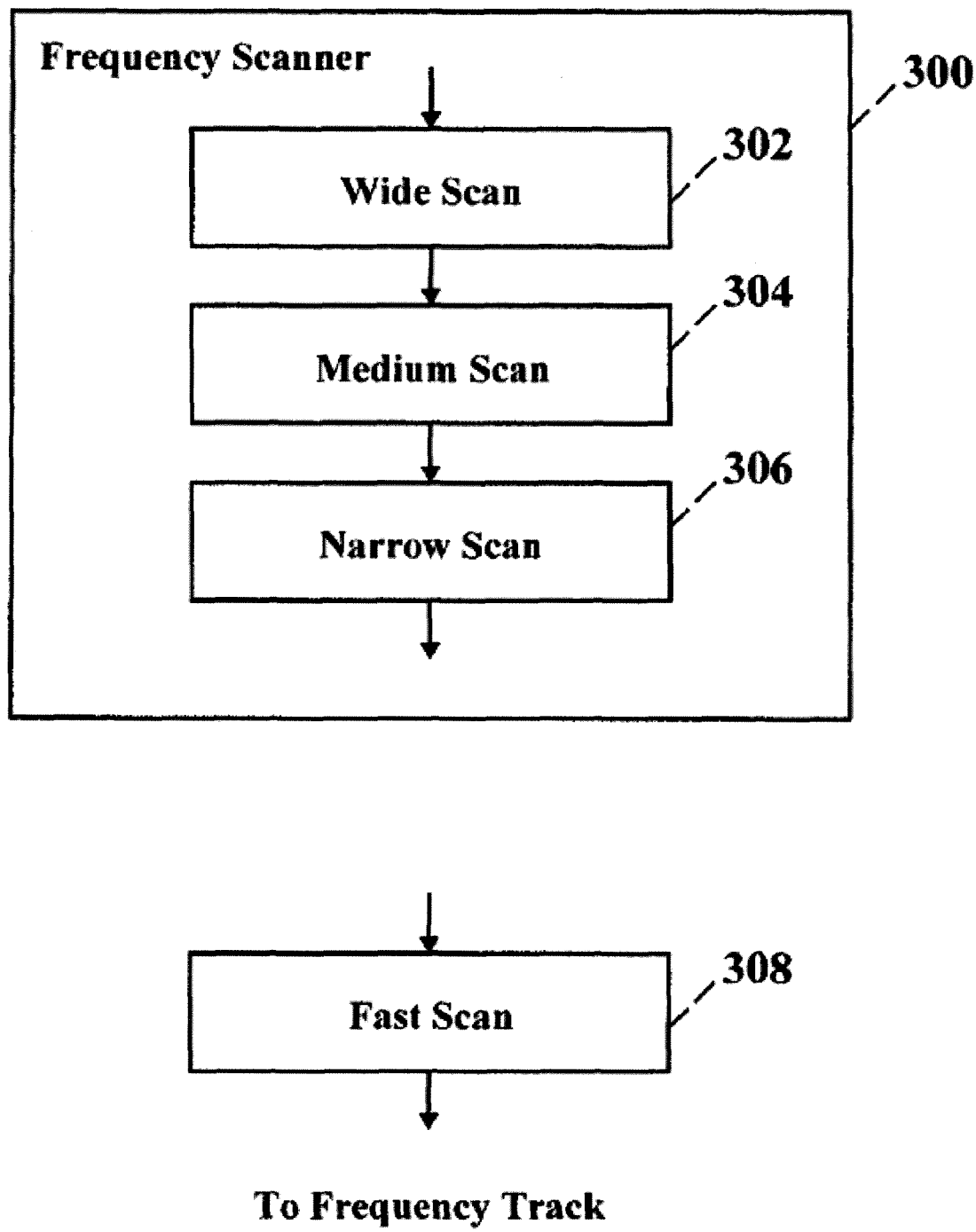
FIG. 4 is a flow diagram showing elements of a frequency controller according to some embodiments of the invention.

When performing a frequency scan, the frequency controller searches a predefined range of frequencies for the frequency at which the transducer admittance is maximum. As shown in FIG. 4, the frequency scanner 300 is made up of three sweep scans: a wide scan 302, which is followed immediately by a medium scan 304, which is followed immediately by a narrow scan 306. The wide scan includes a ±1 kHz sweep about a predefined frequency, in 4 Hz steps, with a 10 msec settling time after each step, and detecting the admittance after each settling time. The medium scan includes a ±100 Hz sweep about the frequency of maximum admittance detected by the wide scan, in 2 Hz steps, with a 25 msec settling time after each step, and detecting the admittance after each settling time. The narrow scan includes a ±10 Hz sweep about the frequency of maximum admittance detected by the medium scan, in 1 Hz steps, with a 50 msec settling time after each step.

In some embodiments, admittance is detected after each narrow scan settling time and, at completion of the narrow scan, the drive frequency is set to the frequency of maximum detected admittance.

In some embodiments, phase is detected after each narrow scan settling time and, at completion of the narrow scan, the drive frequency is set to the frequency with detected phase closest to the phase required for correct operation of the transducer in its given application.

An ultrasonic transducer will often have multiple frequencies at which the commanded phase is measured. The frequency of maximum admittance will always be at or close to the resonant frequency, the frequency of maximum real power transfer. For this reason, maximum admittance is used for wide and medium scans for the operating point, regardless of the method used in the narrow scan.

The frequency scanner 300 can be executed at either full power (as defined by the user) or at a predefined low power of less than 5 watts, measured at transducer resonance.

The frequency controller 206 may optionally perform a fast scan 308 as part of its operation, immediately prior to initiation of a frequency track algorithm. The fast scan includes a ±10 Hz sweep about the current frequency, in 2 Hz steps, with a 10 msec settling time after each step.

In some embodiments, admittance is detected after each fast scan settling time and, at completion of the fast scan, the drive frequency is set to the frequency of maximum detected admittance.

In some embodiments, phase is detected after each fast scan settling time and, at completion of the fast scan, the drive frequency is set to the frequency with detected phase closest to the phase required for correct operation of the transducer in its given application. The fast scan 308 can be executed at either full power or at less than 5 watts power.

The transducer resonant frequency may fluctuate during normal operation. This fluctuation may occur due to changes in operating conditions of the transducer, such as changes in temperature of the transducer and mechanical load on the transducer. Frequency tracking can be performed to compensate for this fluctuation in resonant frequency.

Figure 5:
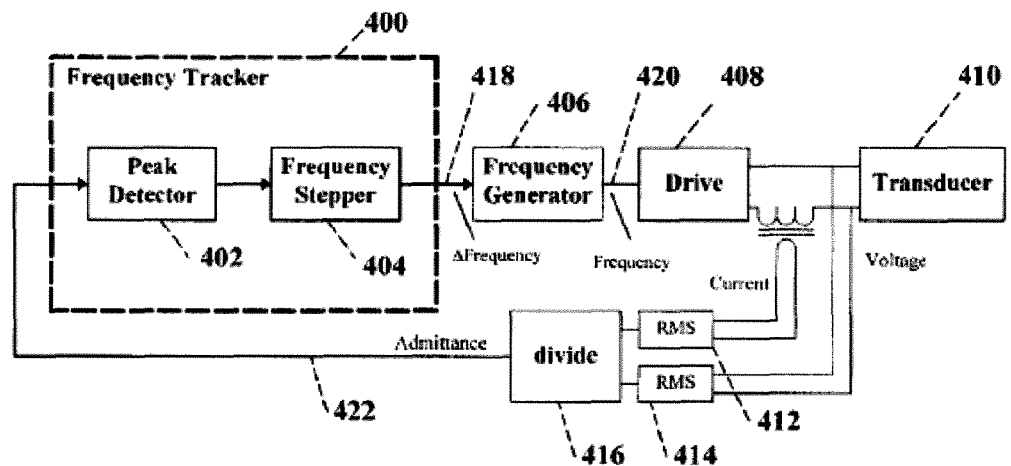
FIG. 5 is a block diagram showing a frequency tracker utilizing admittance according to some embodiments of the invention.

FIG. 5 shows an embodiment of a frequency tracker. The frequency tracker 400 is comprised of two components: a peak detector 402 and a frequency stepper 404. The peak detector samples the transducer admittance 422. The peak detector then commands the frequency stepper 404 to take a random-size step, between 1 and 10 Hz in a random direction, either up or down. The frequency stepper calculates the random step size and direction and sends the frequency step, .DELTA. frequency 418, to the frequency generator 406 which generates the new drive frequency 420 and applies it to the drive 408 (208 in FIG. 3). The frequency tracker delays a short time period based on the size of the frequency step (nominally 10 to 50 msecs) to allow the transducer to settle on the newly commanded frequency. Transducer 410 drive current and transducer drive voltage are continually monitored and converted to their RMS equivalent values by RMS converters 412 and 414, respectively. The divider 416 divides RMS current by RMS voltage to calculate admittance 422 which is applied to the peak detector 402. With this admittance, the peak detector calculates the change in detected admittance that resulted from the step in frequency.

If the detected admittance has increased by greater than a predefined amount, the next step 418 is taken in the same direction as the previous step, with step size based on the magnitude of the increase in admittance. For example, the magnitude of the step can be proportional to the detected increase in admittance. If the detected admittance has decreased by greater than a predefined amount, the next step 418 is taken in the opposite direction, with the magnitude of the step being based on the magnitude of the increase in admittance. If the detected admittance has neither increased by greater than a predefined amount nor decreased by greater than a predefined amount, the admittance is assumed to be at its peak and a zero magnitude "step" is taken. The frequency tracker delays a short time period to allow the transducer to settle and the peak detection and step sequence is repeated.

The maximum admittance of a transducer may increase, remain unchanged, or decrease, depending on changes in operating conditions of the transducer. Frequency tracking for increasing and unchanging maximum admittance values is performed by the above-described frequency tracking method. Tracking the resonant frequency associated with a decreasing admittance maximum is performed by stepping quickly in equal magnitude steps in both directions about the current frequency until the decrease in admittance stops and increased admittance values are again detected. The Frequency Controller then changes the frequency to again lock on the point of maximum admittance.

The frequency tracking method described above can be implemented with an algorithm within software being run by the hardware of the system 200.

Figure 6:
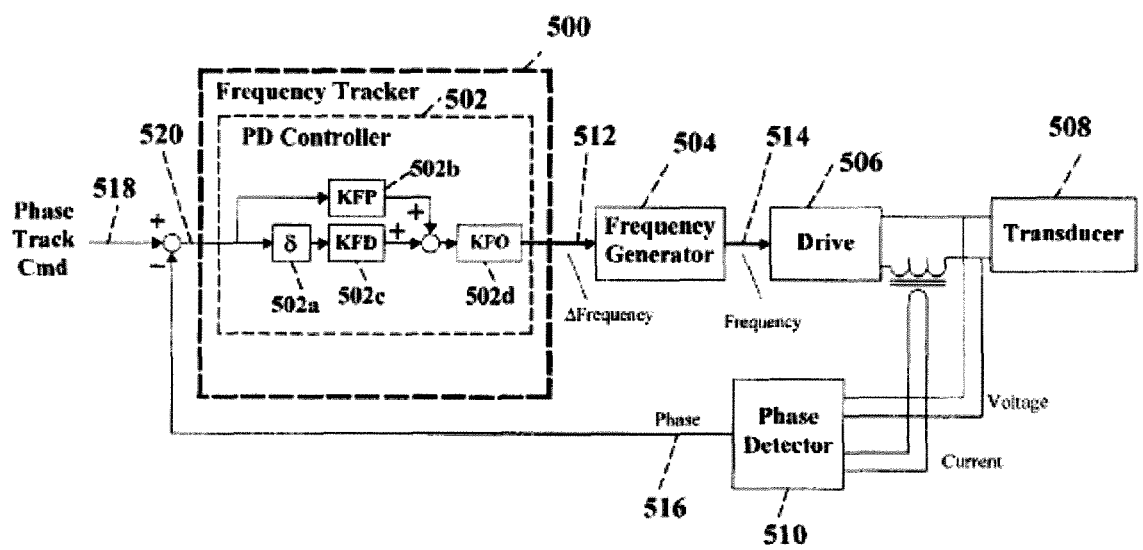
FIG. 6 is a block diagram showing a frequency tracker applying phase error to a PD controller according to some embodiments of the invention.

Another embodiment of the frequency tracker, shown in FIG. 6, uses the phase angle 516 between the transducer drive voltage and the transducer drive current to maintain the resonant frequency. For some ultrasonic transducers, the resonant frequency occurs at zero phase. For some transducers, and related to the transducer operating conditions, the resonant frequency occurs with a negative phase value. Commanded phase 518 is empirically selected for a given transducer with given set of operating conditions.

The frequency tracker 500 performs frequency tracking by applying a phase angle error term 520 to a Proportional-Derivative (PD) controller 502 at regular sampling intervals of between 5 and 20 msecs. The phase angle error term is calculated to be the difference between the phase track command 518 and the measured transducer phase 516. The PD controller 502 includes a differentiator, .delta. 502a, a proportional gain, KFP 502b, a differential gain, KFD 502c, and an output gain, KFO 502d. The output from the PD controller 502 in response to a phase error 520 is a step in frequency, A frequency 512, of magnitude and sign necessary to drive the phase error 520 toward zero. The step in frequency 512 is applied to the frequency generator 504 which calculates the new frequency 514. The driver drives the transducer 508 at the frequency 514 from the frequency generator 504.

Current Controller

Figure 7:
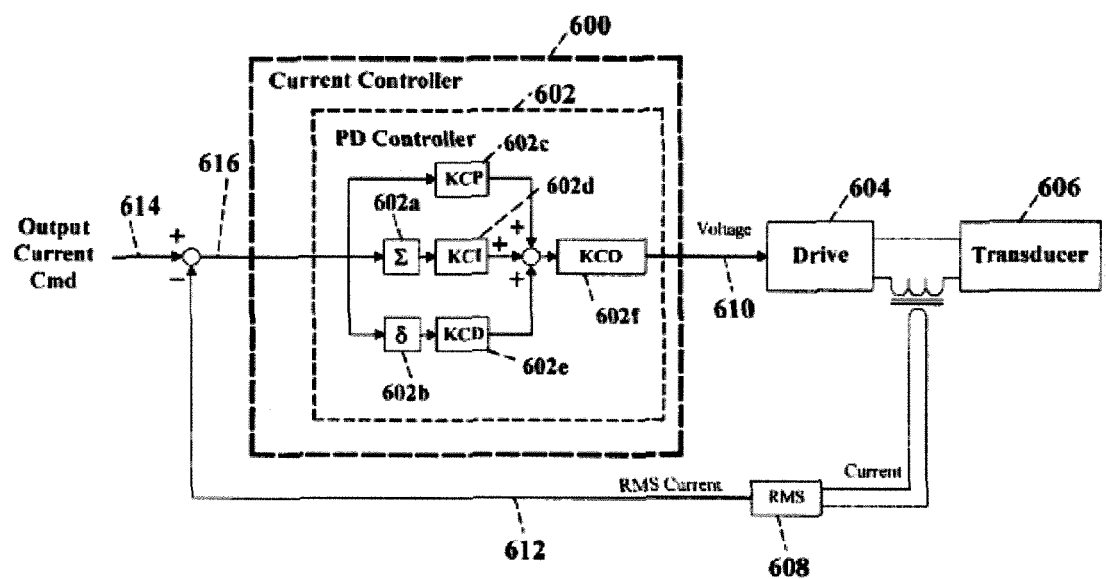
FIG. 7 is a block diagram showing a current controller applying current error to a PID controller according to some embodiments of the invention.

FIG. 7 shows an embodiment of the current controller 202 in FIG. 3. The current controller 600 maintains current through the transducer at a constant, user-commanded level 614. The user commanded level 614 may correspond to a desired level of operation of a device containing a transducer. For example, the user commanded level may correspond to a desired energy level of a surgical cutting device containing a piezoelectric transducer.

The current controller 600 varies the current through the transducer by varying the drive voltage applied across the transducer. Increasing the drive voltage increases the transducer current and decreasing the drive voltage decreases the transducer current. In some embodiments, the current controller 600 provides a voltage 610 to the drive 604, and this voltage is provided by the drive 604 to the transducer 606.

At a regular sampling intervals, ranging between 5 and 20 msecs, the current controller 600 samples the transducer current and converts it to an RMS current value 612 by an RMS converter 608. At each sampling interval the current controller 600 calculates a current error term 616 by subtracting the sample of the output RMS current 612 from the commanded current 614.

The current controller 600 applies a current error term 616 to a Proportional-Integral-Derivative (PID) controller 602, which generates a response 610 to the error 616. The error 616 is integrated by an integrator 602a and differentiated by a differentiator 602b. The error 616 and its integral and differential are multiplied respectively by the P, I, and D gains, 602c, 602d, 602e internal to the PID controller, summed, and their sum multiplied by the controller output impedance factor KCO 602f to form the controller output voltage 610. Controller gains, 602c, 602d, 602e, 602f are set to achieve maximum rise time with an approximately 10% overshoot in the output response to a step in the input. The output impedance factor 602f provides both scaling and translation from current to voltage. The controller output voltage 610 is applied to driver 604 to be amplified to become the transducer drive voltage.

In some embodiments, the current controller 600 employs two output impedance factors 602f. A larger output impedance factor may be used for the first period of time (nominally 500 msecs) to assure the transducer reaches its steady-state behavior at the given drive power, physical load, and temperature as rapidly as possible. A smaller output impedance factor may be used once the transducer has reached its steady-state behavior. When the switch from the first to the second output impedance factor occurs, the integral of the current error maintained by the PID controller is modified to prohibit an undesired transient in the transducer drive voltage.

In FIG. 3, when the frequency controller 206 sets a drive frequency that results in a change in the frequency control parameter 222, because the transducer current will also change, the current controller 202 will attempt to counter this change. If the frequency controller and the current controller are allowed to operate concurrently, the operation of the frequency controller and the current controller may be in conflict. If the effect of the frequency controller 206 is stronger, frequency tracking will take precedence over a constant output current, and the output current may wander from the commanded value. Conversely, if the effect of the current controller 206 is stronger, a constant output current will take precedence over frequency tracking, and the drive frequency may wander from the transducer resonant frequency.

To achieve balanced operation, the controller scheduler 204 interleaves the operation of the frequency controller 206 and the current controller 202.

When the frequency controller is performing a scan or search operation, the controller scheduler disables the current controller.

When the frequency controller is tracking frequency, in some embodiments the controller scheduler alternates the operation of the two controllers. That is, a controller will execute every 5 N msecs, with the current controller executing for odd N and the frequency controller executing for even N.

In some embodiments, both controllers are allowed to operate simultaneously, except immediately after a frequency step. When the frequency controller is tracking frequency, the controller scheduler disables the current controller for the first M 5-msec periods after a frequency step. The number of periods, M, is typically 2, but can be more or less than 2. At the end of the M periods, the frequency control parameter is now only a result of the step in frequency and not of control exerted by the current controller. The frequency control parameter is sampled at this time and stored for the next frequency controller calculation, and the controller scheduler re-enables the current controller.

Output Amplifier and Filtering

Figure 8:
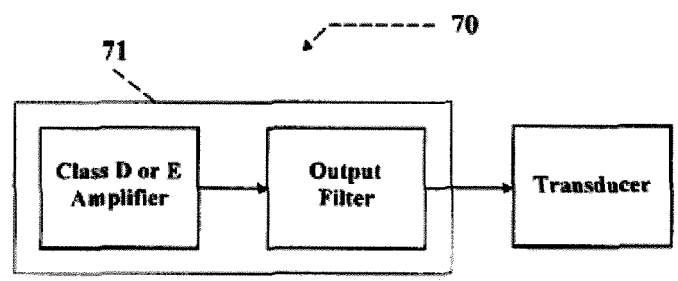
FIG. 8 is a block diagram showing an output filter for filtering a drive signal to a transducer according to some embodiments of the invention.

The output of the processor running the code discussed previously is a small signal with all the characteristics of necessary to drive and ultrasonic transducer except for the amplitude. The drive circuit 208, 408, 506 can be broken down into two sections as shown in FIG. 8. In FIG. 8 the drive section 71 comprises an amplifier of Class D or E and an output filter.

Prior art has used linear amplifiers for this drive section. These have the disadvantages of being large, inefficient and costly. The illustrated embodiment of FIG. 8 uses a switching amplifier which in some cases can be of Class D or E. Use of switching amplifiers is common in audio applications but new to the field of ultrasonic.

In some embodiments, the drive 208, 408, 506 includes filter circuitry. In some embodiments with a transducer operational range of 20 kHz to 60 kHz, the filter circuitry is configured to have a corner frequency higher than 60 kHz to avoid excessive resonant peaking Depending on the type of transducer and its intended use, it will be appreciated that the transducer operational range can be lower than 20 kHz and/or higher than 60 kHz, and the filter circuitry can be configured to have a corner frequency higher than the transducer operational range. The carrier frequency used can be about 10 times that of the transducer resonance frequency.

In some embodiments the filter circuitry is configured to reduce transmission of the carrier frequency (Fs) from a switching amplifier of the drive 208, 408, 506. Non-limiting examples of filter circuitry are described below.

Figure 9:
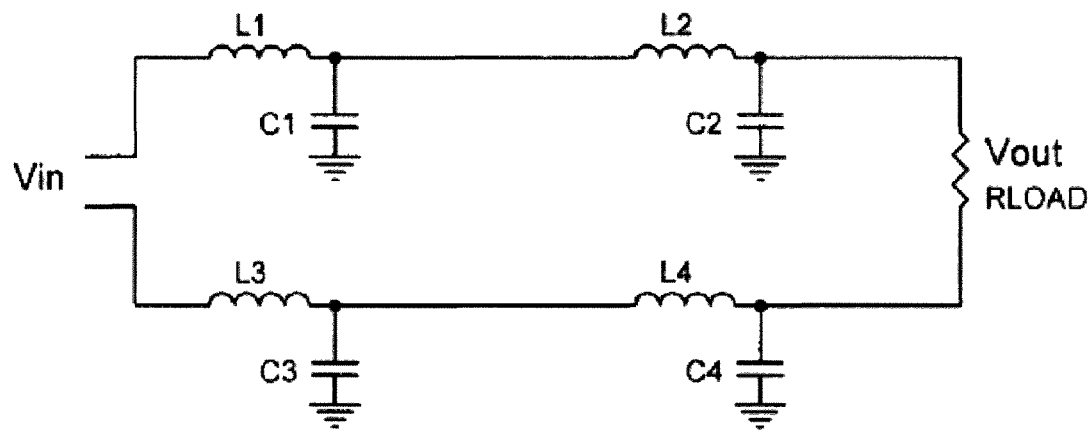
FIG. 9 is a schematic diagram showing a prior art output filter comprising a cascaded LC filter.

In previous art, the output filter of a switching amplifier is typically implemented with an LC or cascaded LC filter. An example of a cascaded LC filter is shown in FIG. 9. FIG. 9 shows the required elements (L1, C1, L2, C2, L3, C3, L4, C4) and the load (RLOAD).

Figure 10:
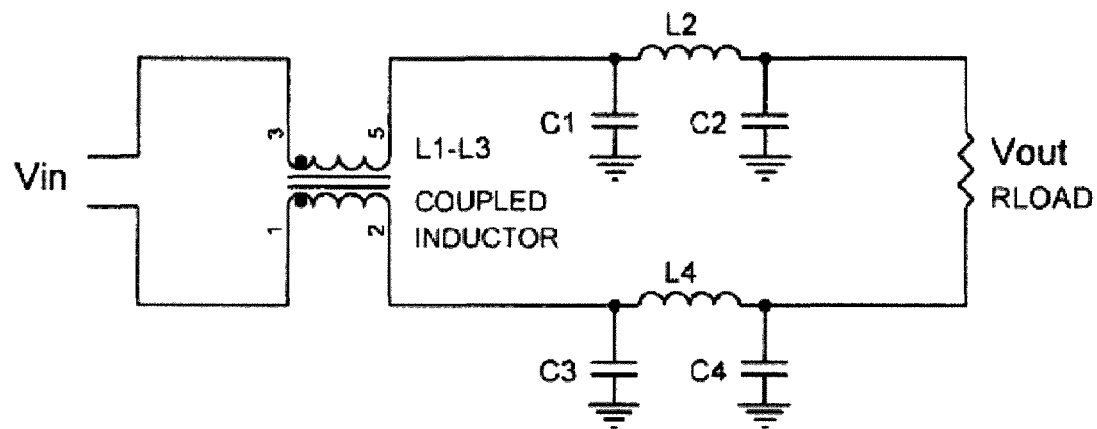
FIG. 10 is a schematic diagram showing an output filter comprising a coupled LCLC filter having magnetically coupled inductors according to some embodiments of the invention.

Part of this invention is a new form of output filter (applicable for any switching amplifier) that includes a coupled inductor as part of the output filter. An example schematic of this new coupled LCLC filter is shown in FIG. 10. FIG. 10 shows the required elements (L1-L3, C1, C3, L2, C2, L4, C4) and the load (RLOAD). The coupled inductor is designed to have a relatively large leakage inductance. Leakage inductance is defined as the residual inductance measured in the winding of a transformer (or coupled inductor) when the unmeasured winding is shorted. When a winding is shorted the magnetizing inductance associated with two windings is eliminated and the remaining inductance is series connection of the leakage inductances in both windings. In case of symmetrical design for both windings, the leakage inductances are close in value, and can be found by measurement by dividing the measured total leakage by two. This leakage inductance acts in place of the separate inductors L1 and L3 shown in FIG. 9, in fact, insuring the same inductance values would insure the same frequency response of the system: with separate or magnetically coupled inductors. In addition to the leakage inductance of the coupled inductor a portion of the signal from one winding is coupled to the other winding.

Figure 11:
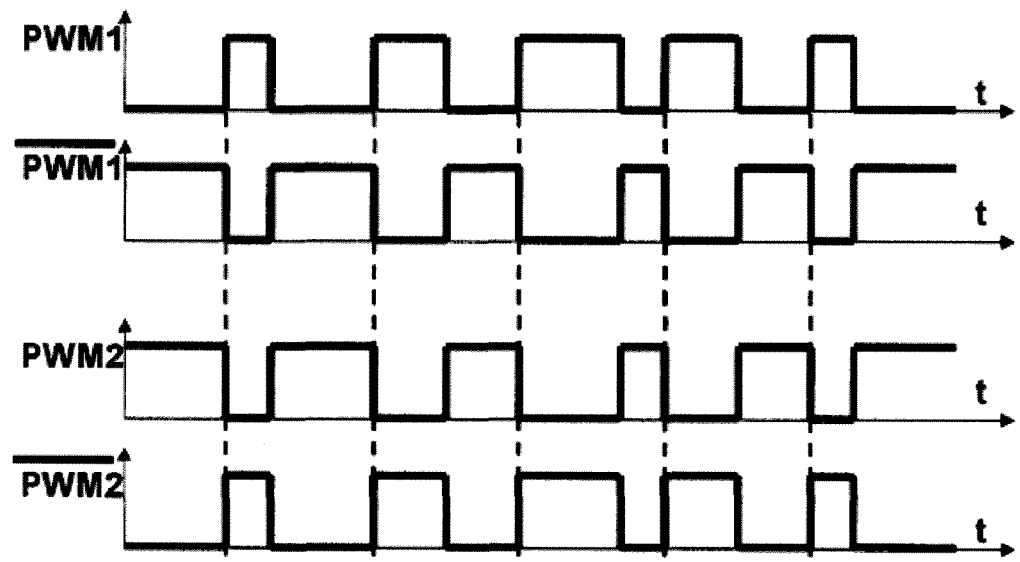
FIG. 11 is a chart showing PWM signals for a dual channel D class amplifier with differential outputs in which the switching periods for all the signals are aligned.
Figure 12:
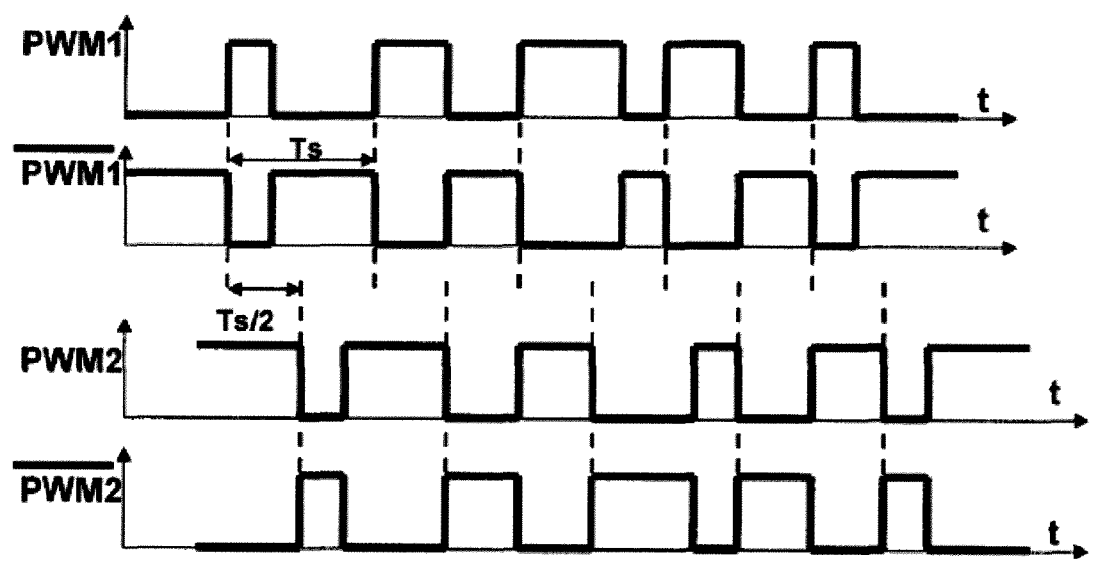
FIG. 12 is a chart showing PWM signals for a dual channel D class amplifier with differential outputs in which a phase shift is inserted between PWM signals for the two channels.

To take advantage of the coupled inductor, a second change is made to the system. The class D or E amplifier from FIG. 8 is often dual channel amplifier, delivering differential output to the load. As typically the same signal is amplified for a singe output, one PWM modulator is used to derive pulses for the both amplifier channels, insuring such connection that output of one channel increases voltage, when another channel decrease the output voltage, and vise versa. This is a common scheme for providing a differential output for such amplifiers. It is also simple to use the same PWM signal and its inverted signal to drive switching devices in both channels of the amplifier, as for example illustrated in FIG. 11 the switching periods for all the signals are aligned. The proposed scheme, on the other hand, inserts a phase shift between PWM signals for the two channels, as shown in FIG. 12. The proposed phase shift between periodic signals is 180 degrees, or half the period. Phase shift between the signals is shown as Ts/2, half of the switching period Ts.

Figure 13:
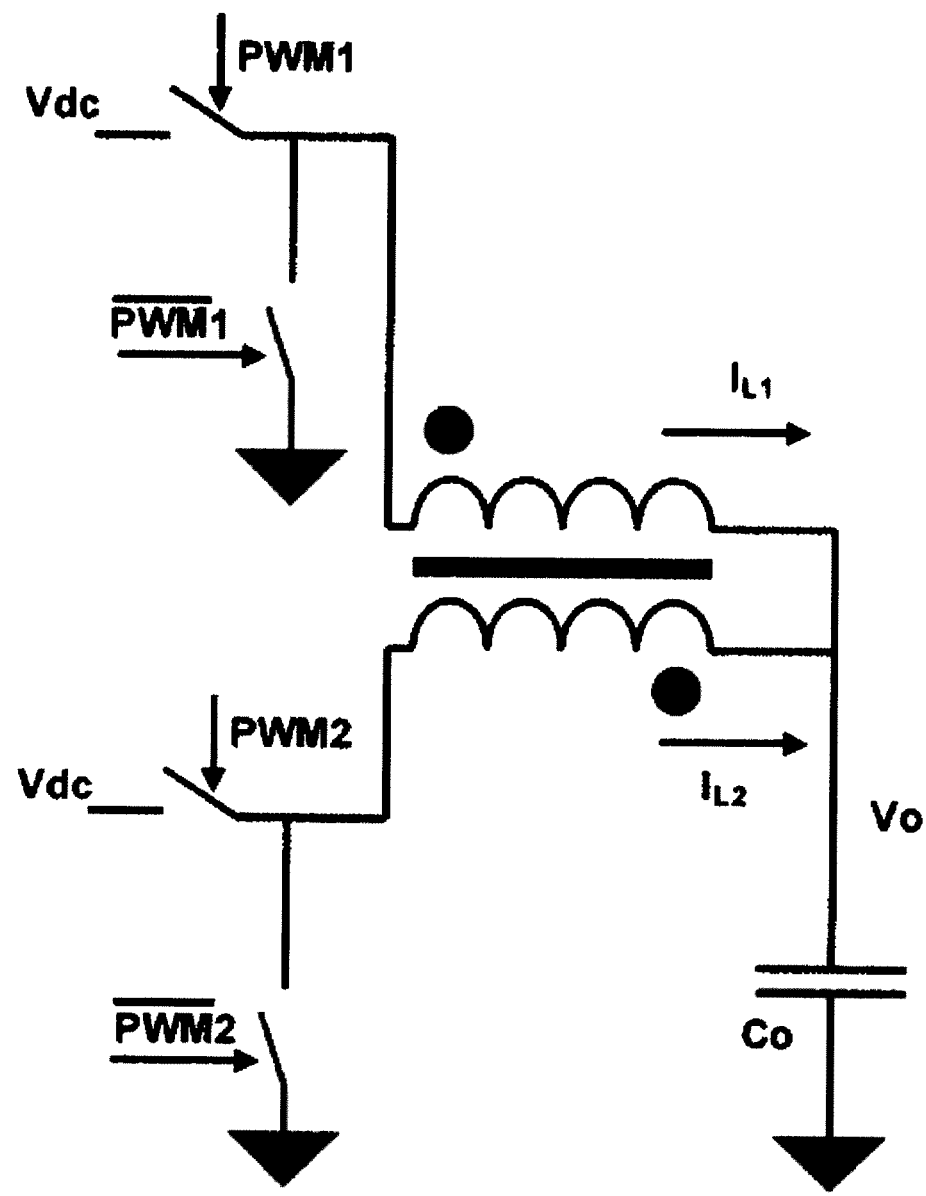
FIG. 13 is a schematic diagram showing a prior art multiphase buck converter with coupled inductors.

The described phase shift between two or more channels can be found in prior art, for example in multiphase buck converter applications, or in U.S. Pat. No. 6,362,986 to Shultz et al., entitled "Voltage converter with coupled inductive windings, and associated methods." U.S. Pat. No. 6,362,986 represents closer prior art, as it has phase shift together with magnetic coupling between inductors, as illustrated in FIG. 13, where only two phases of multiphase buck converter are shown. This inventions proposed arrangement is shown in FIG. 14, so the differences from prior art in FIG. 13 are illustrated clearly.

Figure 14:
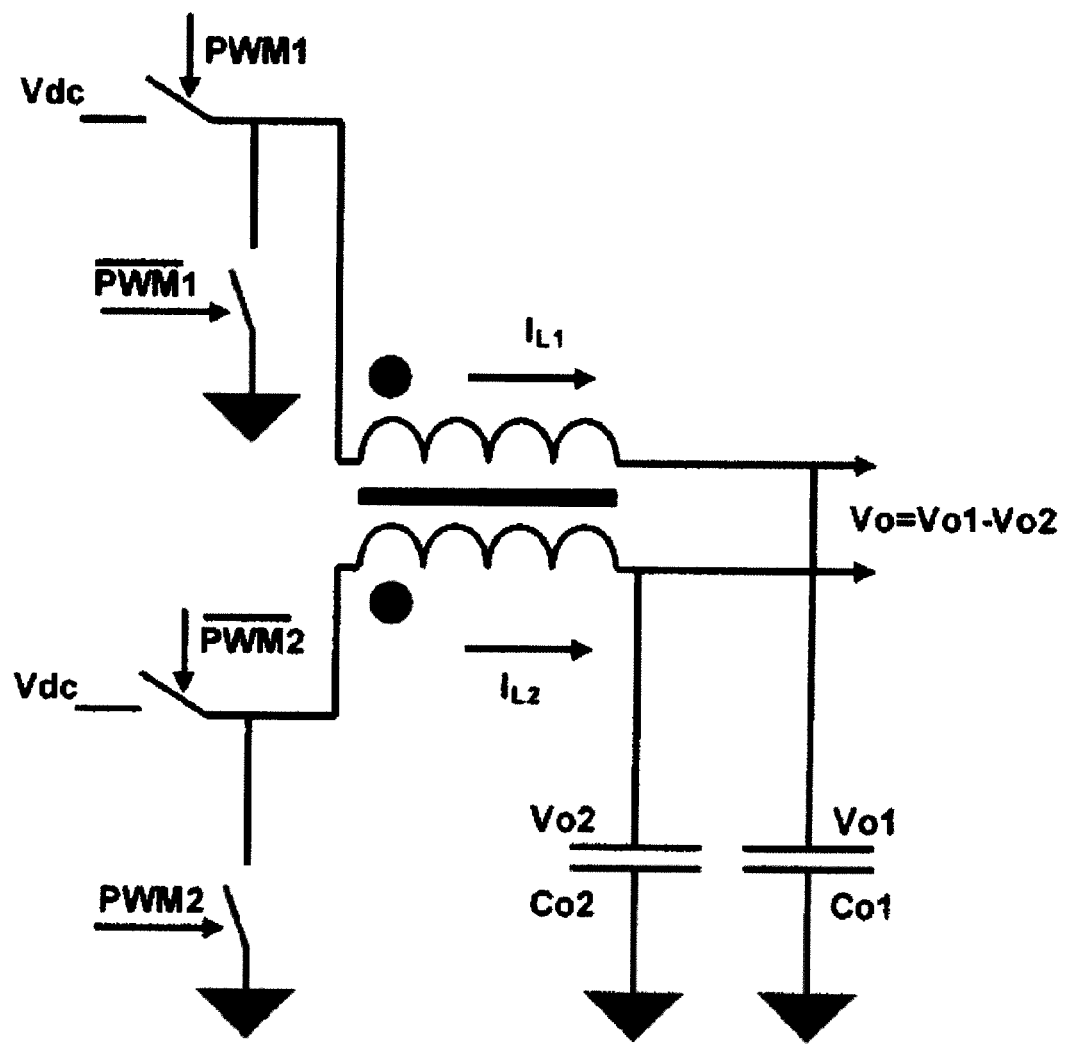
FIG. 14 is a schematic diagram showing a differential amplifier output stage with coupled inductors according to some embodiments of the invention.

Notice that the output voltage of circuit in FIG. 14 is differential, while in FIG. 13 it is not. With zero input signal for the amplifier, the duty cycle of both PWM1 and PWM2 in FIG. 14 is 0.5, so Vo1=Vo2=Vdc/2. This relates to zero differential output voltage. When input signal is applied to modulators, if Vo1 rises to positive rail Vdc from Vdc/2—then Vo2 is dropping towards zero from the same Vdc/2. The currents in inductors in FIG. 14 are also opposite, as compared to added currents in FIG. 13. If current IL1 is positive (sourcing), then the current IL2 is negative (sinking). Notice also that the average values of the IL1 and IL2 in FIG. 14 are absolutely equal, as these outputs are effectively shorted to each other through the load in series. The magnetic coupling of proposed arrangement in FIG. 14 is also in phase, relatively to the pins connected to the outputs of the amplifier channels or phases. The prior art arrangement in FIG. 13 uses inverse magnetic coupling, relatively to the outputs of the buck converter stages. The load in FIG. 13 is typically connected from the common connection of all inductors to the ground or return, while the load for circuit in FIG. 14 should be connected between two differential outputs.

Magnetic coupling between windings in FIG. 14 effectively doubles the frequency of the current ripple in each winding because when one winding or channel switches it induces a current ripple in the opposite winding even though that winding did not switch yet (due to the phase shift).

Figure 15:
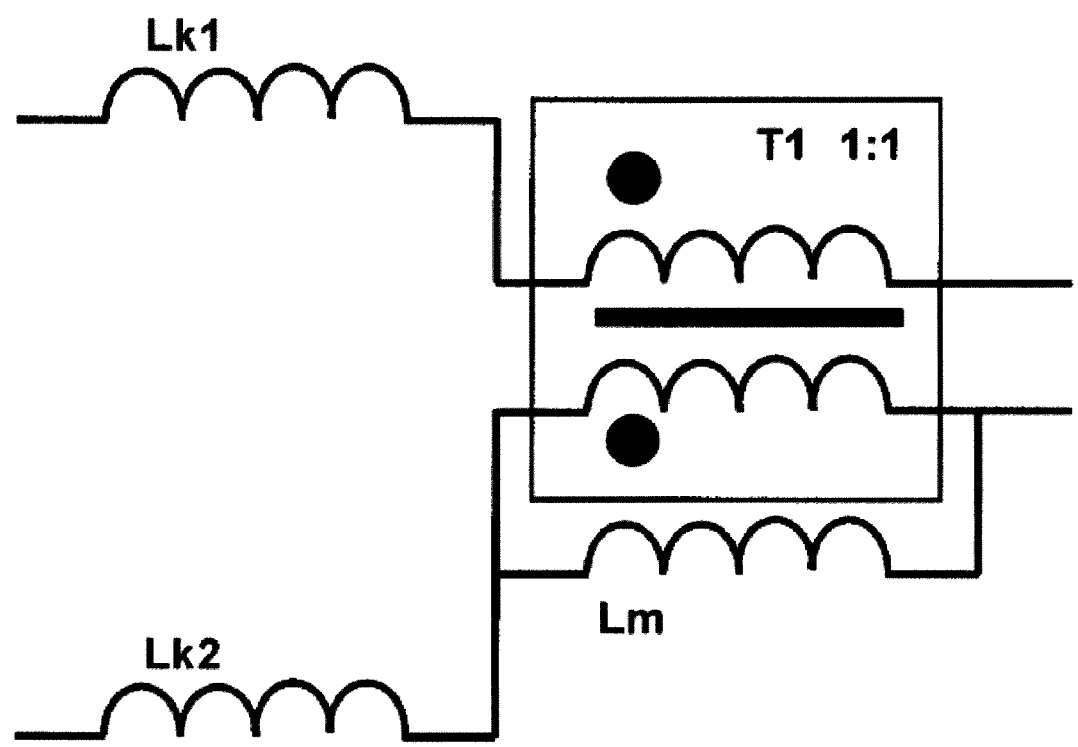
FIG. 15 is schematic diagram showing a simplified general model of the coupled inductor of FIG. 14.

The coupled inductor from FIG. 14 can be modeled as ideal transformer T1 in FIG. 15, with ideal magnetic coupling, with added magnetizing inductance Lm and leakages in each winding Lk1 and Lk2. These leakage inductances could be also made external, for example, standard transformer with good magnetic coupling and negligible leakage could be used with external separate inductance added in series with each winding. The general coupled inductor model for arrangement in FIG. 14 is shown in FIG. 15, where Lk1 and Lk2 can be leakage inductances of the common structure, or dedicated external inductors.

Figure 16:
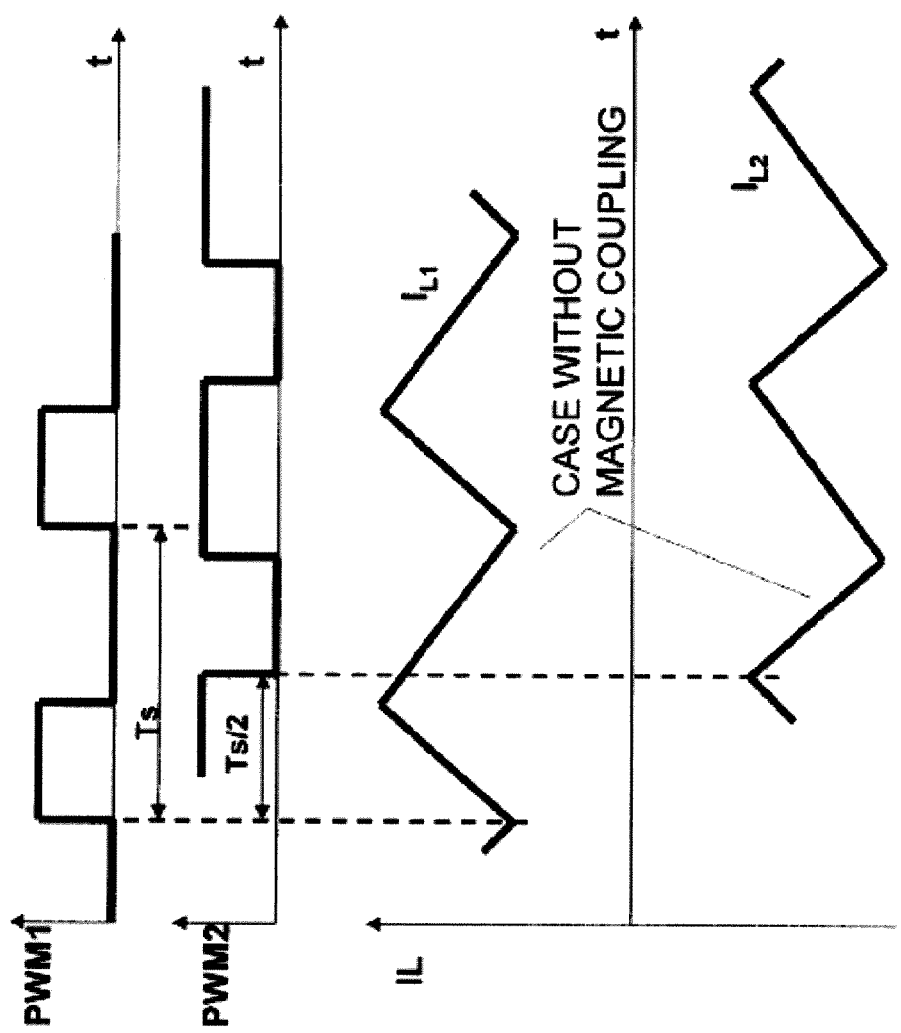
FIG. 16 is a chart showing waveforms for FIG. 14 when inductors are not magnetically coupled.
Figure 17:
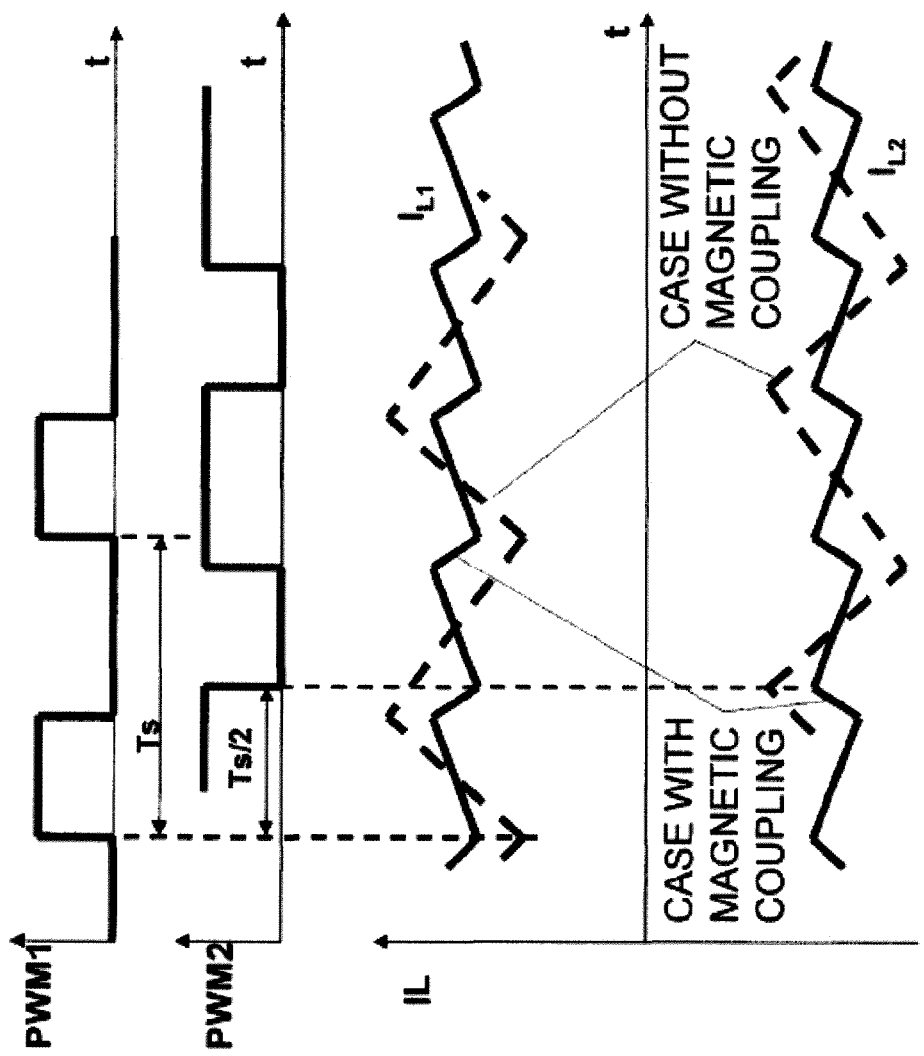
FIG. 17 is a chart showing waveforms for FIG. 14 when inductors are magnetically coupled, the solid lines for inductor current corresponding to inductors magnetically coupled and broken lines for inductor current corresponding to inductors without magnetic coupling.
Figure 18:
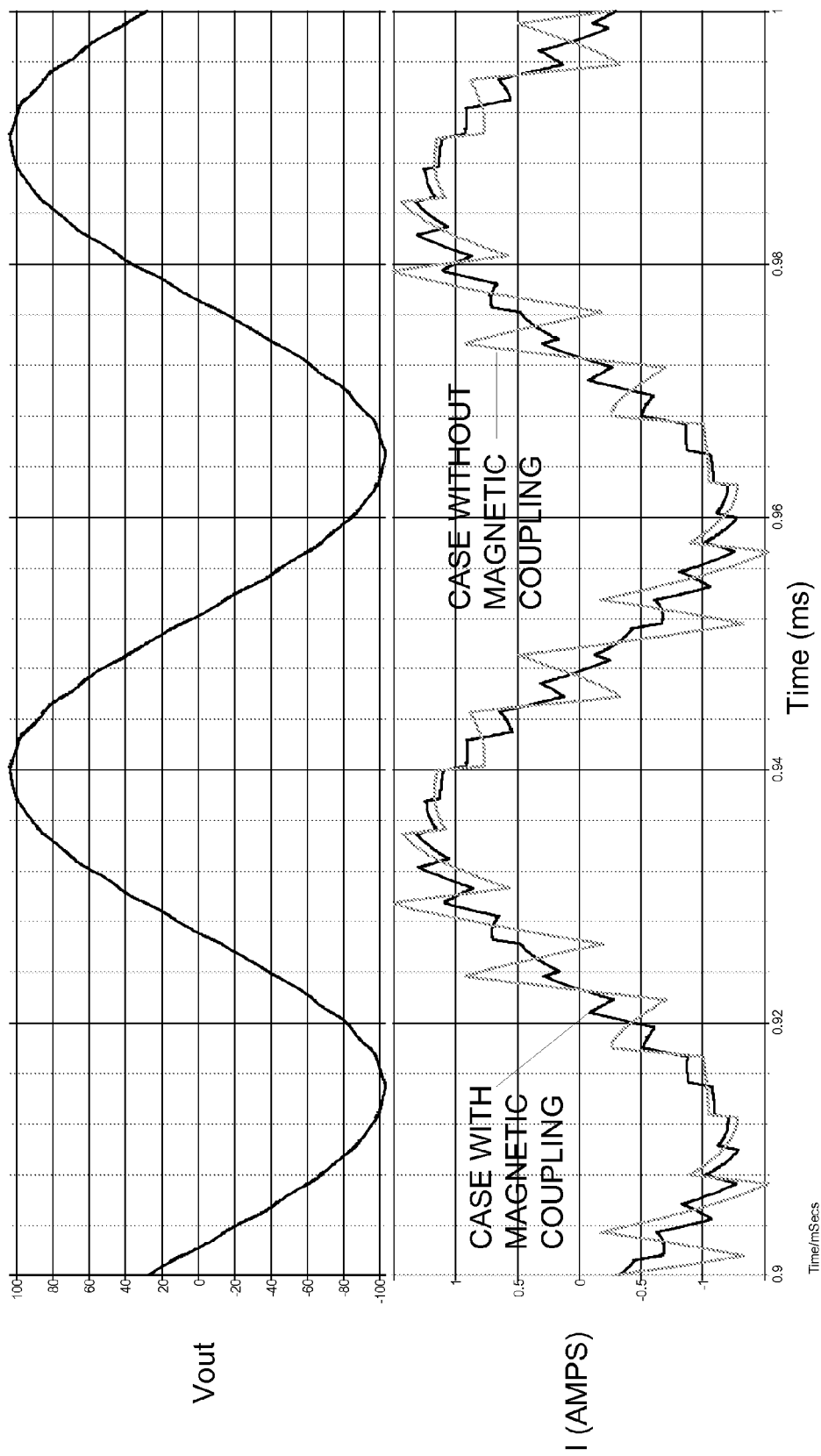
FIG. 18 is a chart showing waveforms for a 20 kHz output signal with 90 µH/94 nF filters with added 180 phase shift in a second oscillator, Vdc=100 V, Rload=100, the solid lines for inductor current corresponding to inductors magnetically coupled and broken lines for inductor current corresponding to inductors without magnetic coupling.

Waveforms for the circuit in FIG. 14 with no magnetic coupling between inductors is shown in FIG. 16. Inductors work as energy storage components, ramping current up and down under applied voltage across the related inductor. Applied voltage changes only due to the switching of the related power circuit, where the inductor is connected. FIG. 17 shows the same waveforms but when inductors in FIG. 14 are magnetically coupled. Due to magnetic coupling, applied voltage across the leakage inductances is changed not only due to the switching of the related power circuit, where the inductor is connected, but also when another power circuit switches. This effectively doubles the frequency of the current ripple in each coupled inductor, for the illustrated case where two inductors are magnetically coupled, and the phase shift between two driving signals is 180 degrees. This coupling effect leads to the decrease of the current ripple amplitude in the each inductor. FIG. 18 illustrates the decrease of the current ripple in inductor for particular example. Sine wave signal of the 20 KHz frequency is delivered at the differential output of the amplifier, where two channels have a phase shift for the switching signals of 200 KHz main PWM frequency. The bottom traces show inductor current without and with magnetic coupling, clearly indicating the current ripple decrease.

The decreased current ripple offers several benefits to the circuit and its performance. Decreased current ripple makes it easier for the output filter to achieve low noise levels and low output voltage ripple at the output, in other words—either smaller attenuation could be used as compared to the case without magnetic coupling, or lower noise level can be achieved. Decreased amplitude of the current ripple also means that the RMS value of the current waveform is lower, which relates to lower conduction losses. Lower current ripple also implies lower peaks of the current, which relates to the lower stress in switching devices of the power circuits. As the DC component of the load current is the same in both coupled inductors (the outputs are connected to each other through the load so the load current is equal), and since these currents create opposite magnetic flux for arrangement shown in FIG. 14—cancellation of the DC component of the magnetic flux in the core is beneficial for the small core size and low core losses. The decrease of the current ripple is generally good for EMI decrease, and makes it easier to pass regulatory requirements. While the performance of the filter in terms of the amplifier signals is dependent on the leakage inductance values, the noise signals of the Common Mode (same in both output nets) will be attenuated by much larger magnetizing inductance. In this regard, Common Mode noise, often being present in circuits and representing a need for additional high frequency filtering for the output connections, will be attenuated at much higher degree in magnetically coupled inductor arrangement in FIG. 14, as compared to the same arrangement but without magnetic coupling.

Figure 19:
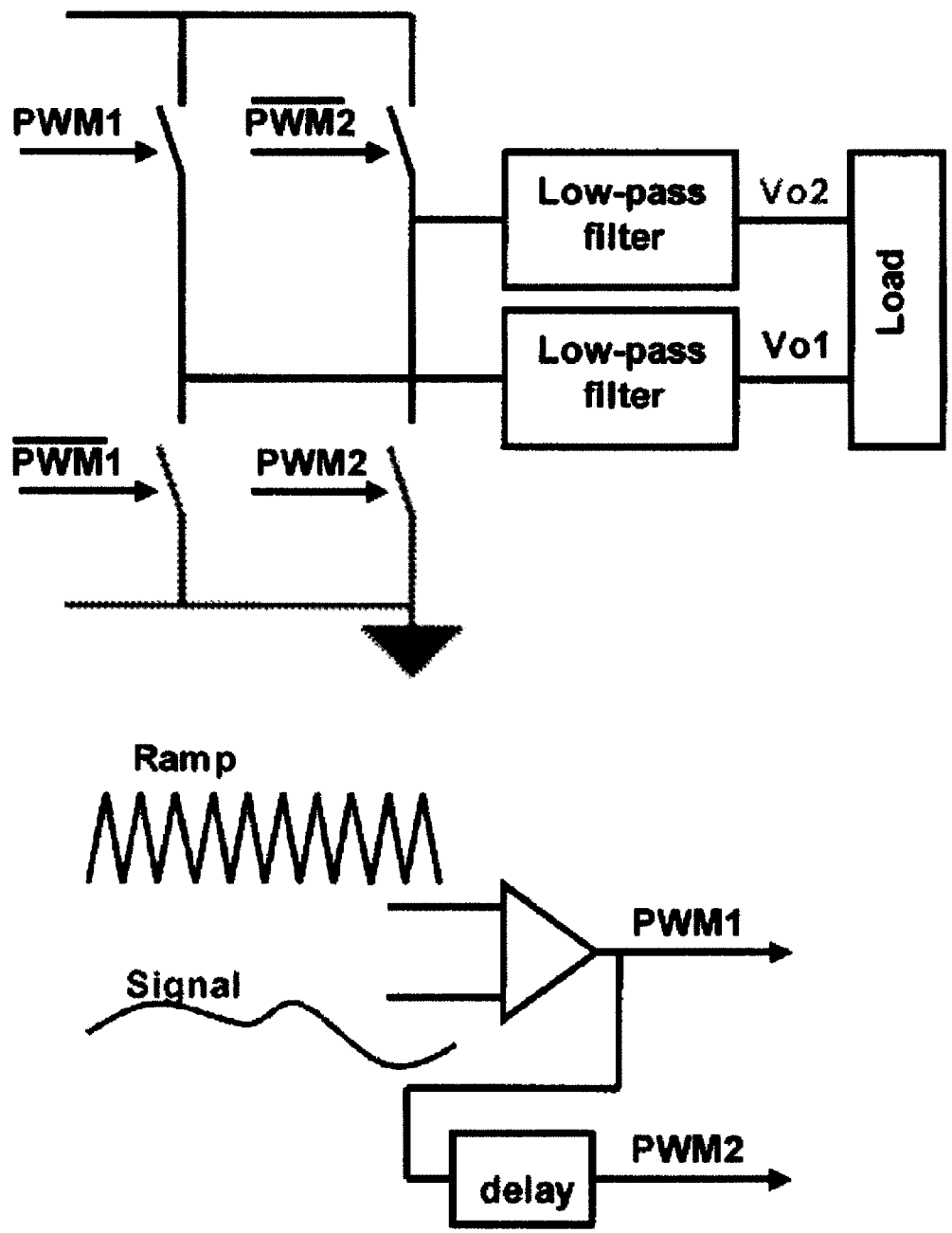
FIG. 19 is a diagram showing a D class amplifier with differential outputs in which a first PWM output signal is delayed to generate a second PWM output signal according to some embodiments of the invention.

The phase shifted PWM2 signal for the second differential amplifier circuit in FIG. 12 can be created with a second PWM modulator, where the ramp for the second modulator is phase shifted from the ramp for the first one. However, the cheaper and simpler alternative is also proposed, which also improves the noise immunity and insures reliable current ripple cancellation, is to use one PWM modulator, and just delay that signal by half the switching period to achieve 180 degrees phase shift for the second channel signals, as shown in FIG. 19. As the modulator frequency is typically much higher than the maximum frequency of the amplified signal, the introduced signal distortion can be minimized.

The magnetic components from FIG. 14 could be arranged in a single structure with two windings. Such structure could be called a transformer with purposely large leakage or decreased coupling.

Figure 20:
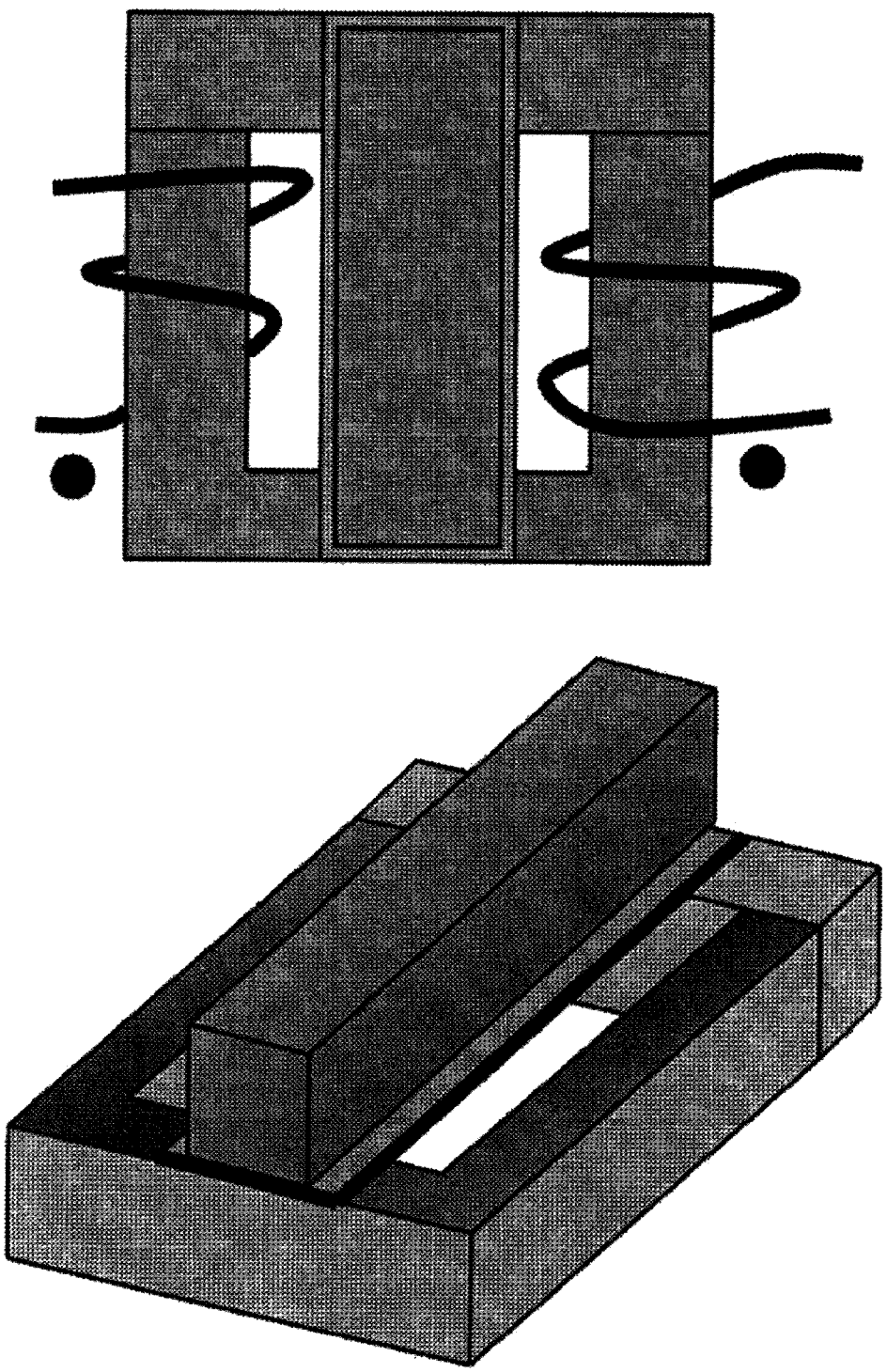
FIGS. 20, 21 and 22 show simplified diagrams showing varying arranges for a transformer with leakage, the transformer corresponding to magnetically coupled inductors in an output filter according to some embodiments of the invention.
Figure 21:
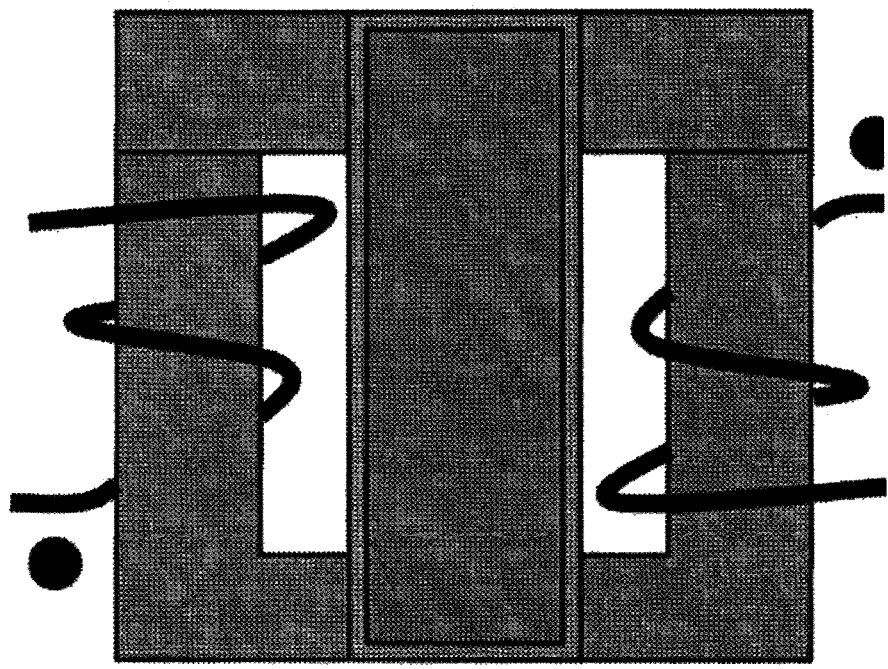
Figure 22:
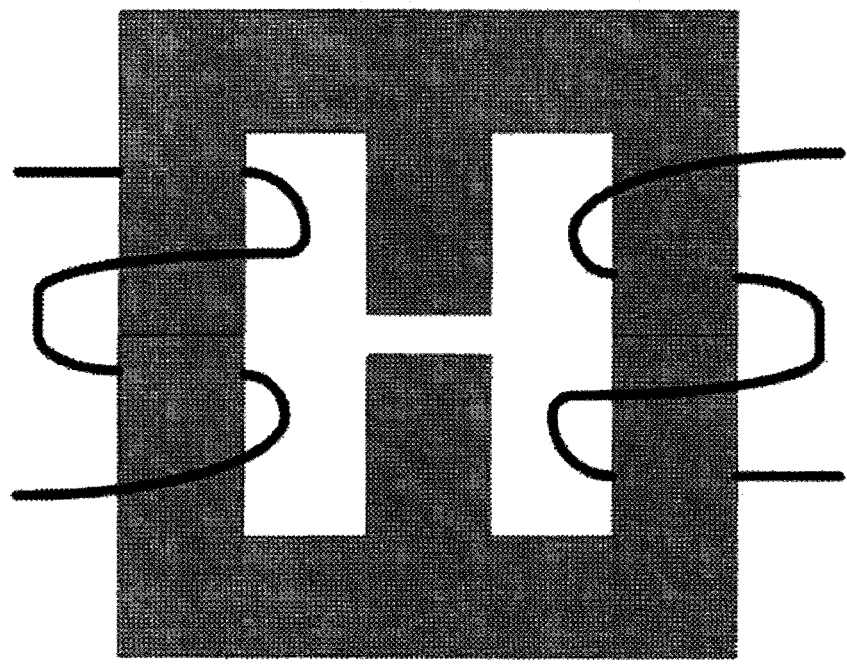

FIG. 20 shows one possible implementation for transformer with leakage. This structure will create have leakage via air paths, but the value would be difficult to control accurately in a manufacturing environment. FIG. 21 and FIG. 22 show additional arrangements for transformer with leakage. FIG. 22 allows the best control of the leakage (gap value—spacer thickness).

The above described transducer can be a part of or contained in any type of apparatus, including without limitation a surgical device, a cutting tool, a fragmentation tool, an ablation tool, and an ultrasound imaging device.

D-Inductor and Related Circuitry

FIGS. 23A, 23B, 23C, 23D, 23E, 23F, and 23G illustrate various embodiments of a circuit 1000 that includes a single coupled inductor pair 1100, which is herein referred to as a D-inductor. The D-inductor 1100 may include a first winding L1 and a second winding L2 that are magnetically coupled. The inductances of the windings L1, L2 may be leakage (or differential) inductances, which are described above with reference to FIG. 10. In operation, the D-inductor 1100 may store energy, ramp up the energy during the switch-on time, ramp down the energy during switch-off time, and transfer the energy to the load at a controlled rate. Also, windings L1, L2 may have less than full coupling in order to create effective series inductance.

The circuit 1000 may include one or more LC stages. For example, in FIG. 23A, the circuit 1000A includes a single D-inductor 1100 with related filtering capacitors. In FIG. 1B, the circuit 1000B includes two cascaded LC stages, in which the first LC stage includes a D-inductor 1100A and a second filter stage includes a common mode choke 1100B. In FIG. 1C, the circuit 1000C includes an N number of cascaded LC stages, in which the first LC stage includes a D-inductor 1100A, and the second to the Nth LC stages includes common mode chokes 1100B, . . . , 1100N, respectively.

Figure 23C:
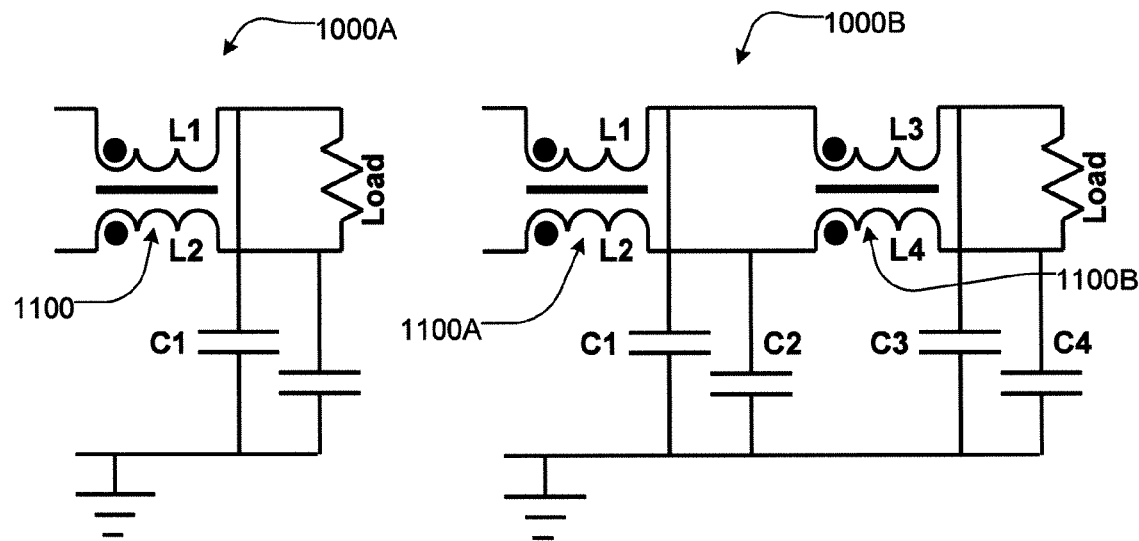
Figure 23C:
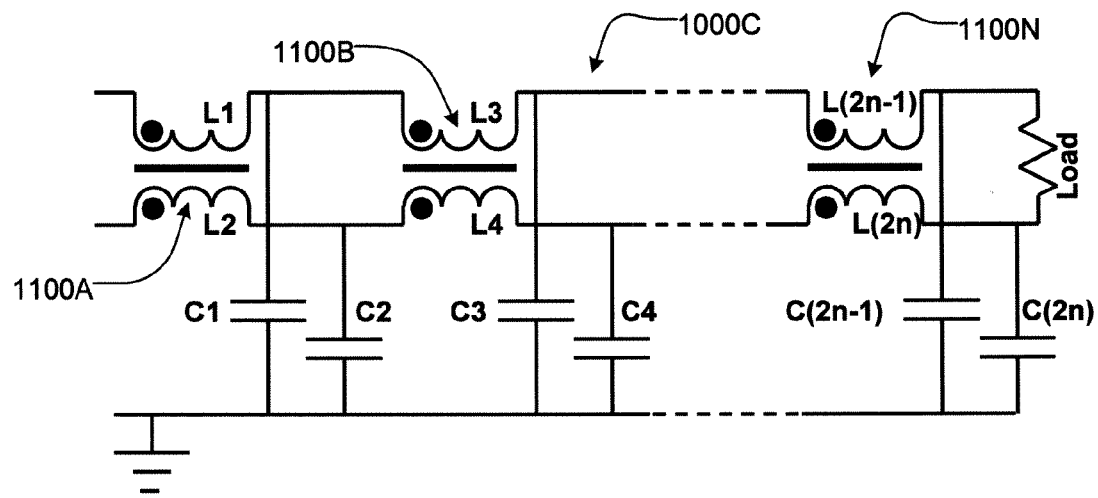
Figure 23D:
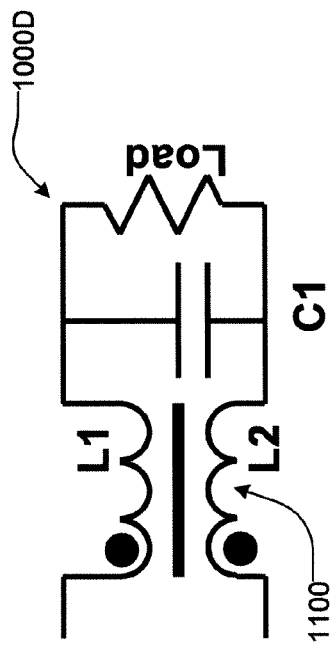
Figure 23E:
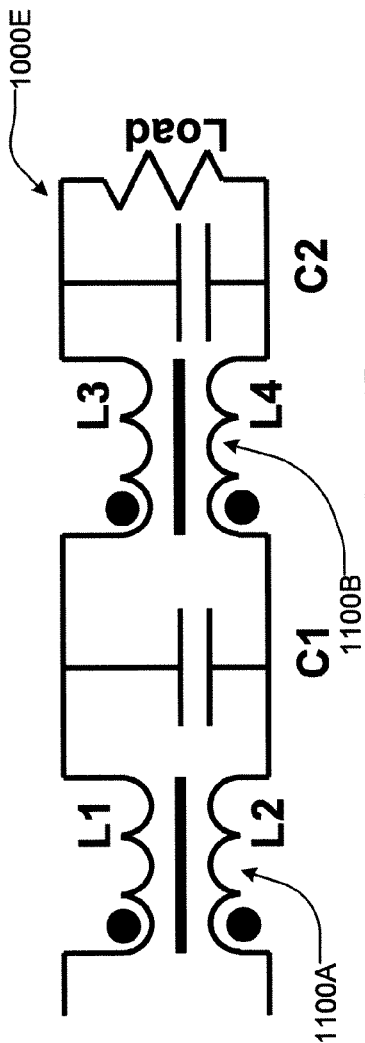
Figure 23F:
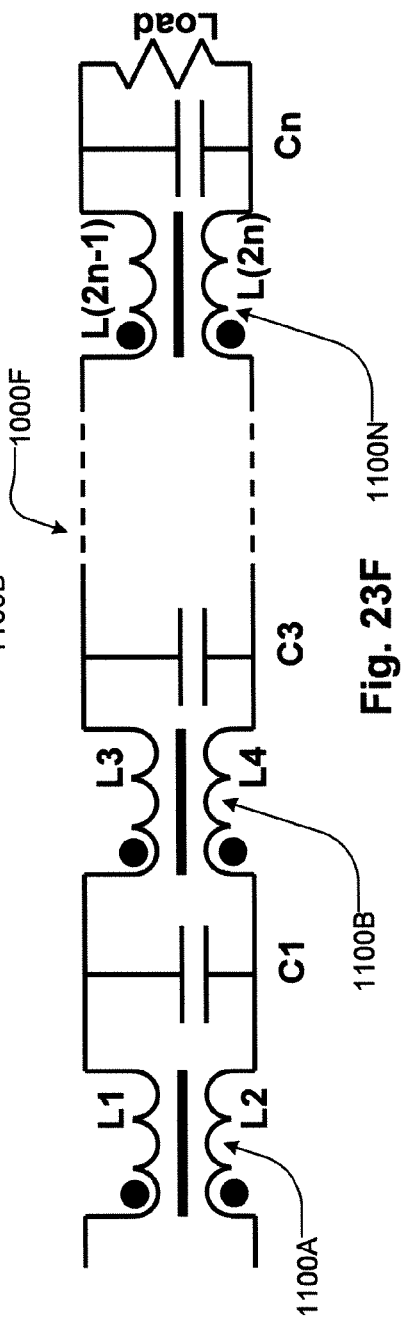

In an embodiment of the invention, the circuit 1000 may be referenced to one or more return current planes, as shown in FIGS. 23A, 23B, and 23C. Alternatively, the circuit 1000 may not be referenced to any return current plane. In an embodiment of the invention, the circuit 1000 may be referenced to a common plane, as shown in FIGS. 23A, 23B, and 23C. Alternatively, the circuit 1000 may not be referenced to a common plane. For example, FIGS. 23D, 23E, and 23F show a single LC stage circuit 1000D, an LCLC cascaded circuit 1000E, and a cascaded circuit 1000F with an N number of cascaded LC stages, in which only the first filtering stage contains the D-inductor 1100, respectively, which are not referenced to a common plane.

Figure 23G:
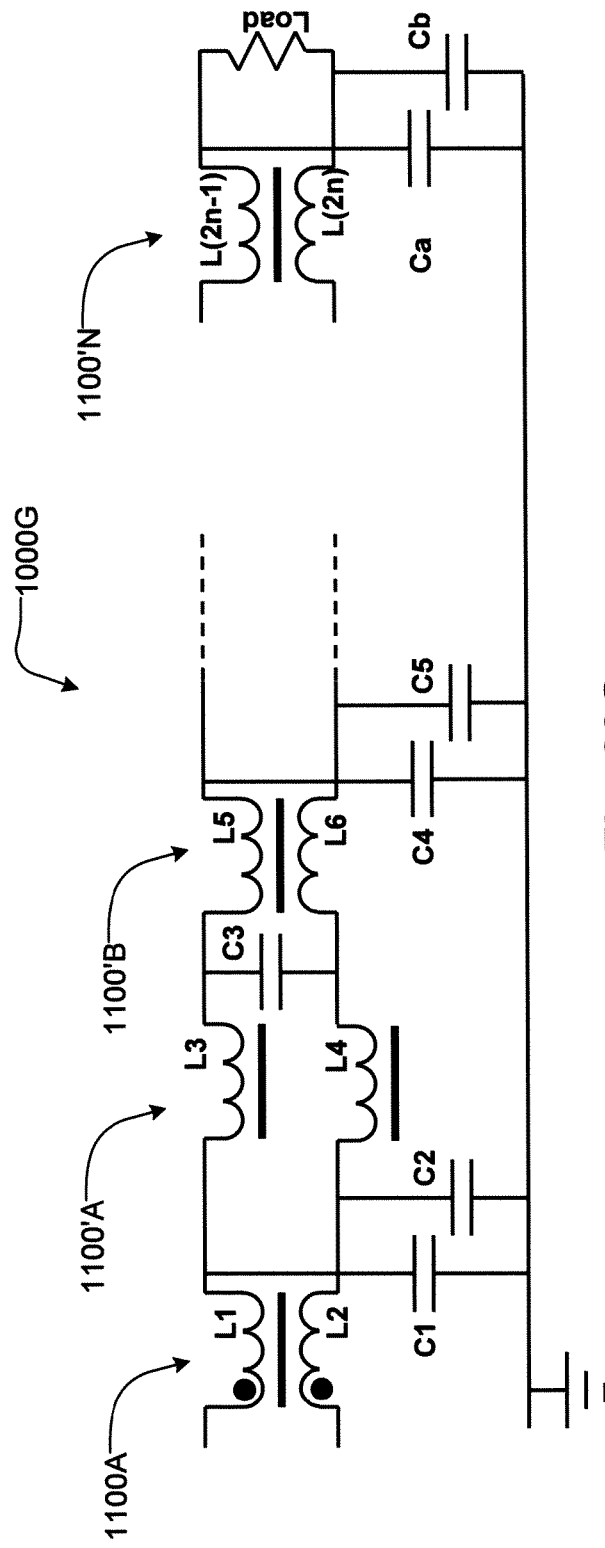

Further, in an embodiment of the invention, the D-inductor 1100 may be used in combination with one or more coupled or uncoupled filtering inductors. For example, FIG. 23G shows a circuit 1000G having an N number of cascaded LC stages, in which the first LC stage includes the D-inductor 1100A, the second LC stage includes an uncoupled inductors 1100'A, the third and Nth LC stages include common mode chokes 1100'B, 1100'N, respectively. In an embodiment of the invention, the circuit 1000G may be referenced to a common connection, as shown in FIG. 3, or, alternatively, may not be referenced to any common connection. Other constructions are also contemplated for the circuit 1000.

The circuit 1000 may be used in applications that require or desire high switching frequencies. For example, the circuit 1000 may be used in ultrasonic applications, which typically require signals to be amplified with substantially higher frequencies and involve high frequency carriers. A high switching frequency may allow to use smaller magnets and capacitors in output filters, but further increasing of the switching frequency may be limited by efficiency concerns and high thermal losses. By using the circuit 1000, a switching frequency may be lowered and ripple current may be reduced, which may normally be achieved only at a substantially higher switching frequency in conventional output stage designs.

The circuit 1000 may also be used in audio applications, in which an amplified signal typically has more low frequency components than in ultrasonic applications. Further, in the audio applications, the switching frequency is typically more separated from a targeted amplifier bandwidth to decrease the size of the output filters and improve a signal-to-noise ratio (SNR) for better audio quality. The circuit 1000 may be used to reduce the switching frequency for higher efficiency while maintaining the inductor current ripple at a level not higher than the conventional design. The trade-off of ripple current for higher efficiency may maintain the SNR at the output signal at the same label as the conventional design, or improve the SNR, if necessary. Further, by lowering the switching frequency, the circuit 1000 may contribute to substantial improvement in efficiency due to smaller switching losses.

Figure 24A:
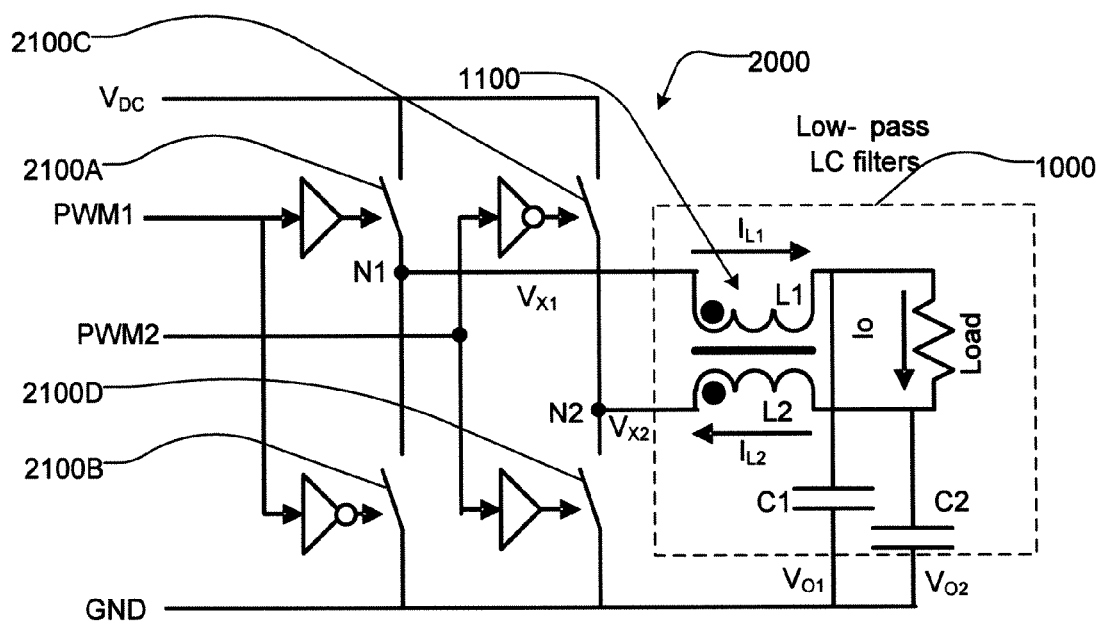
FIG. 24A illustrates a class D amplifier according to some embodiments of the invention.

FIG. 24A illustrates a class D amplifier 2000 that includes the circuit 1000, which is constructed according to an embodiment of the invention. The amplifier 200 may include two half bridges and the D-inductor 1100 as part of its output filter, and may produce differential outputs such that the output current may be sourced from one output of the D-inductor 1100 and sunk at another output of the D-inductor 1100.

The amplifier 2000 may include a plurality switches 2100, such as, e.g., switches 2100A, 2100B, 2100C, 2100D. The switches 2100A, 2100B may be connected in series, and the switches 2100C, 2100D may also be connected in series. The switch pair 2100A, 2100B and the switch pair 2100C, 2100D may be connected in parallel between a power source and a ground. A node N1 between the switches 2100A, 2100B may be connected to the first coil L1 of the D-inductor 1100. A node N2 between the switches 2100C, 2100D may be connected to the second coil L1 of the D-inductor 1100.

A first control signal PWM1 may be used to control the switch pair 2100A, 2100B, and a second control signal PWM2 may be used to control the switch pair 2100C, 2100D. For example, the switch 2100A may be controlled by the first control signal PWM1, and the switch 2100B may be controlled by an inverted signal of the first control signal PWM1. Also, the switch 2100C may be controlled by an inverted signal of the second control signal PWM2, and the switch 2100D may be controlled by the second control signal PWM2.

According to an embodiment of the invention, the control signal pair PWM1, PWM2 may be identical signals having different phases. The phase difference between the first and second control signals PWM1, PWM2 may contribute to minimizing ripple in the differential output voltage between output voltages $V_{O1}$, $V_{O2}$ of the circuit 1000, which is described below in detail. The phase difference may also contribute to reducing the electromagnetic interference (EMI) by preventing the two half bridges from switching at the same time.

Figure 24B:
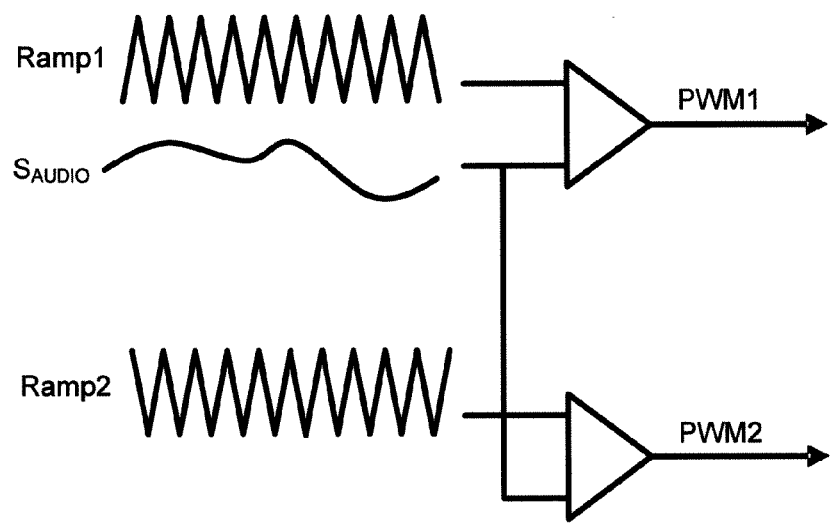
FIG. 24B illustrates a circuit for generating control signals for the class D amplifier shown in FIG. 24A according to some embodiments of the invention.
Figure 24C:
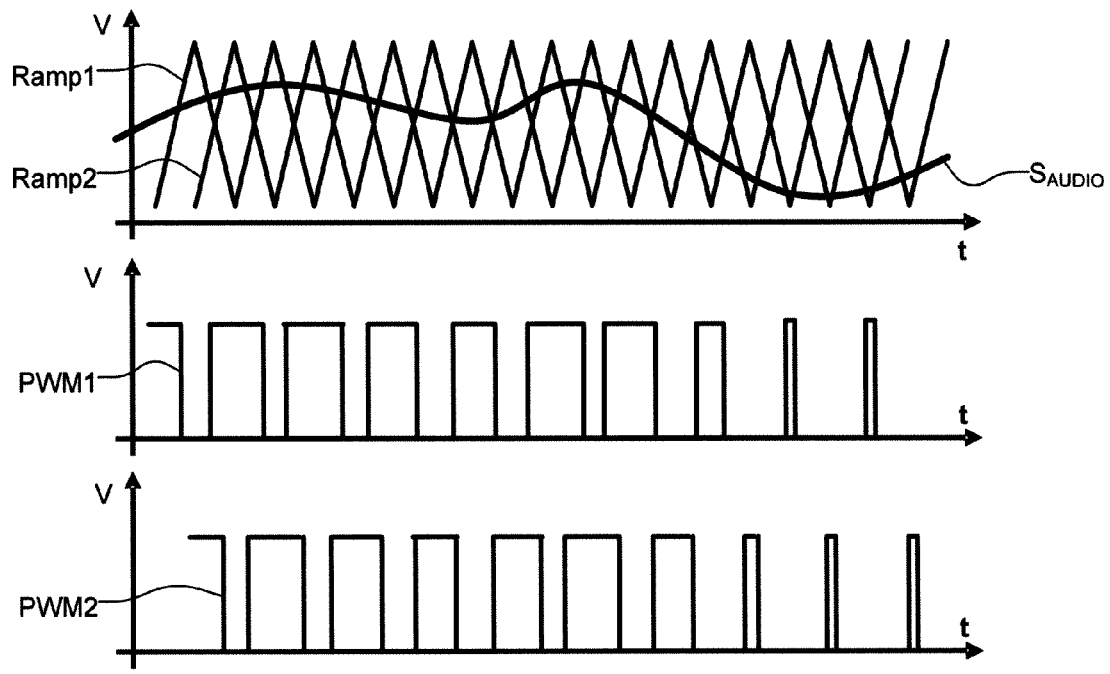
FIG. 24C illustrates various input and output signals of the circuit shown in FIG. 24B according to some embodiments of the invention.

In an embodiment of the invention, the phase shift between the control signal pair PWM1, PWM2 may be achieved by using two related ramp signals. For example, as shown in FIG. 24B, first and second ramp signals RAMP1, RAMP2 having a phase difference (e.g., 180 degrees) may be compared to an audio signal $S_{AUDIO}$ to produce the control signal pair PWM1, PWM2. FIG. 24C illustrates waveforms of the first ramp signal RAMP1, the second ramp signal RAMP2, the audio signal $S_{AUDIO}$, the first control signal PWM1, and the second control signal PWM2.

Figure 24D:
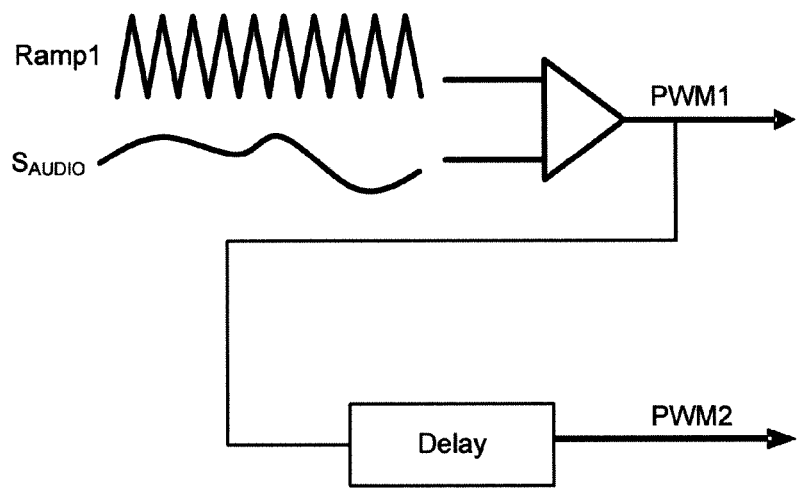
FIG. 24D illustrates another circuit for generating the control signals for the class D amplifier shown in FIG. 24A according to some embodiments of the invention.

Other methods are also contemplated to achieve the phase shift between the first and second control signals PWM1, PWM2. For example, according to another embodiment of the invention shown in FIG. 24D, the control signal PWM2 may be produced by delaying the control signal PWM1 by, e.g., a half the switching period. This approach may be more cost effective because it may not require a modulator that compares the second control signal PWM2 and the audio signal $S_{AUDIO}$. This approach may be viable when the main carrier frequency is substantially higher than the highest frequency in the amplified signal.

In the amplifier 2000, the magnetic flux from the audio signal $S_{AUDIO}$ may be cancelled by the D-inductor 1100. Each of the windings L1, L2 of the D-inductor 1100 may have twice the frequency because a pulsed voltage from one of the windings L1, L2 may appear in the other. The voltage applied across each of the windings L1, L2 may be an average of two voltages applied across both windings L1, L2, which may lower the effective voltage and the current ripple.

Figure 25A:
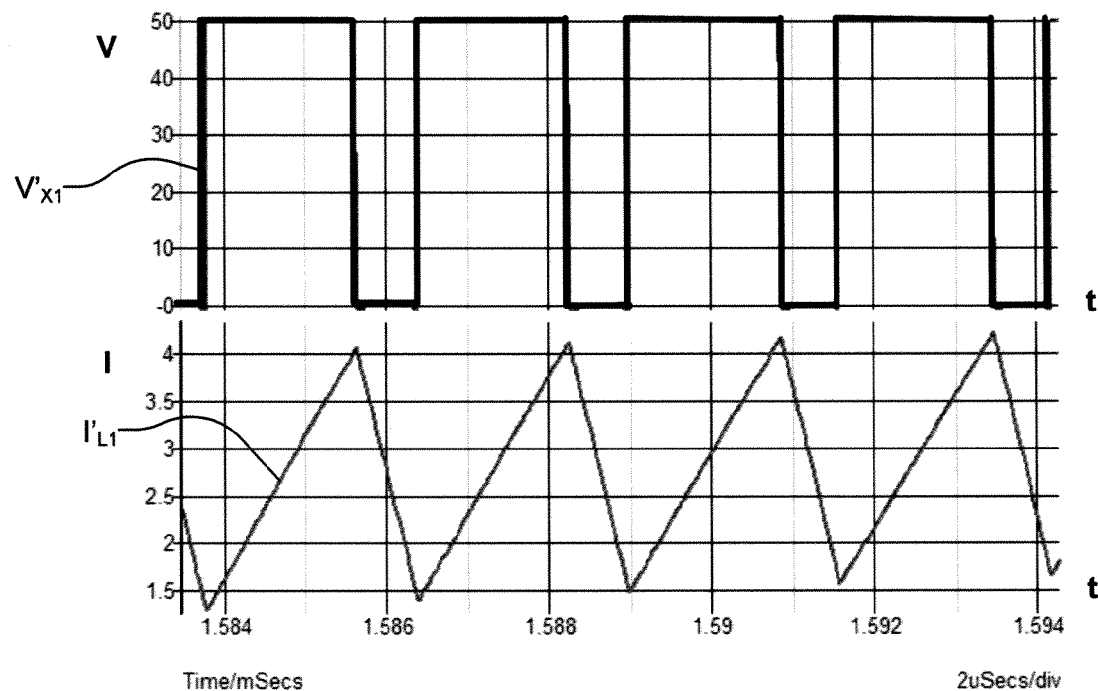
FIGS. 25A and 25B illustrate various voltage and current in a class D amplifier with an uncoupled design.
Figure 25B:
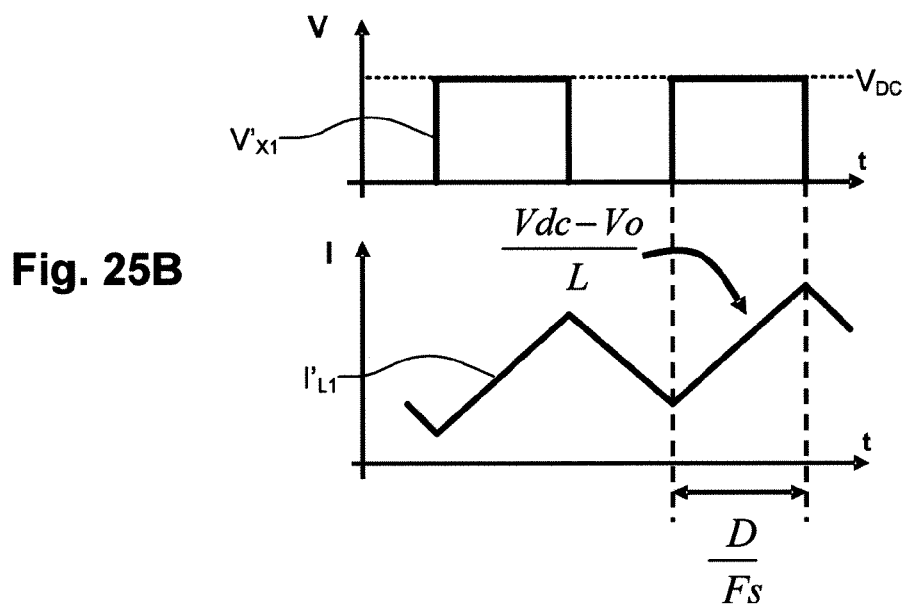

FIGS. 25A and 25B show voltage $V'_{X1}$ and current $I'_{L1}$ of a class D amplifier using an uncoupled inductor pair in replacement of the D-inductor 1100, which is referred to as an uncoupled design. The voltage $V'_{X1}$ may be applied to one of the uncoupled inductor pair and swing between the source voltage $V_{DC}$ (e.g., 50V) and the ground voltage (e.g., 0V). The current $I'_{L1}$ may be detected across the uncoupled inductor. Assuming that the voltage $V_{X1}$ is pulsed at a frequency Fs, a period for each pulse may be calculated from dividing a duty cycle (D) by the frequency Fs. When the inductance of the uncoupled inductors is L, the current ripple in the uncoupled design may be calculated from the following equation.

$$\Delta I_{UNCOUPLED}(D) = \frac{Vdc(1-D)}{L} \cdot \frac{D}{Fs}$$

Accordingly, when the uncoupled inductor pair is used, the current ripple may depend on the voltage $V_{X1}$ applied thereto, the inductance value of the uncoupled inductors, and the switching time only.

Figure 26A:
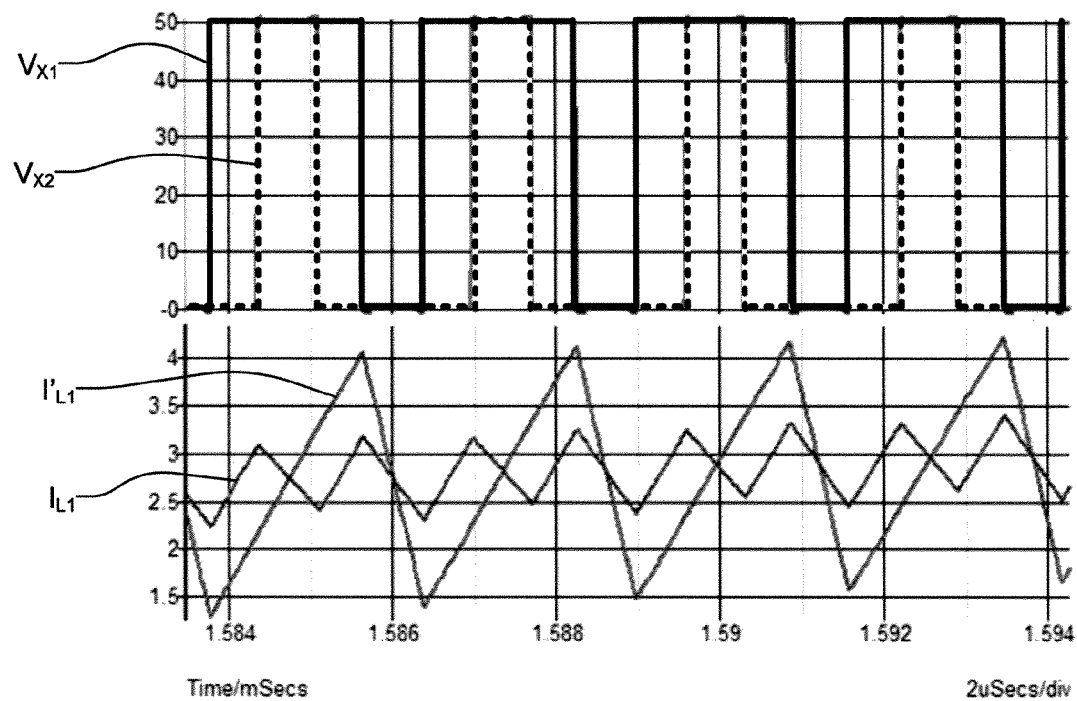
FIGS. 26A and 26B illustrate various voltages and current in a class D amplifier with a D-inductor design according to some embodiments of the invention.
Figure 26B:
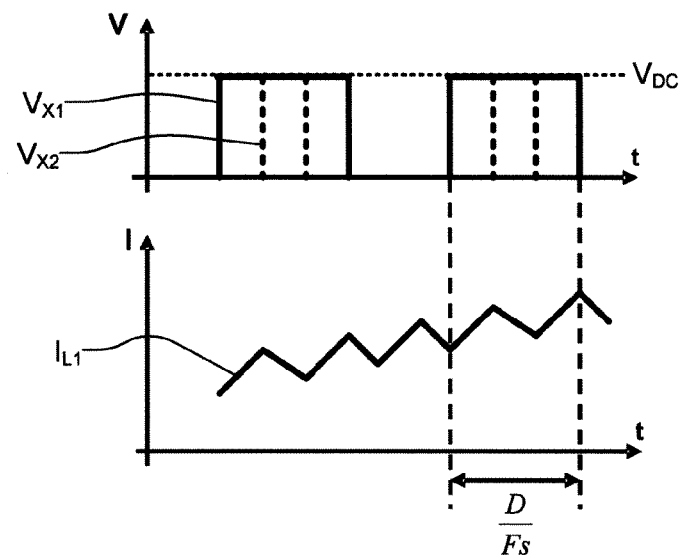

FIGS. 26A and 26B show waveforms of voltages $V_{X1}$, $V_{X2}$ and current $I_{L1}$ of the same amplifier as FIGS. 25A, 25B except for the circuit 1000 being used instead of the uncoupled inductor pair, which is referred to as a D-inductor design. As shown in FIG. 24A, the voltage $V_{X1}$ may be applied to the first winding L1 of the D-inductor 1100, and the voltage $V_{X2}$ may be applied to the second winding L1 of the D-inductor 1100. Both of the voltages $V_{X1}$, $V_{X2}$ may swing between the source voltage $V_{DC}$ (e.g., 50V) and the ground voltage (e.g., 0V). The current $I_{L1}$ may be detected across the first winding L1. The current ripple in the D-inductor design may be calculated from the following equation.

$$\Delta I_{COUPLED}(D) = \Delta I_{UNCOUPLED}(D) \cdot \text{RippleRatio}$$

The ripple Ratio may be calculated from the following equation.

$$\text{RippleRatio} = \frac{\Delta I_{COUPLED}(D)}{\Delta I_{UNCOUPLED}(D)}$$

Accordingly, the current ripple in the D-inductor design may depend on the voltages $V_{X1}$, $V_{X2}$, the inductance values and switching timings of both of the first and second windings L1, L2. Also, as compared to the uncouple design, the effective switching frequency of the current ripple in the current $I_{L1}$ may be doubled.

Considering the class D amplifier 2000 with a widely varying duty cycle D, the current ripple cancellation ratio may be derived from the following equations.

$$\frac{\Delta I_{COUPLED}(D)}{\Delta I_{UNCOUPLED}(D)} = \frac{\frac{1+\rho}{1+2\rho} - (1-D)}{D}, \text{ for } D < 0.5$$

$$\frac{\Delta I_{COUPLED}(D)}{\Delta I_{UNCOUPLED}(D)} = \frac{\frac{1+\rho}{1+2\rho} - D}{1-D}, \text{ for } D > 0.5$$

Here, $\rho$ is a coupling coefficient ($\rho = Lm/L_L$), wherein Lm is a magnetizing inductance value that is related to magnetic coupling between the windings L1, L2, and $L_L$ is the leakage inductance value of the windings L1, L2 of the D-inductor 1100, in which the coupled windings L1, L2 have a symmetric construction with a 1:1 turn ratio and leakages $L_{L1}$, $L_{L2}$ thereof are of the same value.

Figure 27:
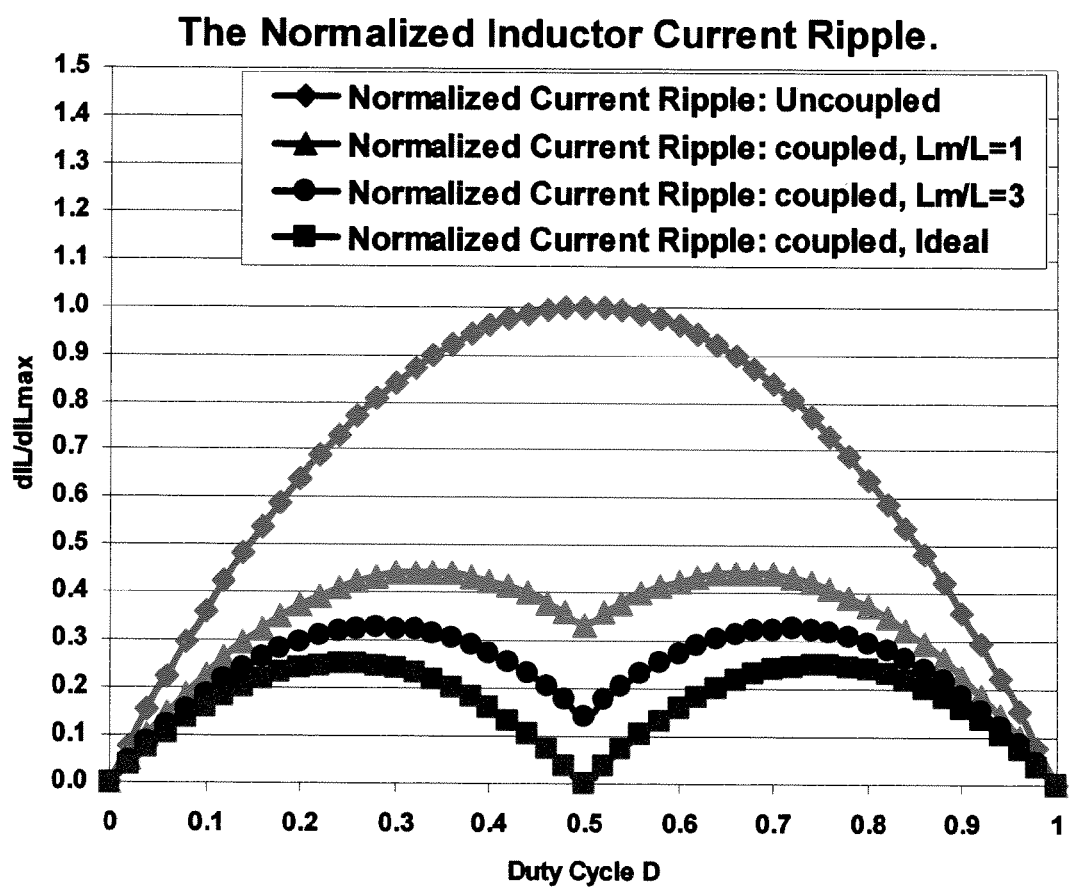
FIG. 27 illustrates normalized inductor current ripple measured in an amplifier with the uncoupled design and the D-inductor design.

FIG. 27 illustrates normalized current ripple as a function of duty cycle D for coupling coefficient $\rho$ at different values, for example, Lm/L=1, Lm/L=3, and ideal, in a test class D amplifier with the uncoupled design and the coupled design. The current ripple in the uncoupled design is largest at D=0.5, which indicates that the ratio of the current ripple to the amplified signal increases dramatically at a lower volume setting as compared to a higher volume setting. On the contrary, the current ripple in the D-inductor design is smallest at D=0.5, which corresponds to zero crossing or zero amplitude of the differential signal. The current ripple of the D-inductor design is smallest at the low signal amplitude, which corresponds to a low volume setting in an audio application. Thus, the D-inductor design may improve the SNR substantially in low volume settings. Furthermore, in a situation that a switching frequency is limited to a certain minimum range, at which the SNR reaches the maximum specification, the D-inductor design may allow the switching frequency to be substantially lowered, which may be desired for improvement in efficiency.

Figure 28A:
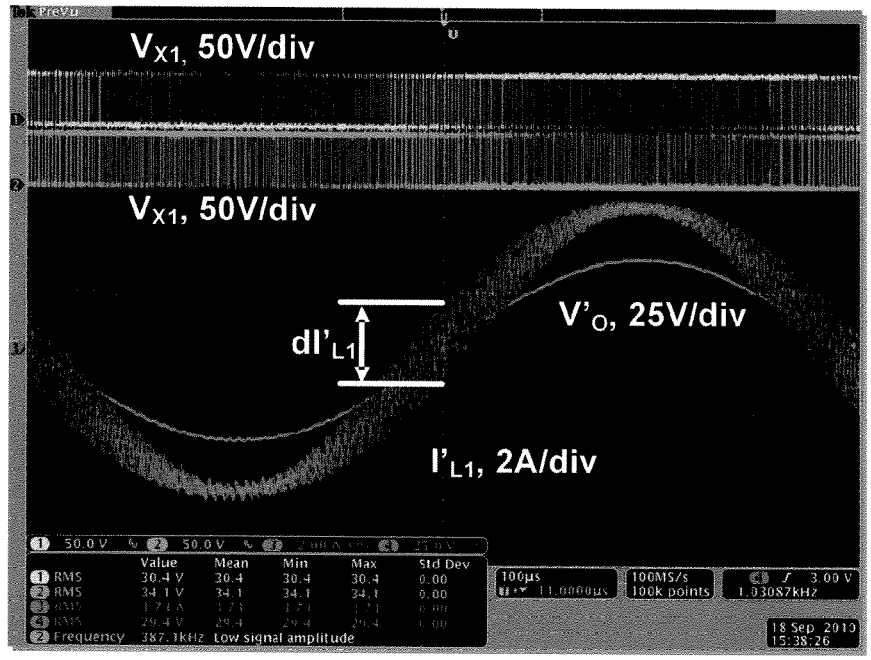
FIGS. 28A and 28B illustrate output waveforms measured in an amplifier at near full output power for the uncoupled design and the D-inductor design.
Figure 28B:
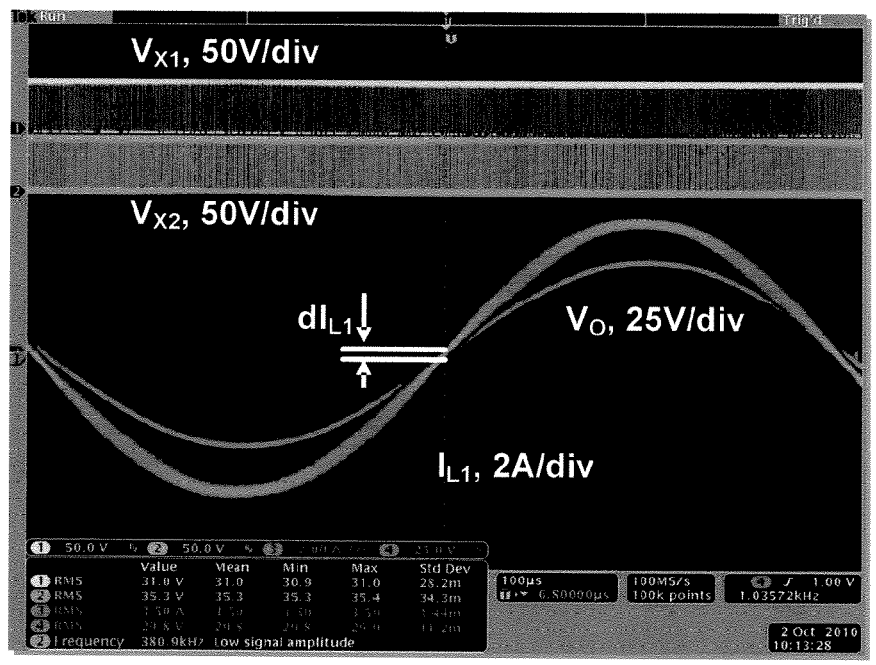

FIGS. 28A and 28B illustrate oscilloscope images of test results using a 2×150 W stereo test amplifier with the identical testing conditions, for example, Vdc=50 V, Fs=384 kHz, L1=L2=10 µH, C1=C2=1 µF, and load RL=8, for the uncoupled design and the D-inductor design. Measurements were taken on a single channel, and an input sine reference signal of 1 kHz was used. FIG. 28A shows the output waveforms at near full output power for the uncoupled design. FIG. 28B shows the same waveforms as FIG. 28A but for the D-inductor design. A considerable reduction in inductor current ripple is observed with the D-inductor design. The testing result also confirms that the minimum inductor current ripple occurs around D=0.5, where the output voltage waveform crosses zero for the D-inductor design.

Figure 29:
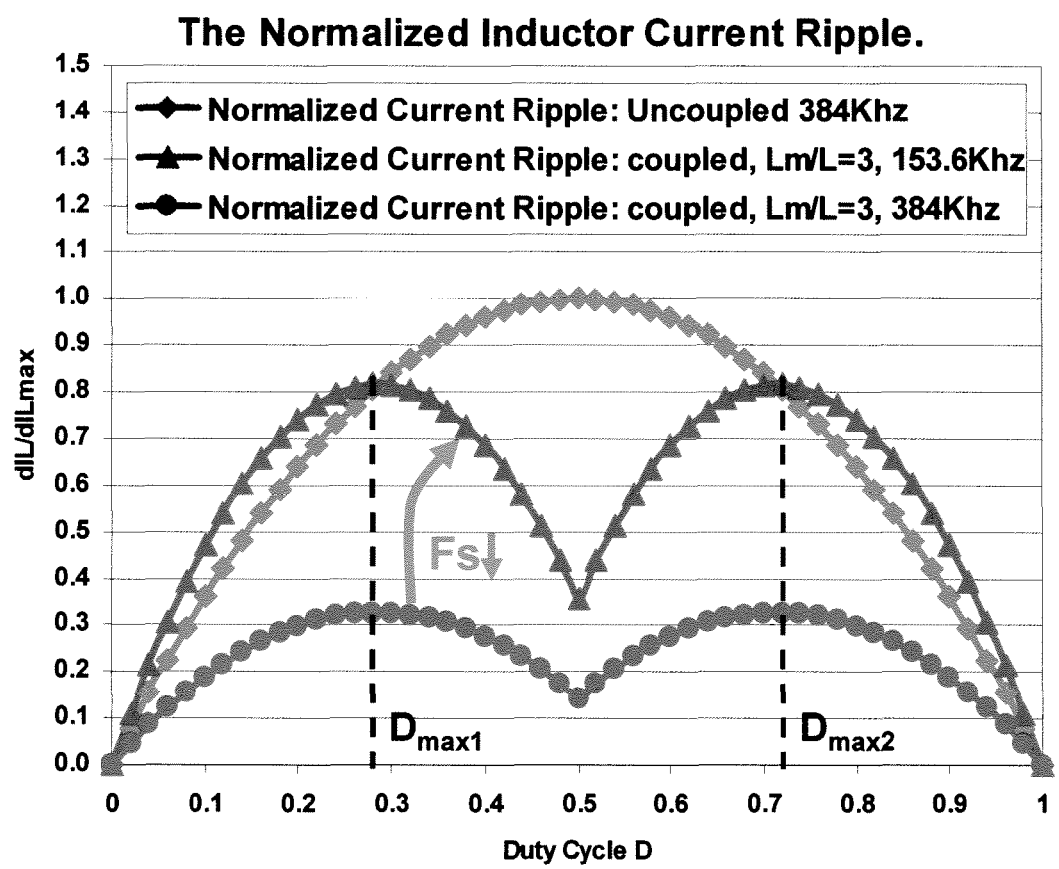
FIG. 29 illustrates normalized inductor current rippled in an amplifier with the uncoupled design and the D-inductor design.

FIG. 29 illustrates normalized inductor current ripple as a function of a duty cycle D for the uncoupled design and the D-inductor design at Fs=384 Khz, 154 Khz in a test class D amplifier that allows adjusting the switching timing in the output stage and changing the switching frequency in the wide range. The switching frequency for the D-inductor design was decreased from 384 Khz to 153.6 Khz, which corresponds to the case where the maximum current ripple (at duty cycle values $D_{max1}$, $D_{max2}$) matches the current ripple of the uncoupled design at the same duty cycle. The testing result indicates that the absolute current ripple maximum of the uncoupled design is about 20% higher than the D-inductor design.

Figure 30A:
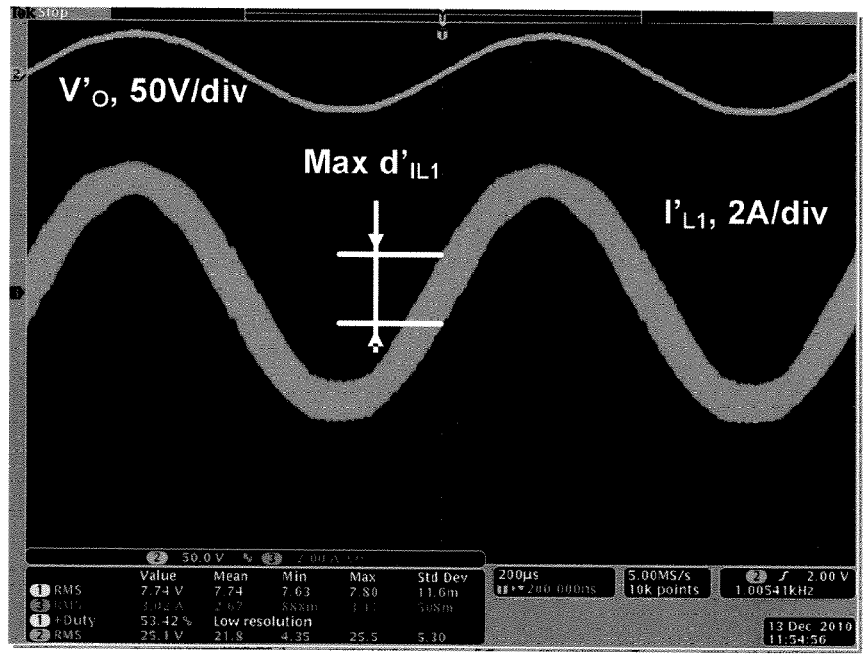
FIGS. 30A and 30B illustrate various inductor current ripple measured in an amplifier with the uncoupled design and the D-inductor design.
Figure 30B:
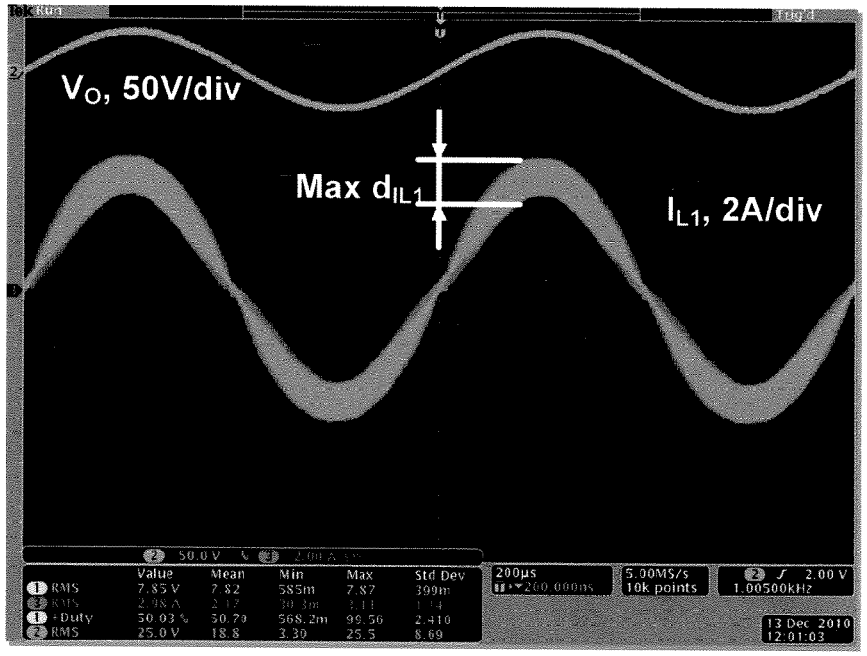

FIGS. 30A and 30B illustrate inductor current ripple of a test class D amplifier with the uncoupled design, for example, 2×10 µH, operated at Fs=384 Khz, and with the D-inductor design operated at Fs=154 Khz. It is observed that the D-inductor design provides lower current ripple to the output at a lower switching frequency. Also, the D-inductor design has the minimum current ripple at zero crossings with D=0.5 while the uncoupled inductor pair has the maximum current ripple with D=0.5. This indicates that the D-inductor design exhibits a significantly better SNR at a low output power and a slightly better SNR at a maximum output power.

Figure 31A:
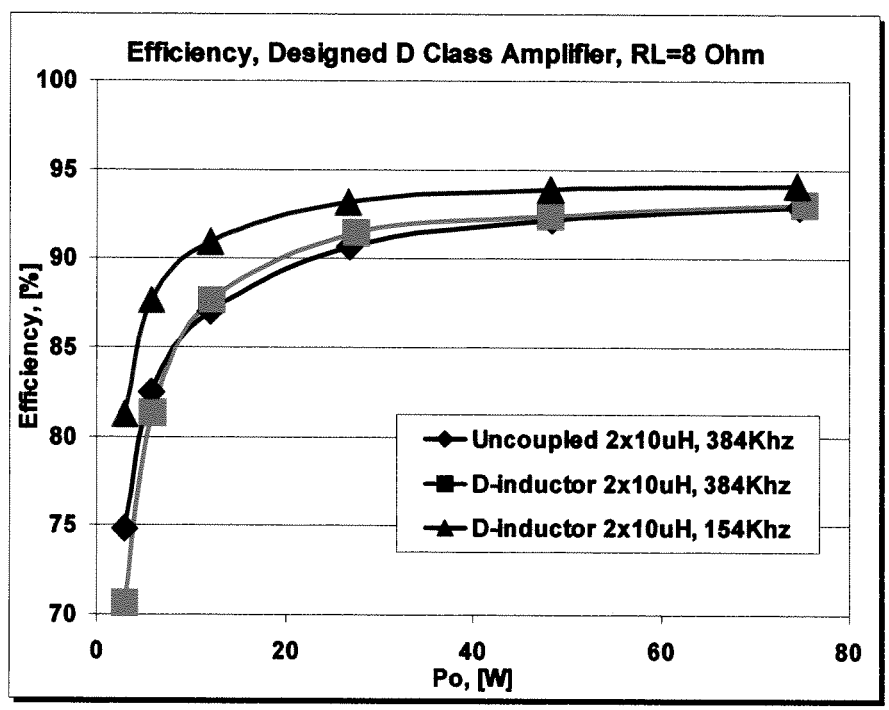
FIGS. 31A and 31B illustrate efficiency measured in an amplifier with the uncoupled design and the D-inductor design.
Figure 31B:
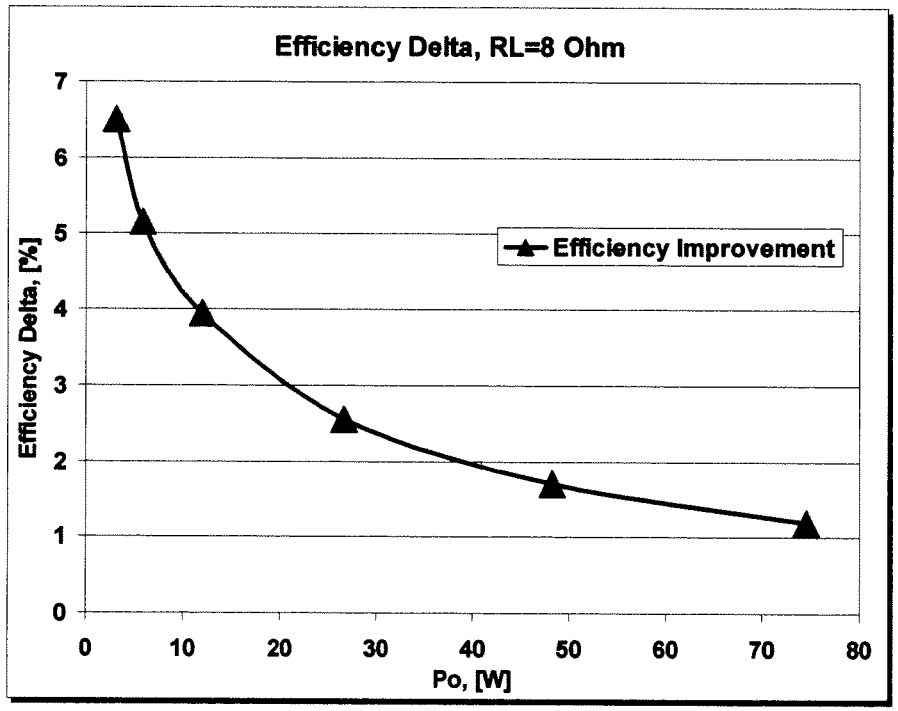

FIG. 31A illustrates an efficiency graph of a test class D amplifier with the uncoupled design operated at Fs=384 Khz and the D-conductor design operated at Fs=384 Khz and 154 Khz. FIG. 31B illustrates efficiency improvement due to the D-inductor design in the test class D amplifier. The test amplifier with the D-inductor design exhibits a substantially higher efficiency than the uncoupled design while providing substantially lower current rippled to the output. The efficiency benefit may decrease at a higher load as the conduction loss related to the audio signal amplitude may start to dominate. This may not be an issue for consumer audio products because they are typically used at less than full power.

Figure 32A:
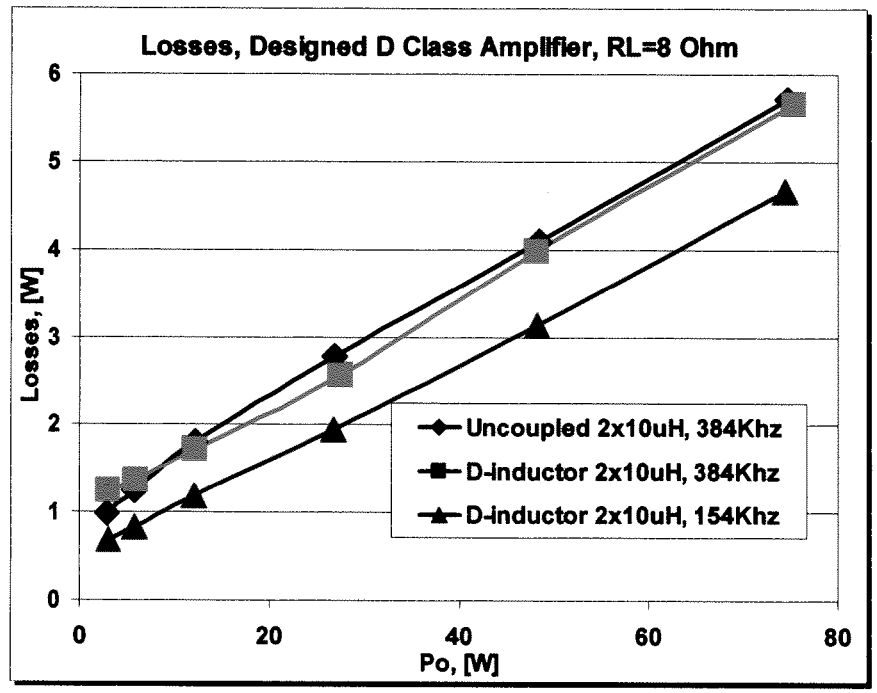
FIGS. 32A and 32B illustrate power loss measured in an amplifier with the uncoupled design and the D-inductor design.
Figure 32B:
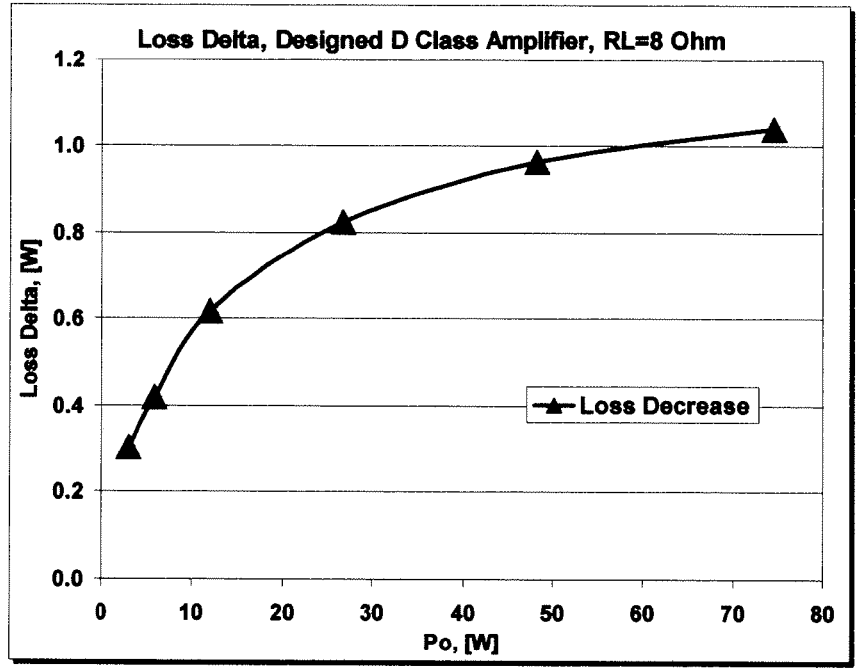

FIG. 32A illustrates a loss graph of a test class D amplifier with the uncoupled design at Fs=384 Khz and the D-inductor design operated at Fs=384 Khz and 154 Khz. FIG. 32B illustrates a loss delta graph of a test class D amplifier with the D-inductor design. FIGS. 32A and 32B show that less heat is dissipated in the amplifier, which may lead to higher component reliability and margin on a maximum ambient temperature. Alternatively, the heat dissipation may be traded for a smaller and cheaper thermal solution.

Figure 33A:
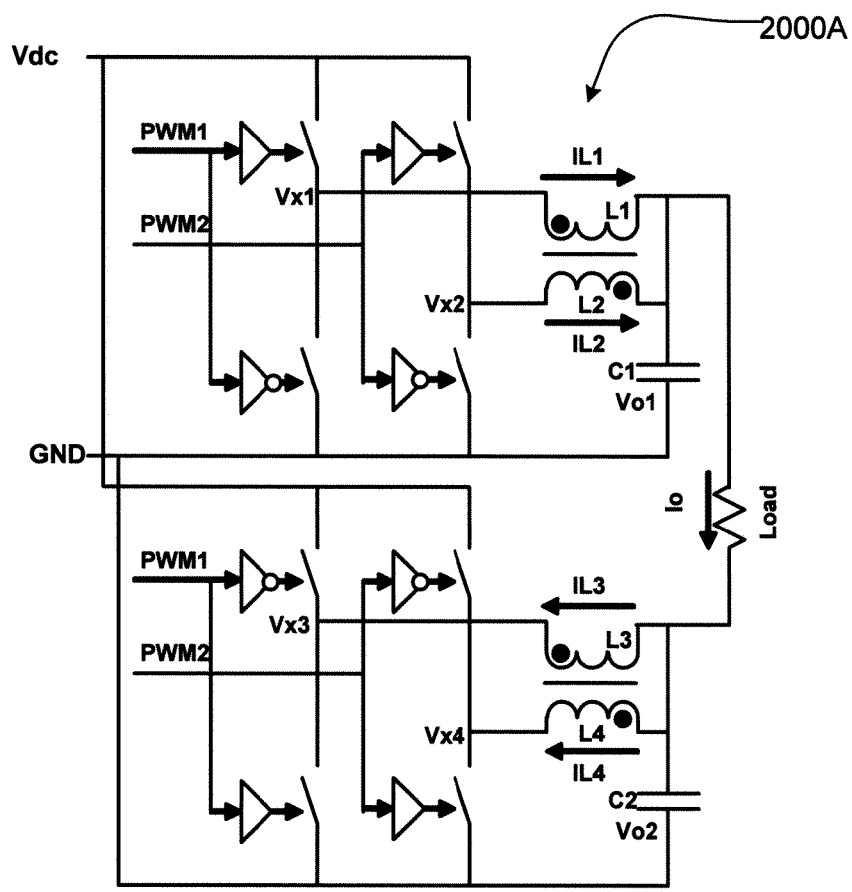
FIGS. 33A, 33B and 33C illustrate a construction, operation and current ripple of a class D amplifier with the D-inductor design according to some embodiments of the invention.
Figure 33B:
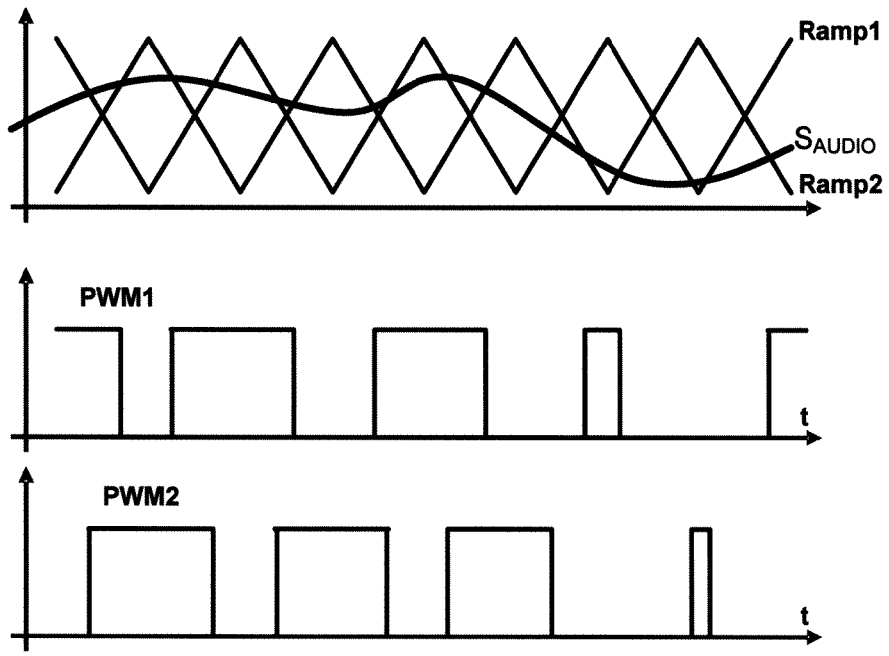
Figure 33C:
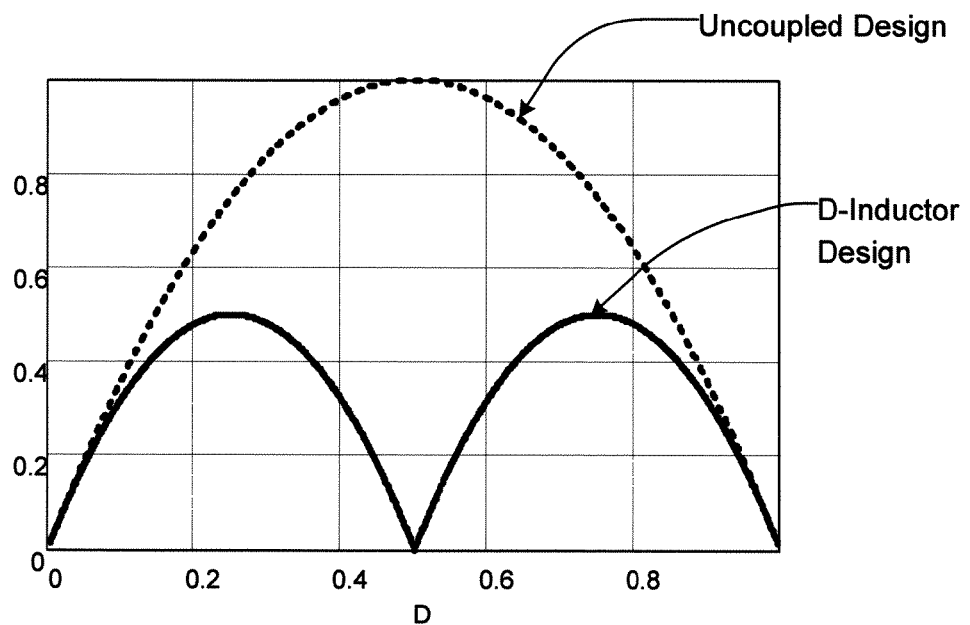

The class D amplifier with the coupled inductors may be configured and operated in various ways. For example, FIG. 33A illustrates a multi-phase class D amplifier 2000A, in which the two coupled-inductor designs shown in FIG. 13 are connected in a differential way according to an embodiment of the invention. The multi-phase class D amplifier 2000A may include a pair of phase-coupled inductors, of which the inductance value may be the product of the inductance value of the single inductor multiplied by the number of the inductors connected in parallel. FIG. 33B illustrates various signals, such as, e.g., audio signal $S_{AUDIO}$, ramp signal pair RAMP1, RAMP2, control signal pair PWM1, PMW2, for particular arrangement of the drivers and inverting drivers in FIG. 33A. FIG. 33C illustrates the current ripple in each inductor winding in the amplifier 2000A with the coupled inductor design shown in FIG. 33A (solid line), and the current ripple in the amplifier 2000A with the uncoupled design (dotted line). FIG. 33C shows that the current ripple in each inductor winding of the amplifier 2000A corresponds to the two phase current ripple cancellation described above.

Figure 34A:
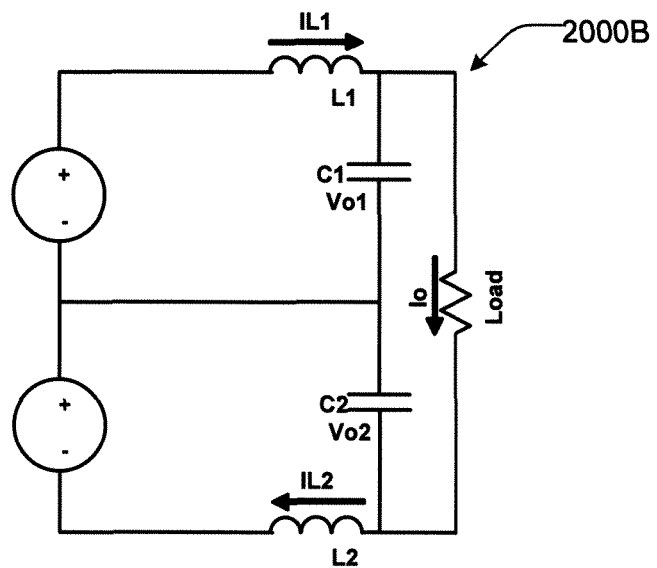
FIGS. 34A and 34B illustrate a single phase class D amplifier and a multi-phased class D amplifier according to some embodiments of the invention.
Figure 34B:
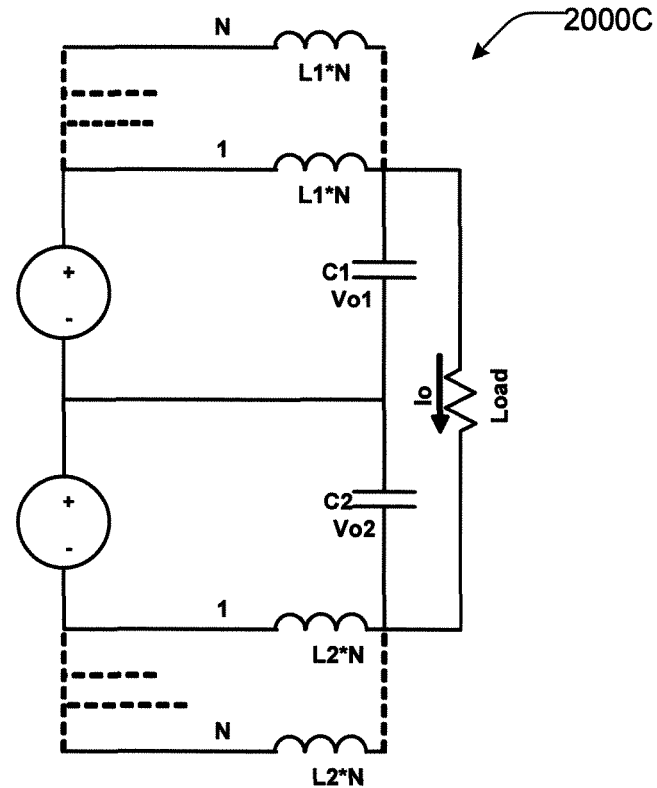
Figure 35A:
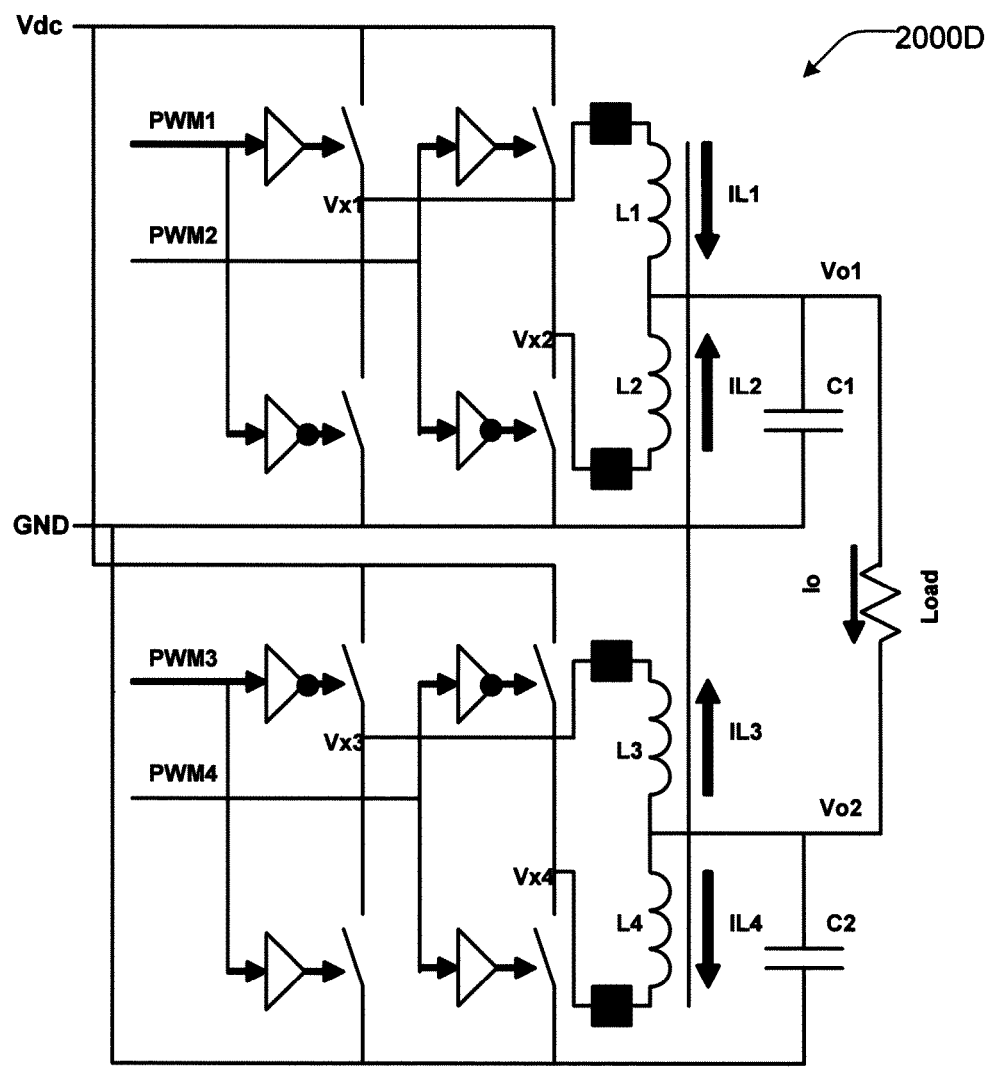
FIGS. 35A and 35B illustrate a construction and operation of a multi-phased class D amplifier according to some embodiments of the invention.
Figure 35B:
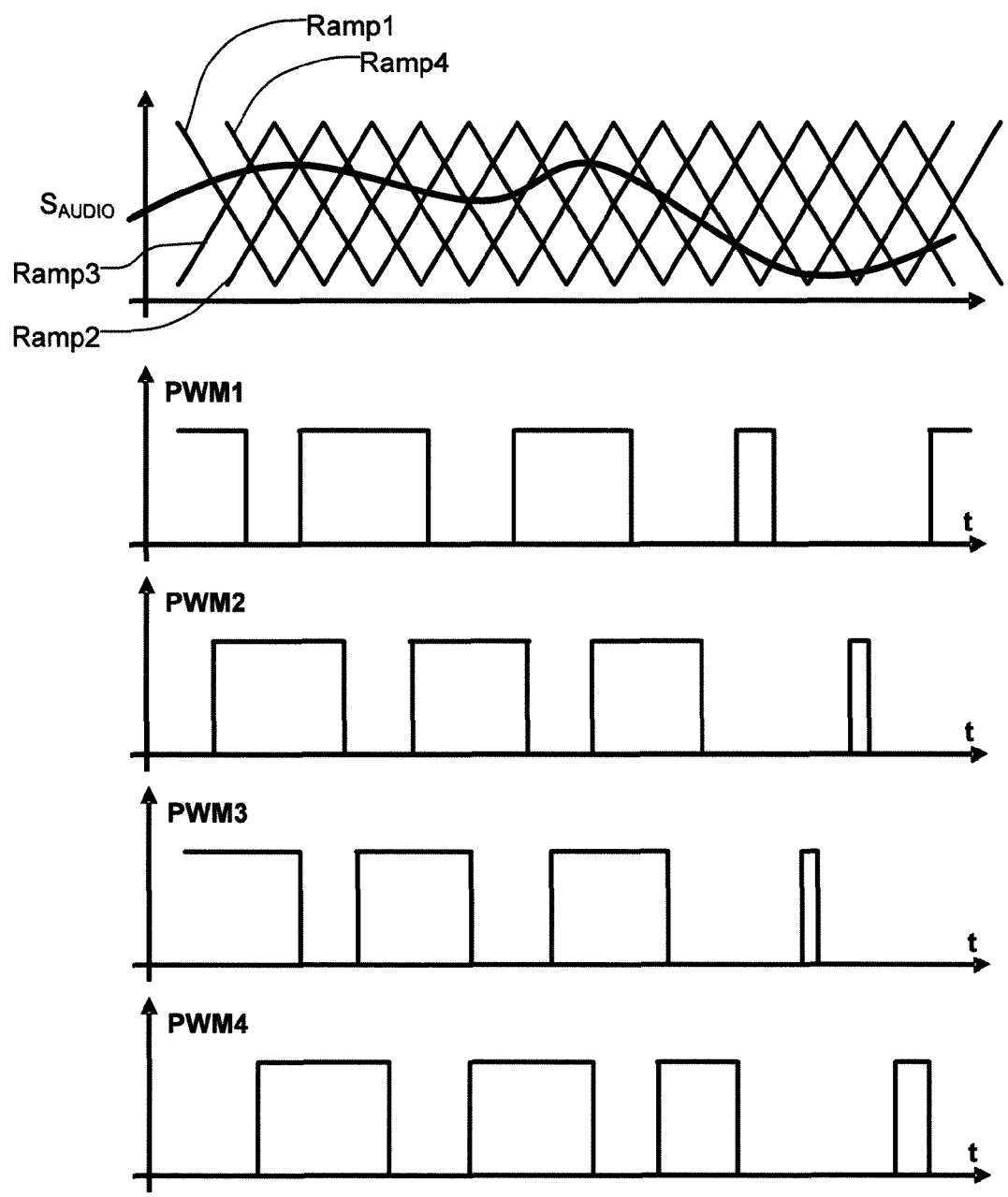

According to an embodiment of the invention, more phases may be added to the class D amplifier with the D-inductor design, while creating a single magnetic component for the whole circuit to achieve additional benefits. For example, FIG. 34B shows a class D amplifier 2000C that is constructed by adding an N number of inductors to a single phase class D amplifier 2000B shown in FIG. 34A. Each phase may be added to a half bridge for more ripple cancellation. For the same AC filter performance, i.e., same equivalent circuit, the inductance values may be the product of the inductance value of the single inductor multiplied by the number of the inductors connected in parallel. For example, FIG. 35A shows a multi-phase class D amplifier 2000D, which includes the single D-inductor design with four windings. FIG. 35B shows various signals, such as, e.g., audio signal $S_{AUDIO}$ and four ramp signals RAMP1, RAMP2, RAMP3, RAMP4, that are used to generate four control signals PWM1, PWM2, PWM3, PWM4, in the multi-phase class D amplifier 2000D shown in FIG. 35A.

Figure 36:
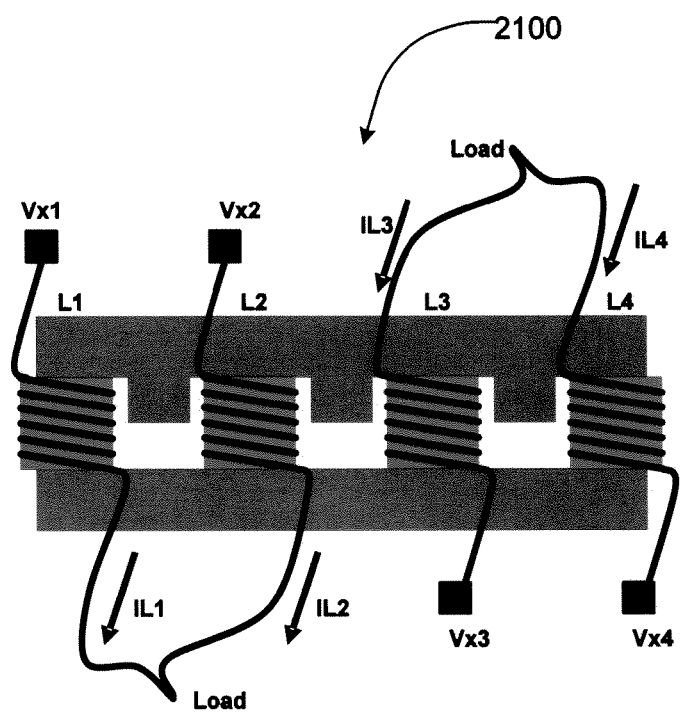
FIG. 36 illustrates an implementation of the multi-phased class D amplifier of FIG. 35A according to some embodiments of the invention.

FIG. 36 illustrates an implementation of the D-inductor design 2100 of the class D amplifier 2000D shown in FIG. 35A, according to an embodiment of the invention, in which the pins connected to the switching nodes Vx1, Vx2, Vx3, Vx4 are shown as squares. When more than two windings are inversely coupled, dot notations may not be possible anymore. In the D-inductor design 2100, the inductors L1 and L2 may be inversely coupled to each other, and the inductors L3 and L4 may also be inversely coupled to each other. The flux from the combination of the inductors L1 and L2 may be coupled in phase with the flux from the combination of the inductors L3 and L4, which may cancel out the fluxes due to opposite directions of the inductor currents. The core sections between the windings may provide a desired value of the leakage to achieve targeted current ripple and filtering, and the gap to the main core from the core sections may allow to adjust the leakage value. Other implementations are also contemplate, for example, as shown in FIGS. 42A, 43A, 44A, 45A, 46A, 46B and 47.

Figure 37A:
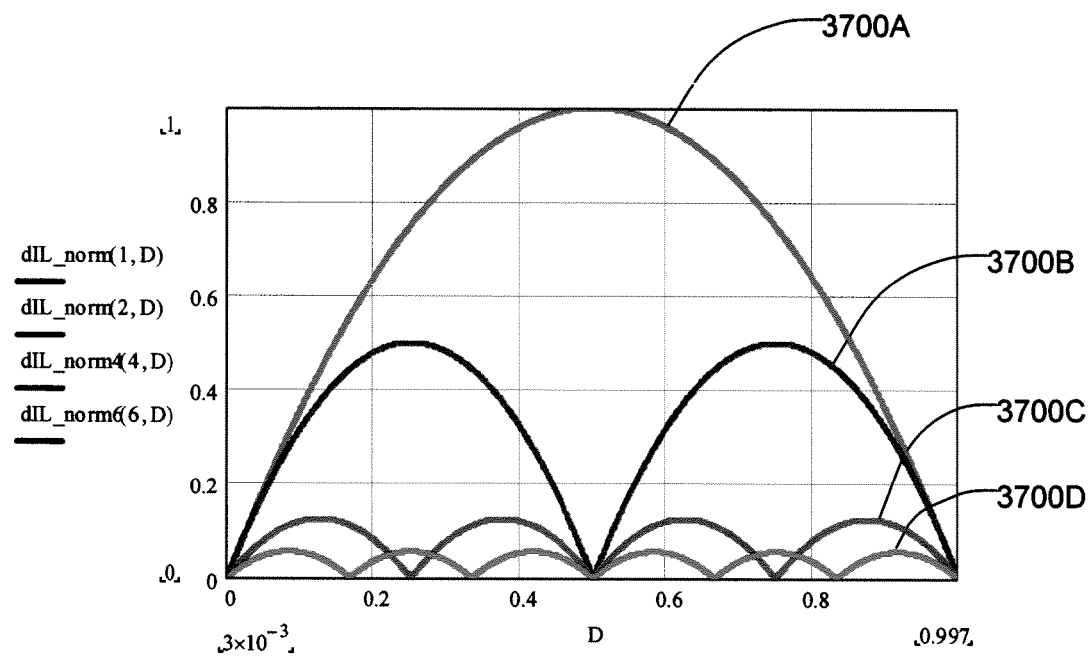
FIGS. 37A and 37B illustrate current ripple waveforms and total current ripple waveforms in various class D amplifier designs.

FIG. 37A illustrates normalized current ripple waveforms for ideal coupling (i.e., Lm/L is large) in each winding in various class D amplifier designs. The waveform 3700A indicates the current ripple in the uncoupled design, in which each of the inductors has a value of Lo. The waveform 3700B indicates the current ripple in the D-inductor design with two phase D-inductor with a value of Lo each. The waveform 3700C indicates the D-inductor design with four phase D-inductors shown in FIGS. 35A, 35B (i.e., four of 2*Lo, two inductors in parallel for each Vo pin). The waveform 3700D indicates the D-inductor design with six phase D-inductors (i.e., three inductors in parallel for each Vo pin, with a value of 3*Lo each). A small value of the coupling Lm/L may lead to larger current ripple, but a practical range (e.g., 3<Lm/L<10)

may lead to a performance level close to an ideal case. A total number of phases in the D-inductor design may be an even number, and a half of the phases may be in one group of the half bridges and the other half may be in the other group of the half bridges.

Figure 37B:
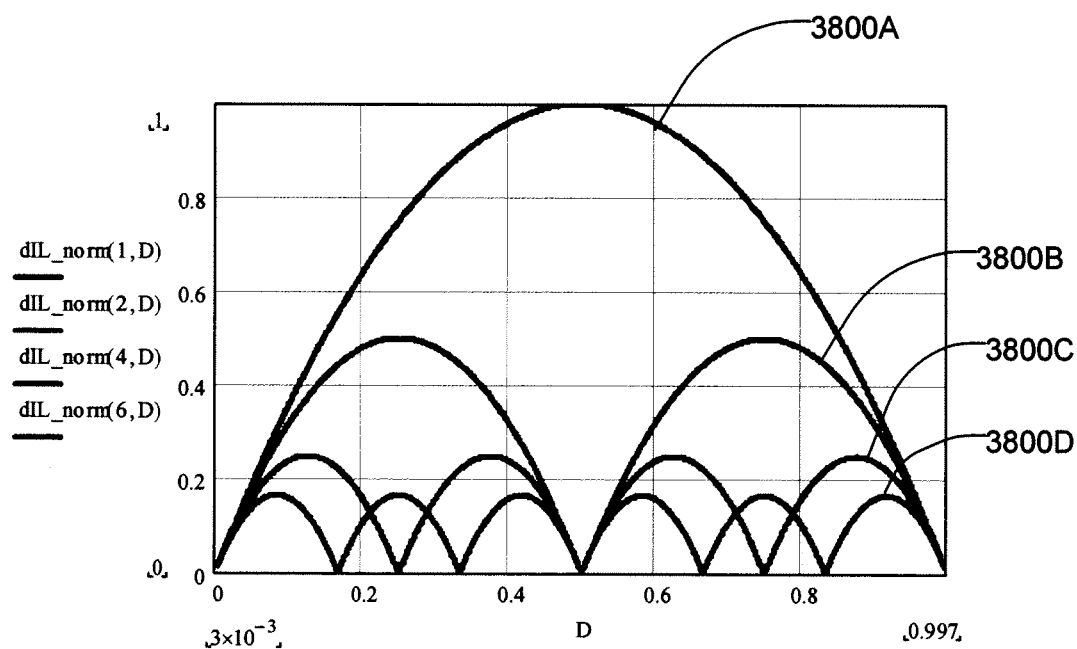

FIG. 37B illustrates total current ripple waveforms for ideal coupling (i.e., Lm/L is large) in various class D amplifier designs. The waveform 3800A indicates the total current ripple of the uncoupled design. The waveform 3800B indicates the total current ripple of the D-inductor design with two phase D-inductor. The waveform 3800C indicates the total current ripple of the D-inductor design with four phase D-inductor, which is shown in FIG. 35A. The waveform 3800D indicates the total current ripple of the D-inductor design with six phase D-inductor. A small values of coupling Lm/L may lead to a larger current ripple, but a practical range (e.g., 3<Lm/L<10) may lead to a performance level close to an ideal case. A total number of phases in the D-inductor design may be an even number, and a half of phases may be in one group of the half bridges and the other half may be in the other group of the half bridges, as for example shown in FIG. 35A for the four phase D-inductor.

Figure 38A:
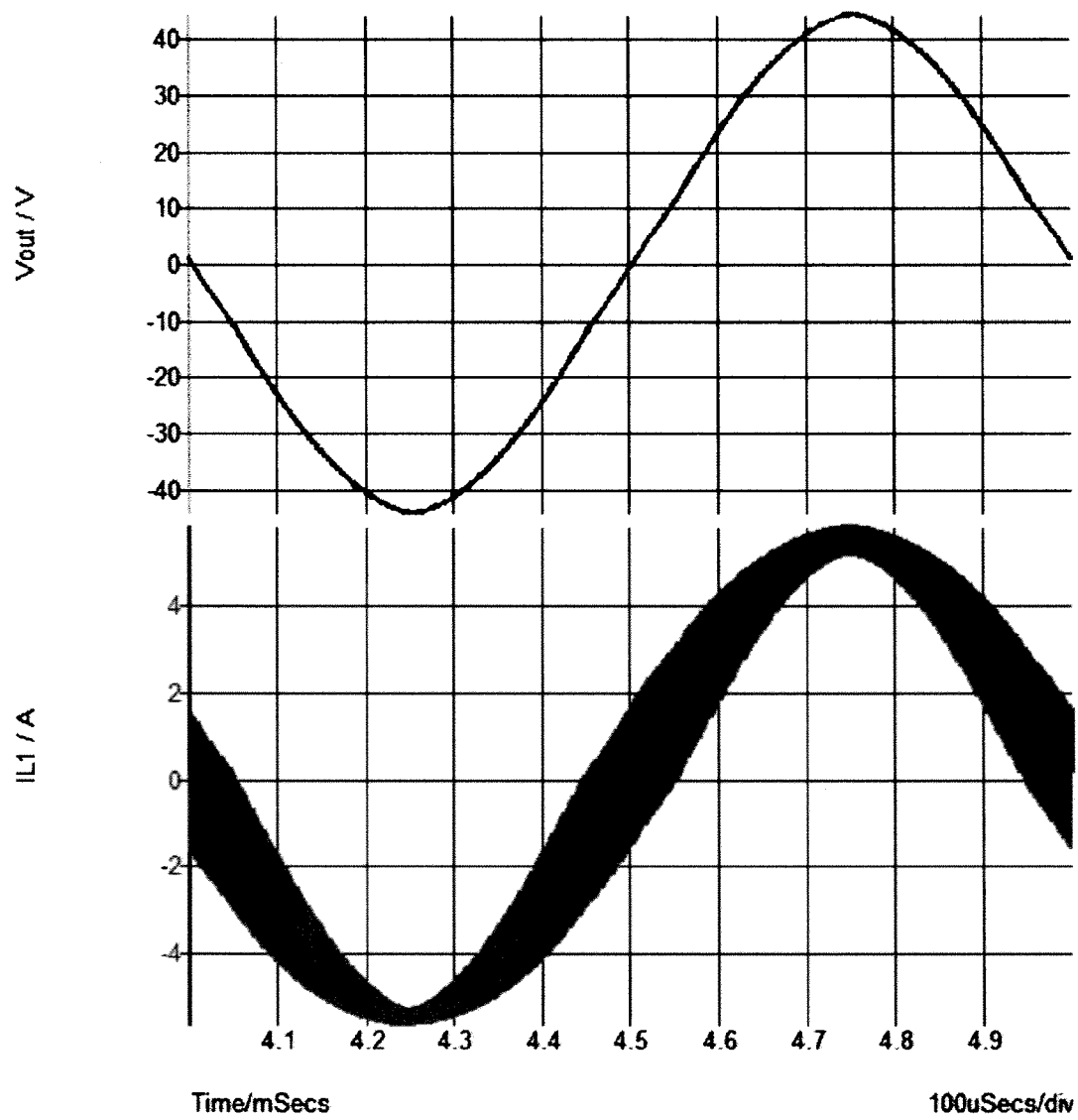
FIGS. 38A, 38B, 38C and 38D illustrate simulation results of various class D amplifier designs.
Figure 38A:
Figure 38B:
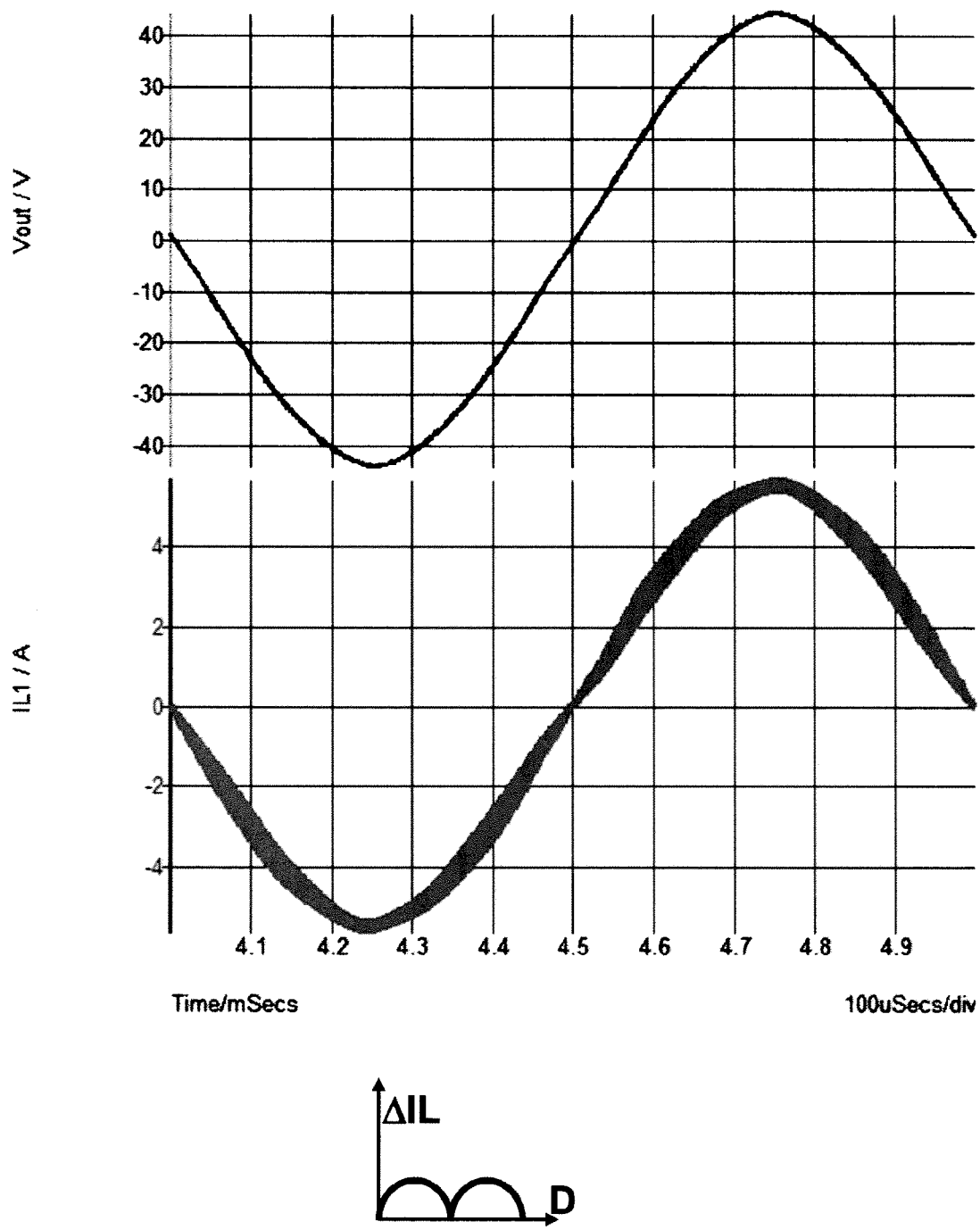
Figure 38C:
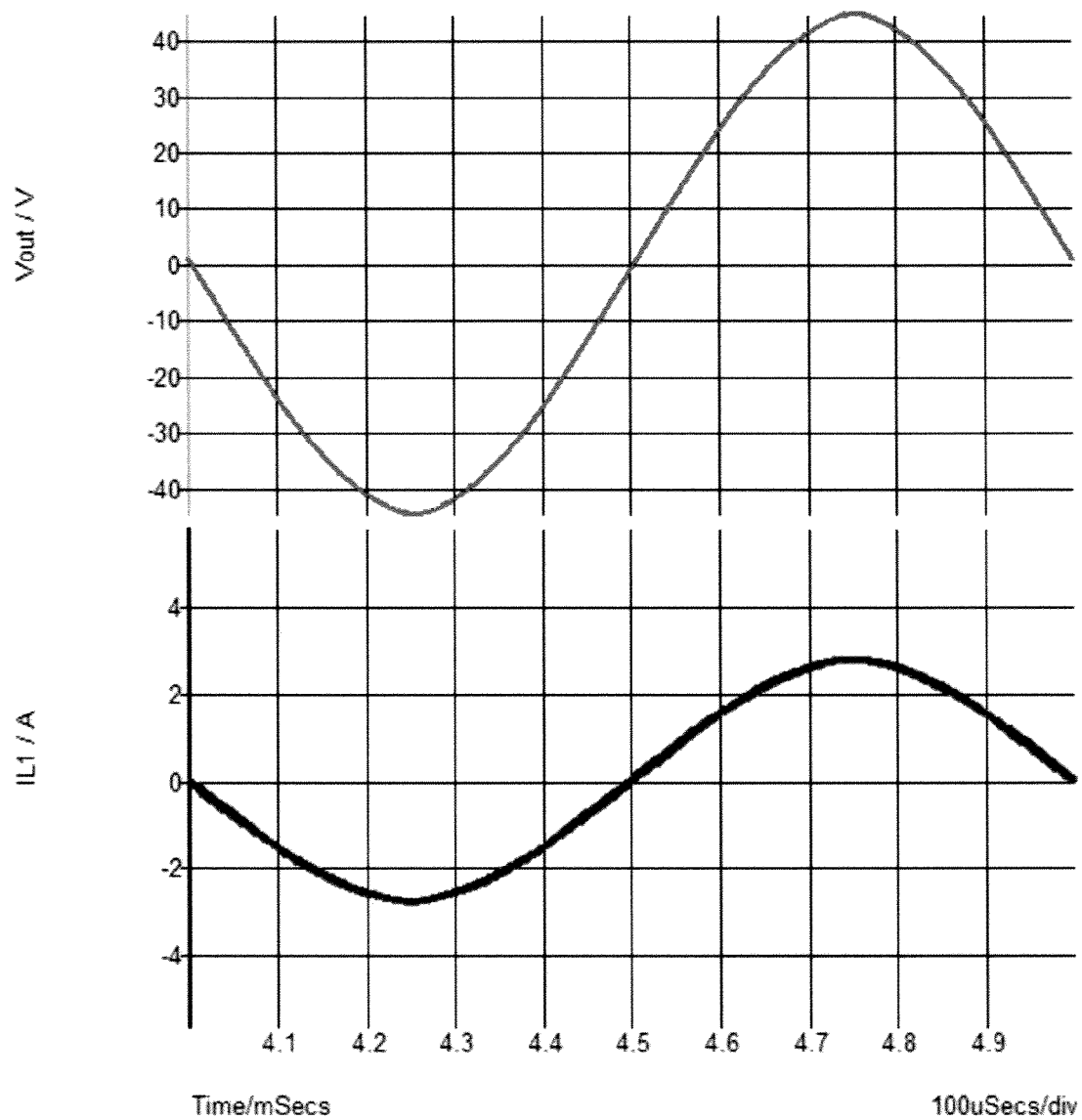
Figure 38C:
Figure 38D:
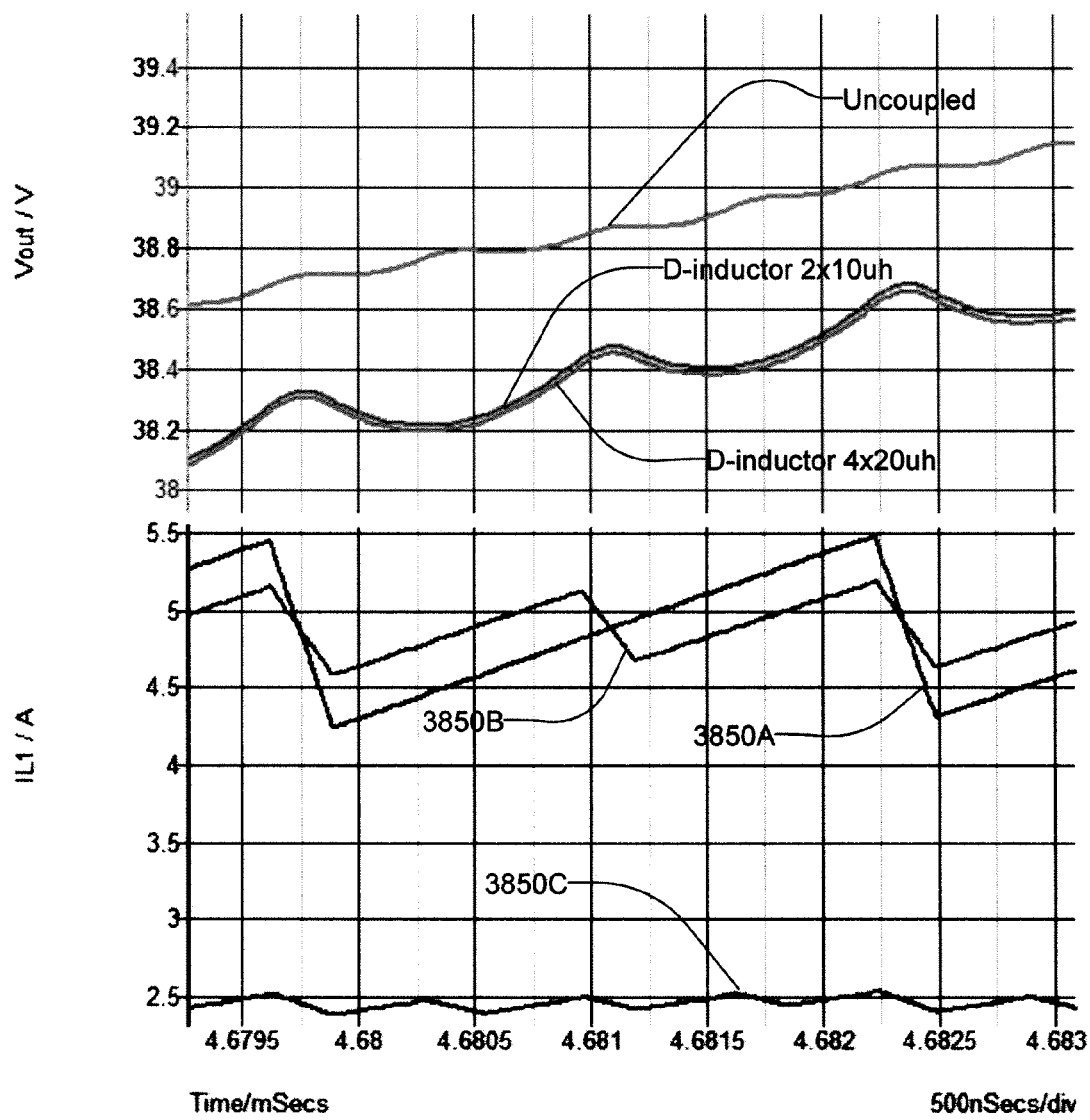

FIGS. 38A, 38B and 38C illustrate various simulation results using various class D amplifier designs at the same operational condition, such as, e.g., Fs=384 KHz, Vdc=50V, Signal=1 Khz. The current $I_{L1}$ is a current per winding. FIG. 38A shows the simulation result of the uncoupled design with 10 μH inductors. FIG. 38B shows the simulation result of the two phase D-inductor design with 2×10 μH coupled inductors. FIG. 38C shows the simulation result of the D-inductor design with 4×20 μH coupled inductors. FIG. 38D an enlarged view of the simulation results of FIGS. 38A, 38B and 38C. The waveform 3850A is the current $I_{L1}$ in FIG. 38A, which shows that the current ripple occurs at the fundamental switching frequency Fs. The waveform 3850B is the current $I_{L1}$ in FIG. 38B, which shows that the current ripple occurs at 2×Fs. The waveform 3850C is the current $L_{L1}$ in FIG. 38C, which shows that the current ripple occurs at 4×Fs.

Figure 39A:
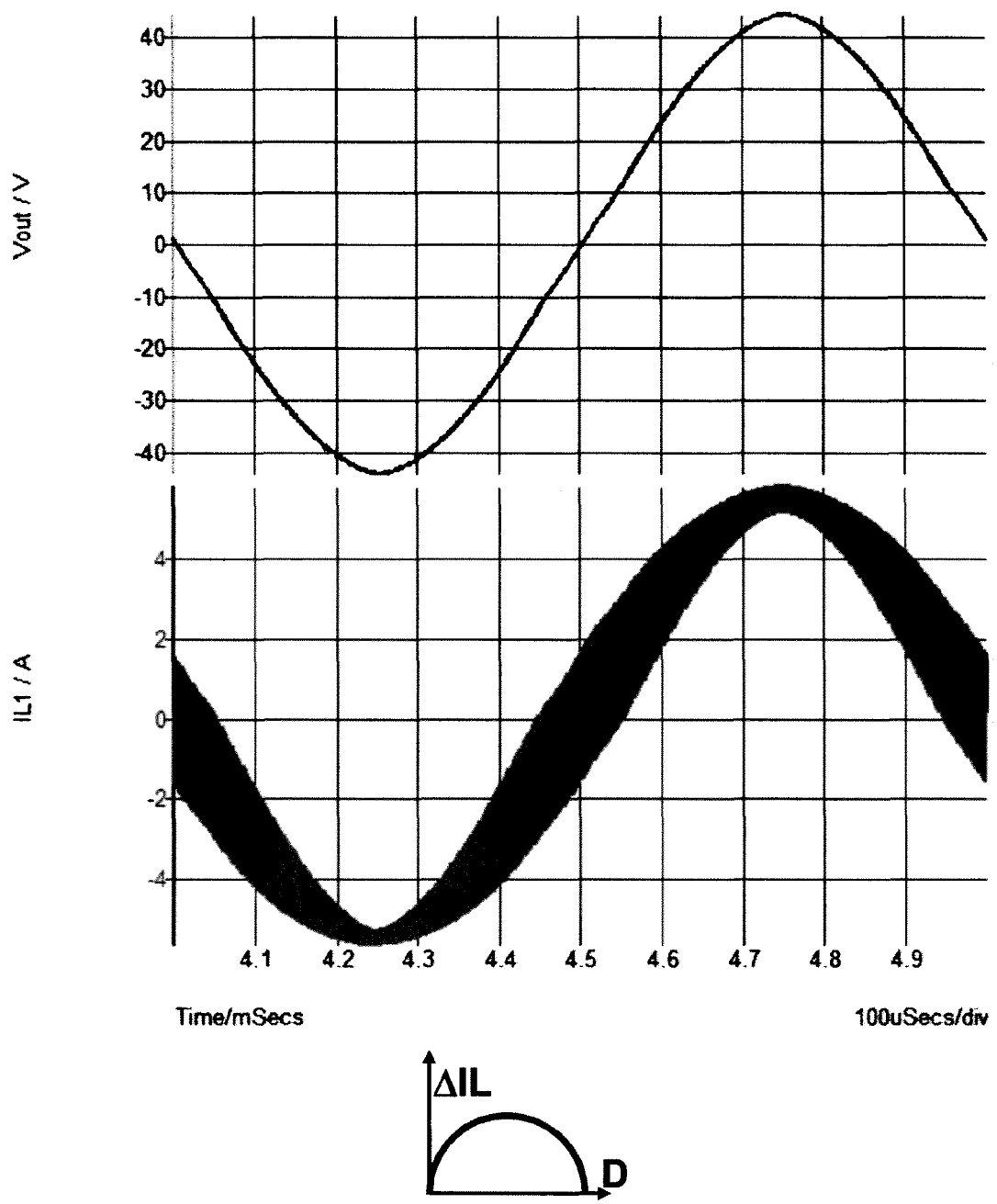
FIGS. 39A, 39B and 39C illustrate simulation results of various class D amplifier designs.
Figure 39B:
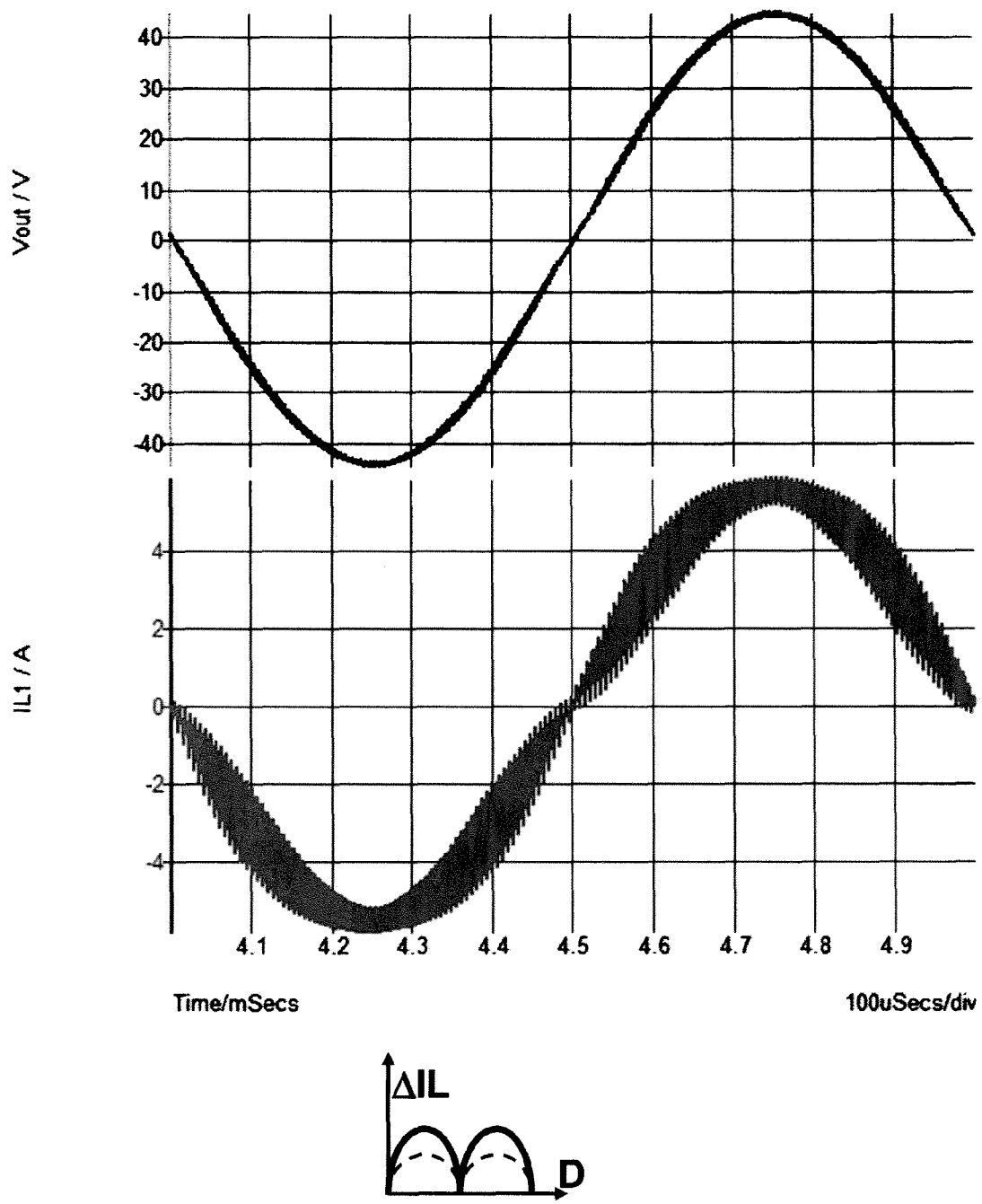
Figure 39C:
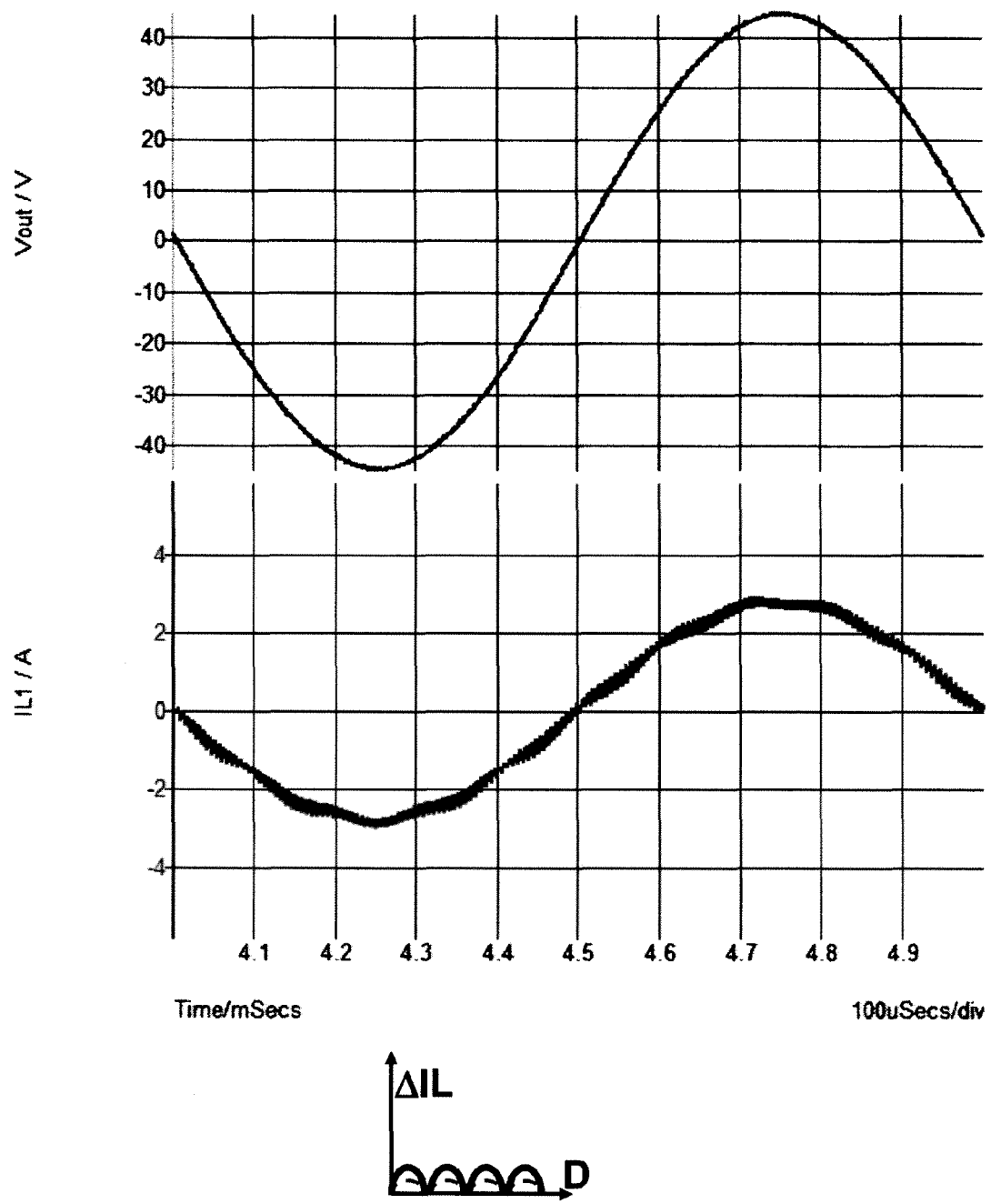
Figure 40A:
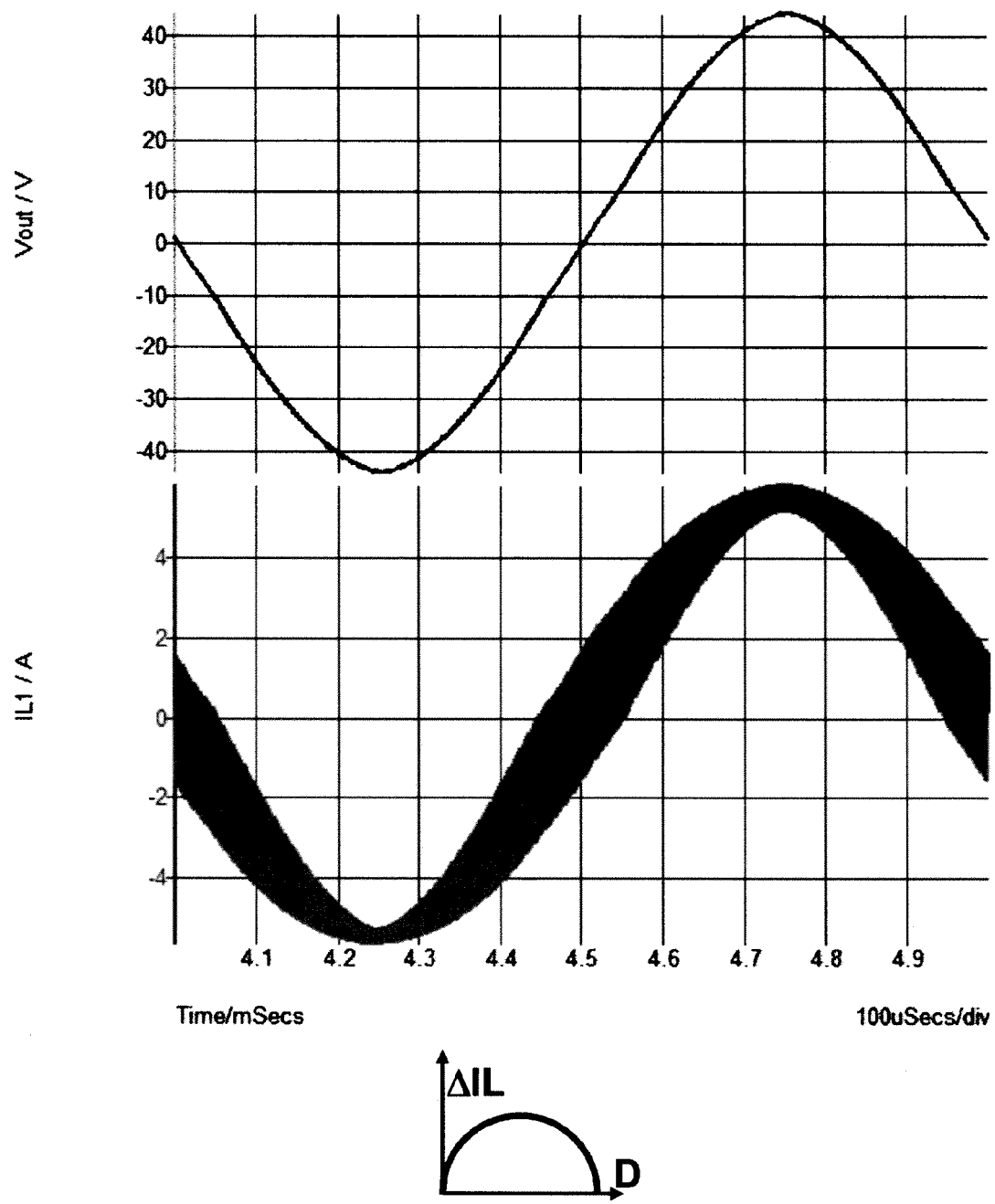
FIGS. 40A, 40B and 40C illustrate simulation results of various class D amplifier designs.
Figure 40B:
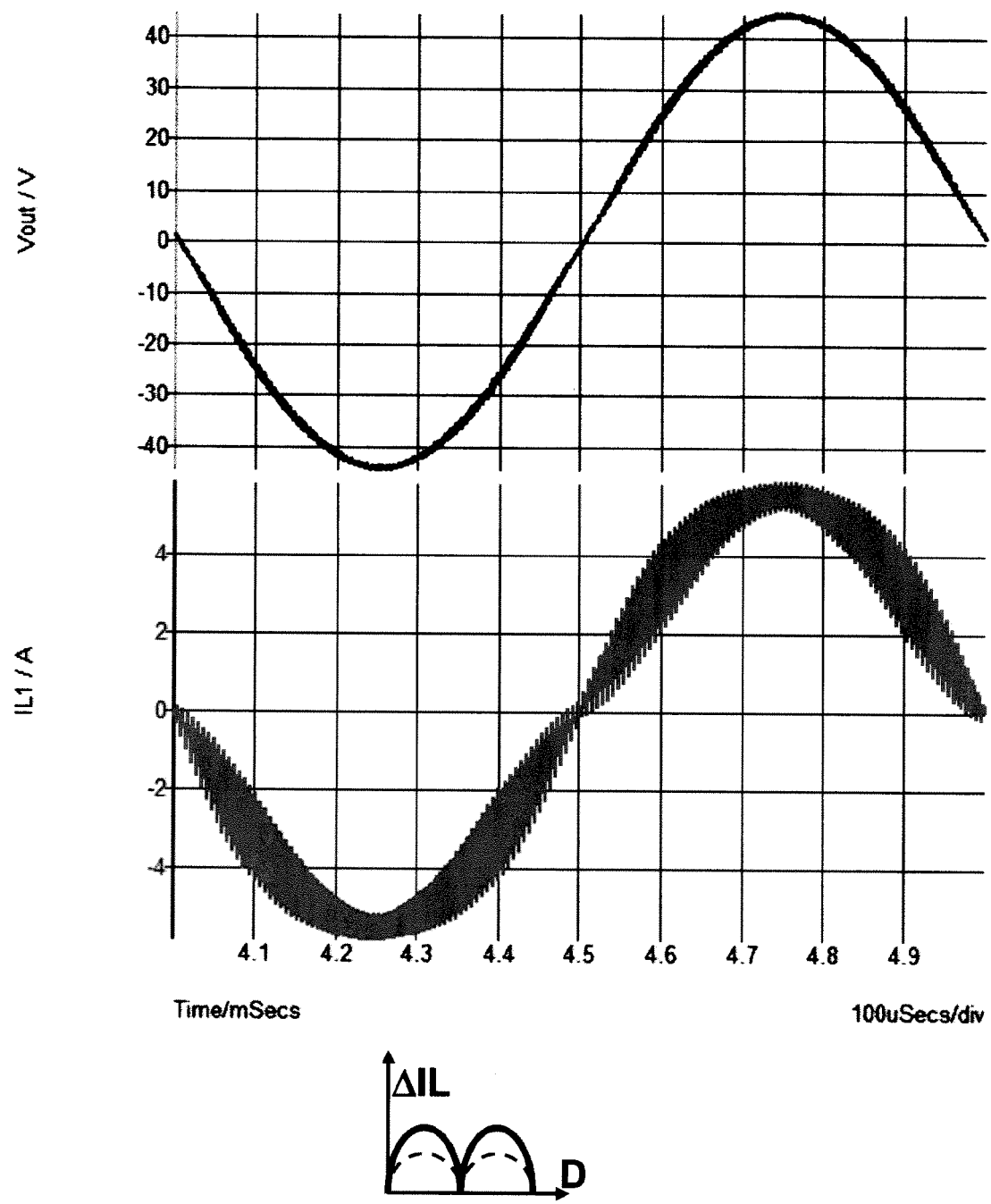
Figure 40C:
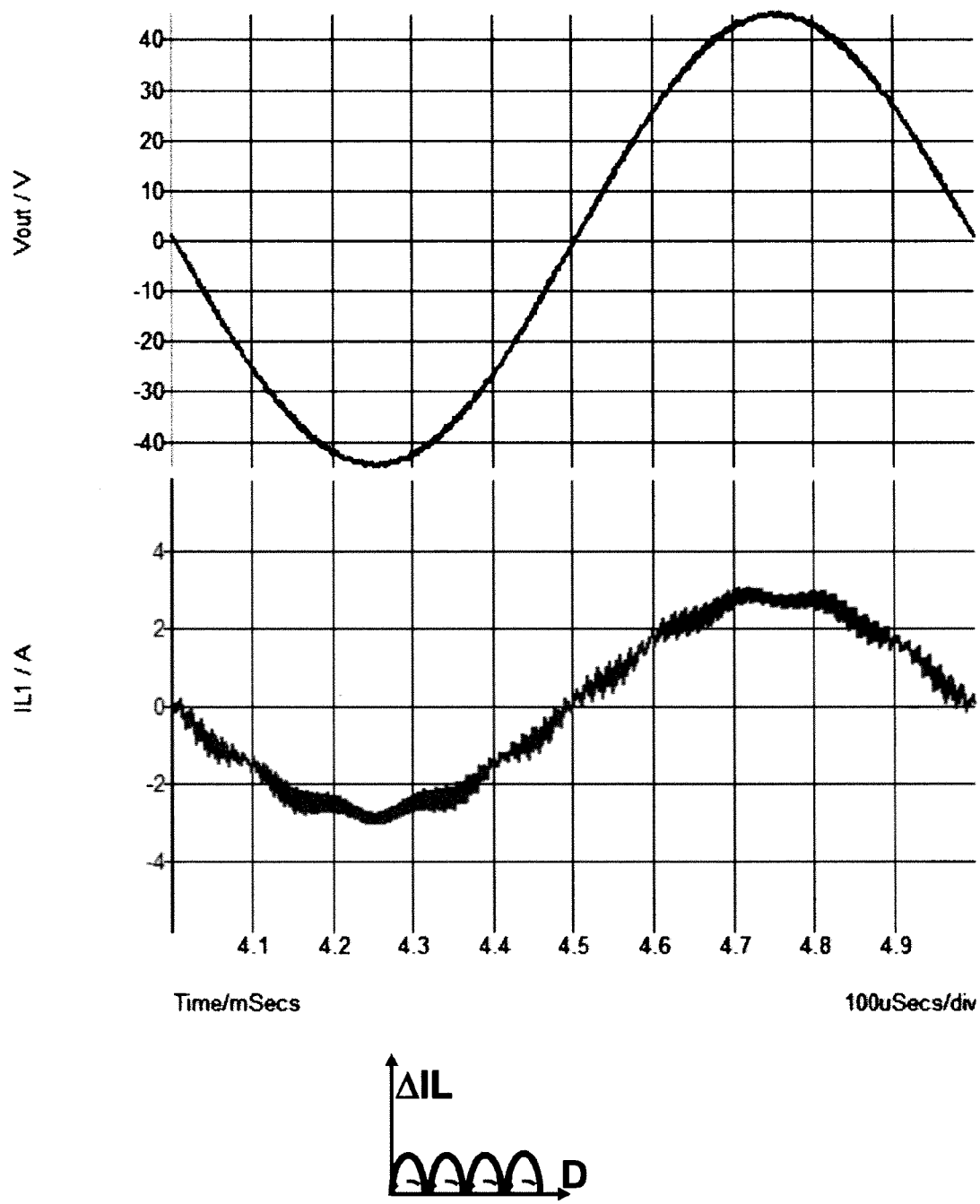

Regarding the efficiency trade-off in the D-inductor design, FIGS. 39A, 39B and 39C illustrate various simulation results using various class D amplifier designs at the same operational condition, such as, e.g., Vdc=50V, Signal=1 Khz, with the exception of the switching frequency Fs. The current $I_{L1}$ is a current per winding. FIG. 39A shows the simulation result of the uncoupled 10 μH design at Fs=384 Khz. FIG. 39B shows the simulation result of the D-inductor design with 2×10 μH coupled inductors at Fs=154 Khz. FIG. 39C shows the simulation result of the D-inductor design with 4×20 μH coupled inductors at Fs=154 Khz. FIGS. 40A, 40B and 40C also illustrate various simulation results using various class D amplifier designs at the same operational condition, such as, e.g., Vdc=50V, Signal=1 Khz, with the exception of the switching frequency Fs. The current $I_{L1}$ is a current per winding. FIG. 40A shows the simulation result of the uncoupled design at Fs=384 Khz. FIG. 40B shows the simulation result of the D-inductor design with 2×10 μH coupled inductors at Fs=154 Khz. FIG. 40C shows the simulation result of the D-inductor design with 4×20 μH coupled inductors at Fs=75 Khz.

Figure 41A:
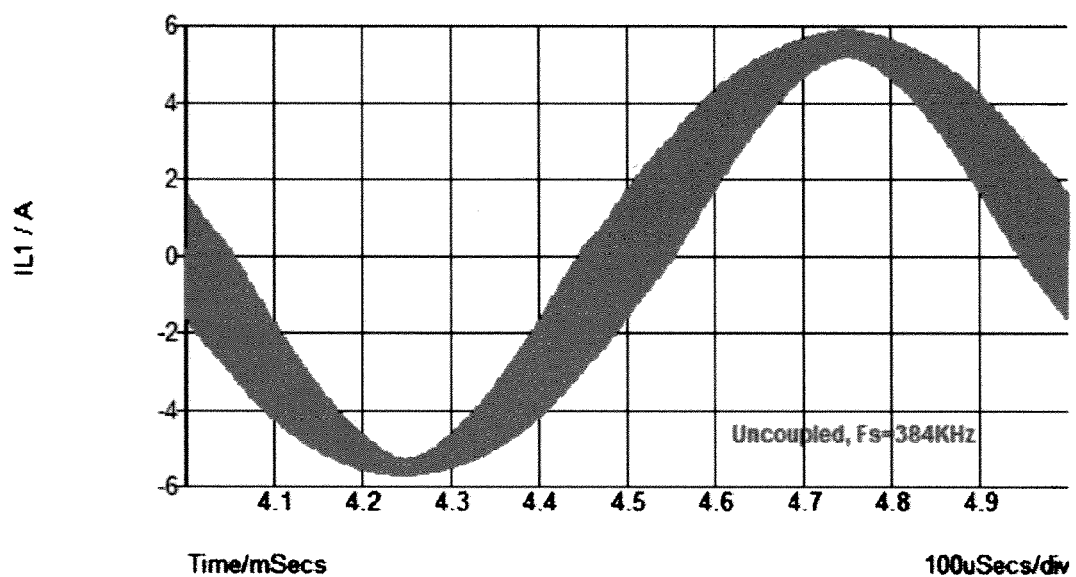
FIGS. 41A, 41B and 41C illustrate total output current ripple in various class D amplifier designs.
Figure 41B:
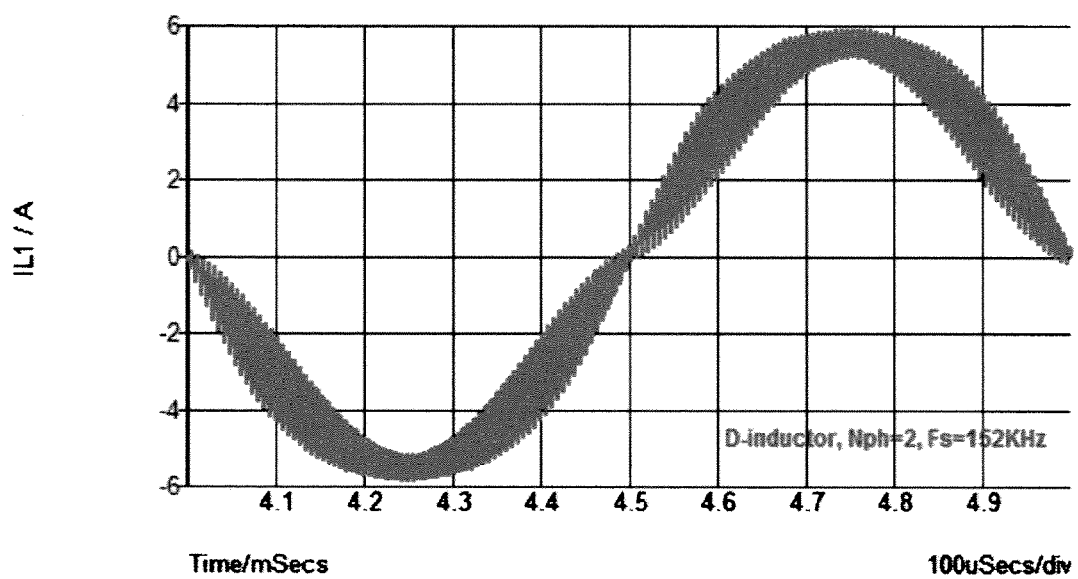
Figure 41C:
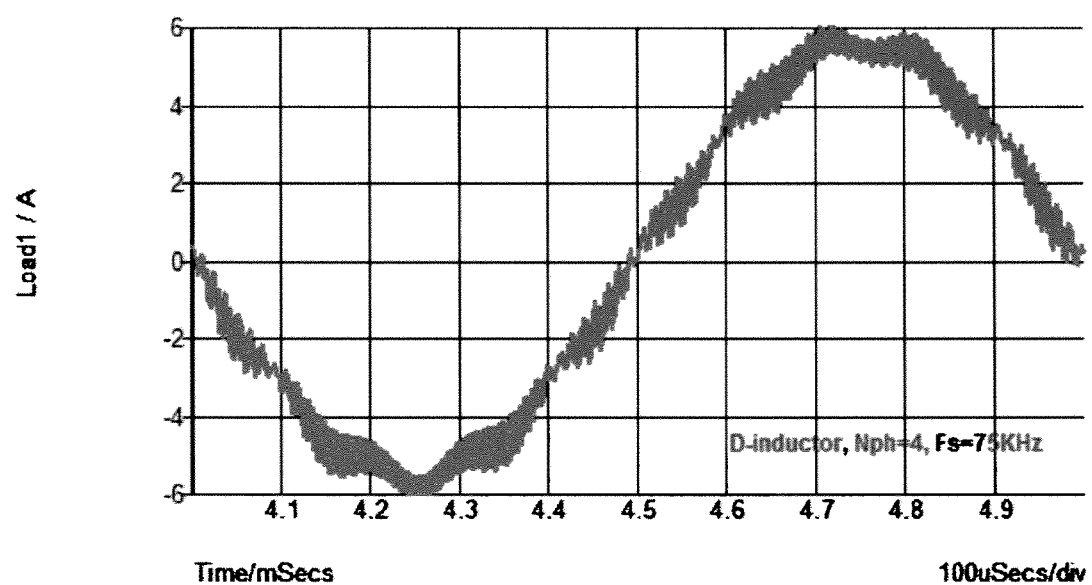

FIGS. 41A, 41B and 41C illustrate total output current ripple in various class D amplifier designs at the same operational condition, such as, e.g., Vdc=50V, Signal=1 Khz, with the exception of the switching frequency Fs. FIG. 41A shows the simulation result of the uncoupled design at Fs=384 Khz. FIG. 41B shows the simulation result of the D-inductor design with 2×10 μH coupled inductors at Fs=152 Khz. FIG. 41C shows the simulation result of the D-inductor design with 4×20 μH coupled inductors at Fs=75 Khz. As shown in FIGS. 41B and 41C, a significant decrease in the switching frequency Fs may allow proportionally to decrease the switching loss and to improve the efficiency while the current ripple, i.e., noise, at the output may be still below the uncoupled design, and the filtering properties of the LC at the output may remain the same, i.e., same corner frequency for double poles, and the like.

Figure 42A:
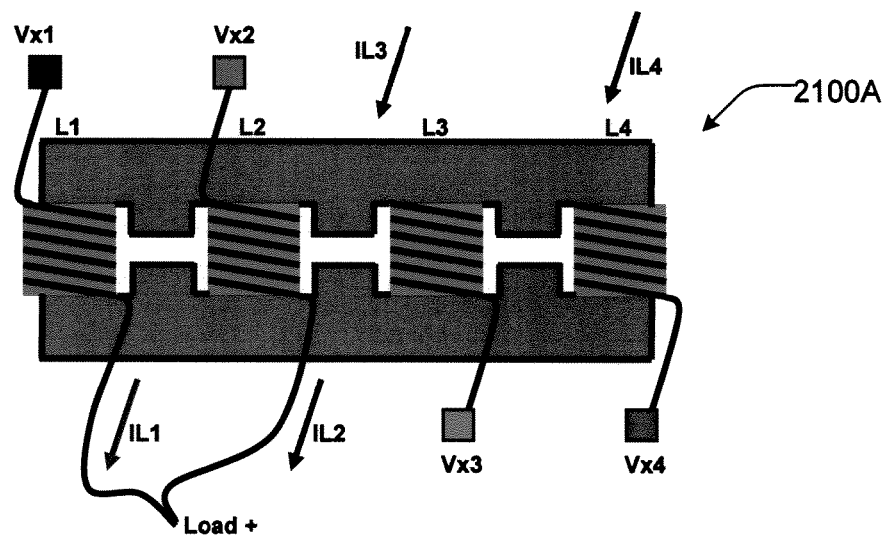
FIGS. 42A, 42B, 43A, 43B, 43C, 43D, 44A, 44B, 45A, 45B, 46A, 46B, and 47 illustrate various implementations of the D-inductor design according to various embodiments of the invention.
Figure 42B:
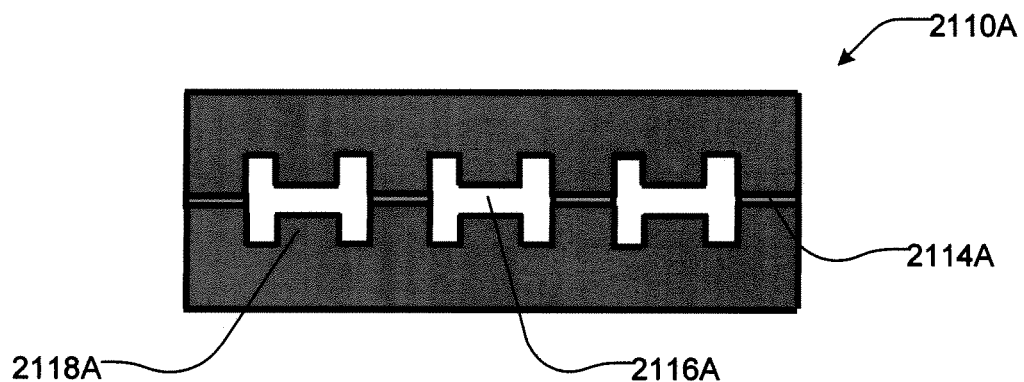

FIGS. 42A, 42B, 43A, 43B, 43C, 43D, 44A, 44B, 45A, 45B, 46A, 46B and 47 illustrates various implementations of the D-inductor design according to various embodiments of the invention. FIG. 42A illustrates a D-inductor design 2100A according to an embodiment of the invention. As shown in FIG. 42B, the core 2110A of the D-inductor design 2100A may be constructed with two halves. The air gap 2114A, which may be a non-magnetic spacer, or the like, may adjust the magnetizing inductance. The air gap 2116A between the windings may adjust the leakage, which may be several times smaller than the magnetizing. The D-inductor design 2100A may further include a plurality of leakage core sections 2118A. As noted above, more phases may be added in a similar manner for each half bridge.

Figure 43A:
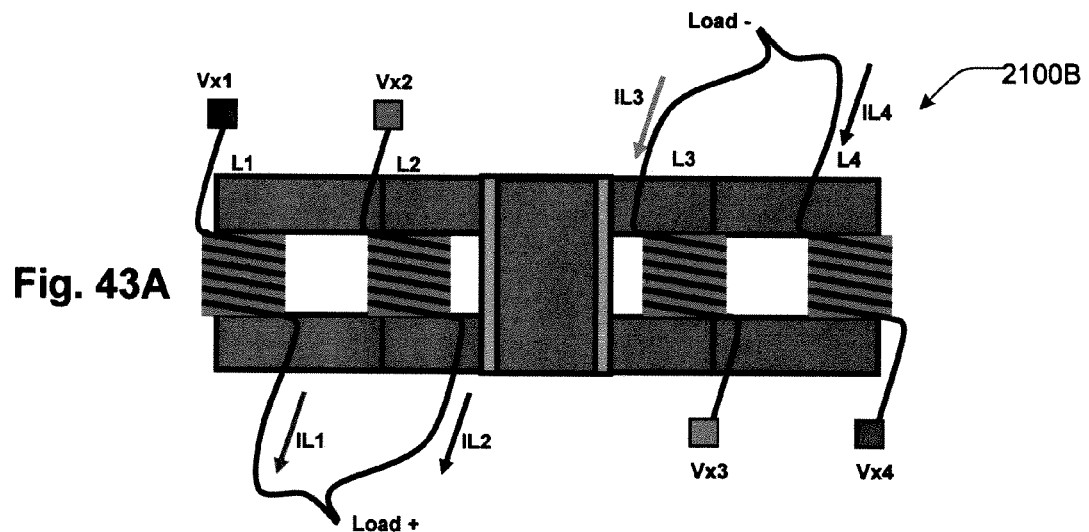
Figure 43B:
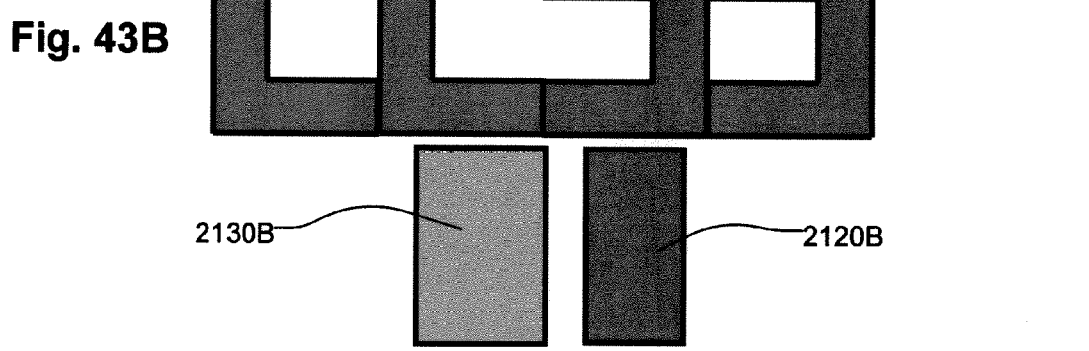
Figure 43C:
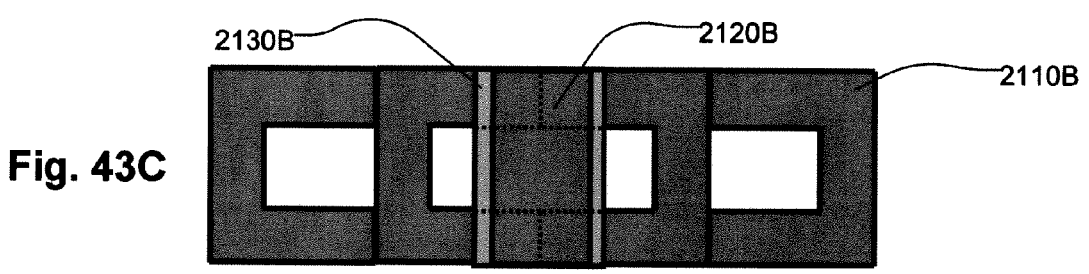
Figure 43D:
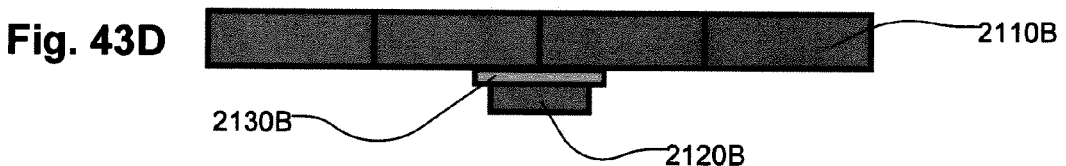

FIG. 43A illustrates another D-inductor design 2100B according to another embodiment of the invention. FIG. 43B illustrates a top view of the core 2110B of the D-inductor design 2100B with a leakage core section 2120B and an air gap 2130B that are separated from the main body of the core 2110B. FIG. 43C illustrates a top view of the core 2110B with the leakage core section 2120B and the air gap 2130B attached to the main body of the core 2110B. FIG. 43D illustrates a side view of the core 2110B. Referring to FIGS. 43A, 43B, 43C and 43D concurrently, the D-inductor design 2100B may include one U-core section per winding, e.g., four U-cores for four windings. In the D-inductor design 2100B, more phases may be added in the similar manner for each half bridge. Also, the leakage core section 2120B may be added with the controlled air gap 2130B for leakage inductance control. The air gap 2130B may be a non-magnetic spacer or the like.

Figure 44A:
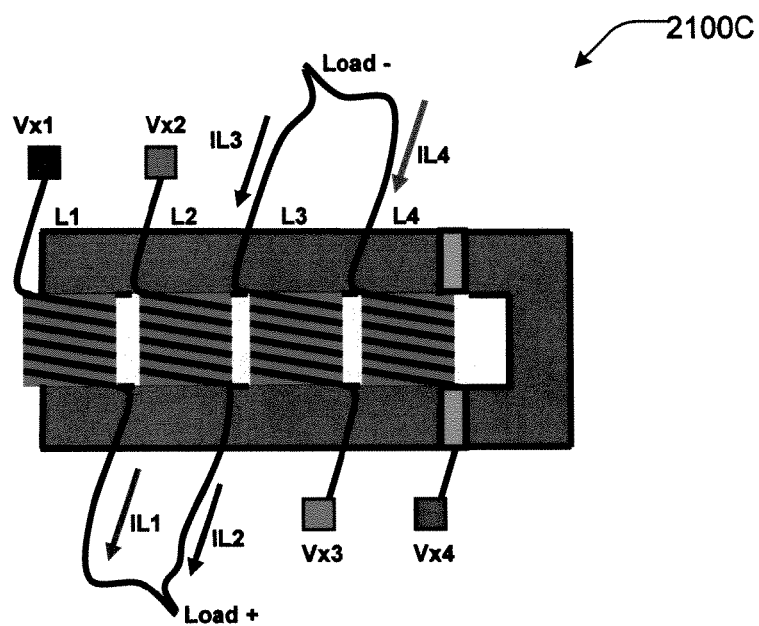
Figure 44B:
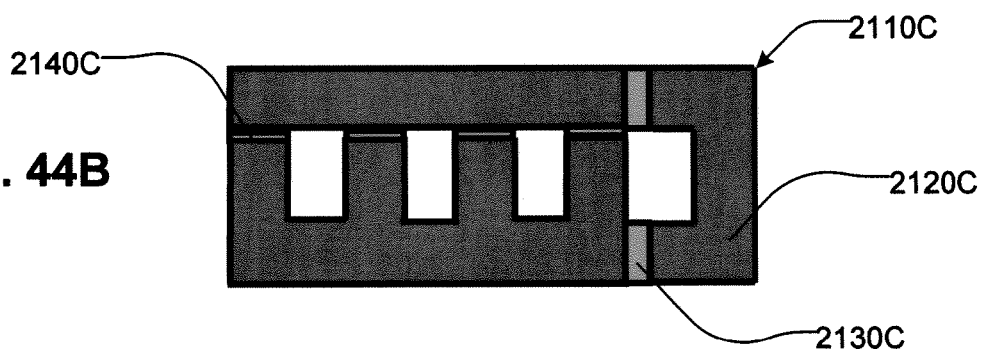

FIG. 44A illustrates a D-inductor design 2100C according to another embodiment of the invention. FIG. 44B illustrates the core section 2110C of the D-inductor design 2100C. The core section 2110C may include a leakage core section 2120C, an air gap 2130C for leakage inductance control, and another air gap 2140C for magnetizing inductance control. Thus, the core section 2110C may be constructed with two pieces and the leakage core section 2120C, in which more phases may be added in the similar manner for each half bride. The air gap 2130C may be provided for the leakage core section 2120C to adjust the leakage, which may be several times smaller than the magnetizing inductance. The air gap 2140C under the windings may adjust the magnetizing inductance.

Figure 45A:
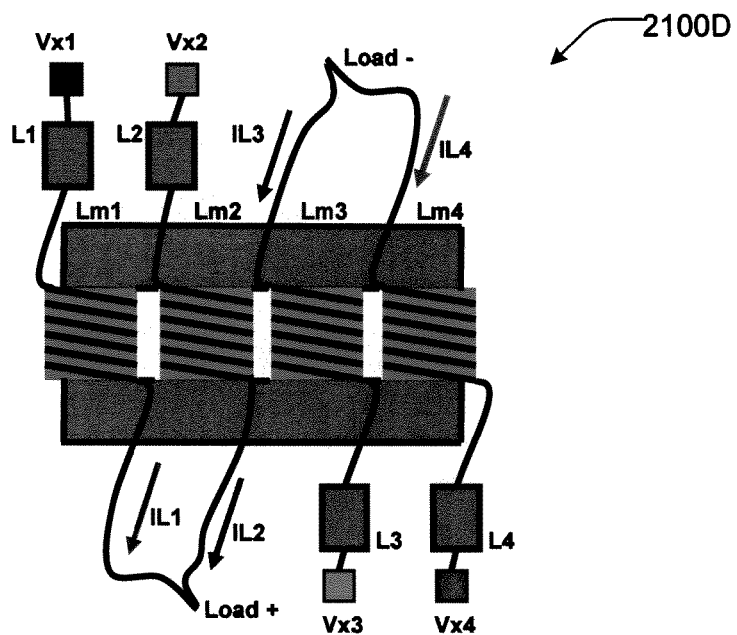
Figure 45B:
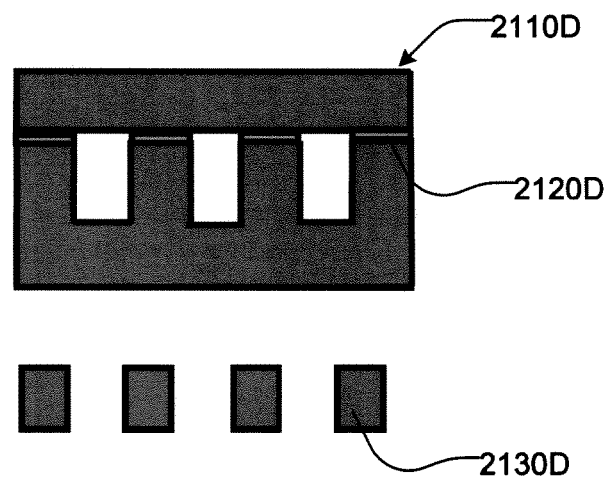

FIG. 45A illustrates a D-inductor design 2100D according to another embodiment of the invention. FIG. 45B illustrates the core section 2110D of the D-inductor design 2100D, in which the core section 2110D is constructed with two pieces with an air gap 2120D therebetween for magnetizing inductance control. The core section 2110D may further include external inductors 2130D, each of which may be provided for each winding. The external inductors 2130 may be any off-the-shelf discrete inductor, such as, e.g., toroid, staple, power or molded core, rectangular ferrite shape, and the like. More phases may be added in the similar manner for each half bridge.

Figure 46A:
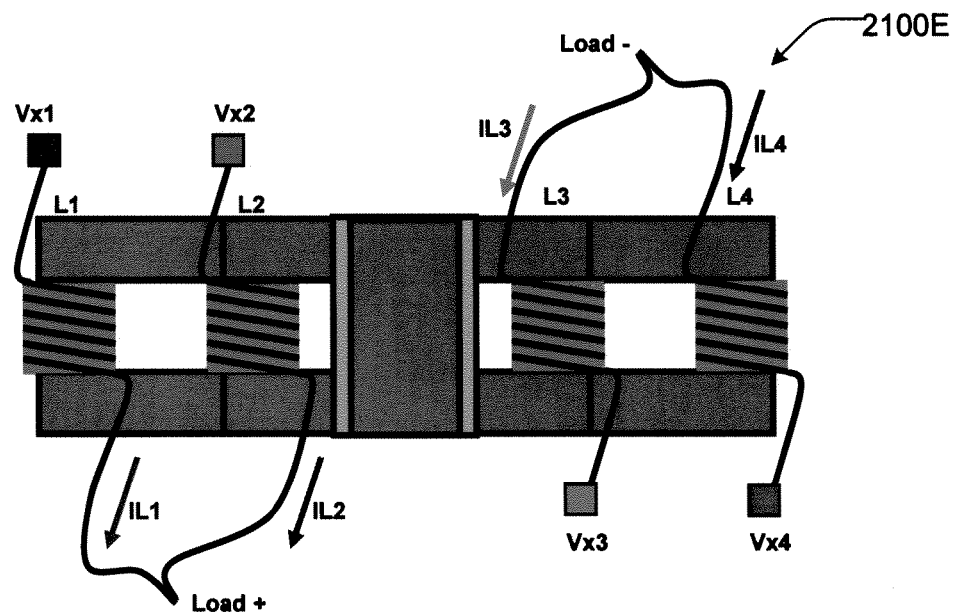
Figure 46B:
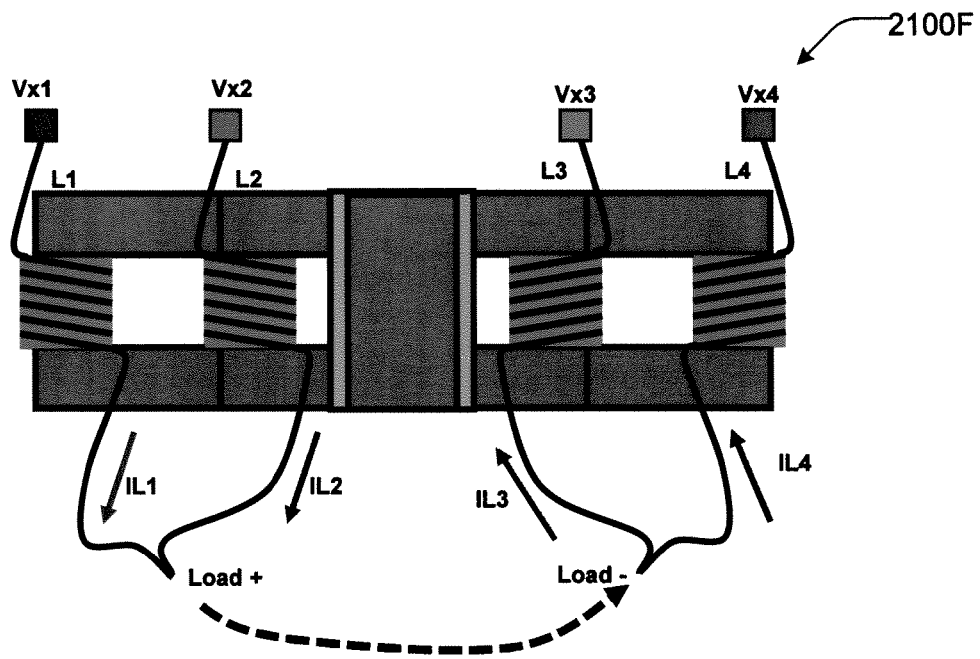
Figure 47:
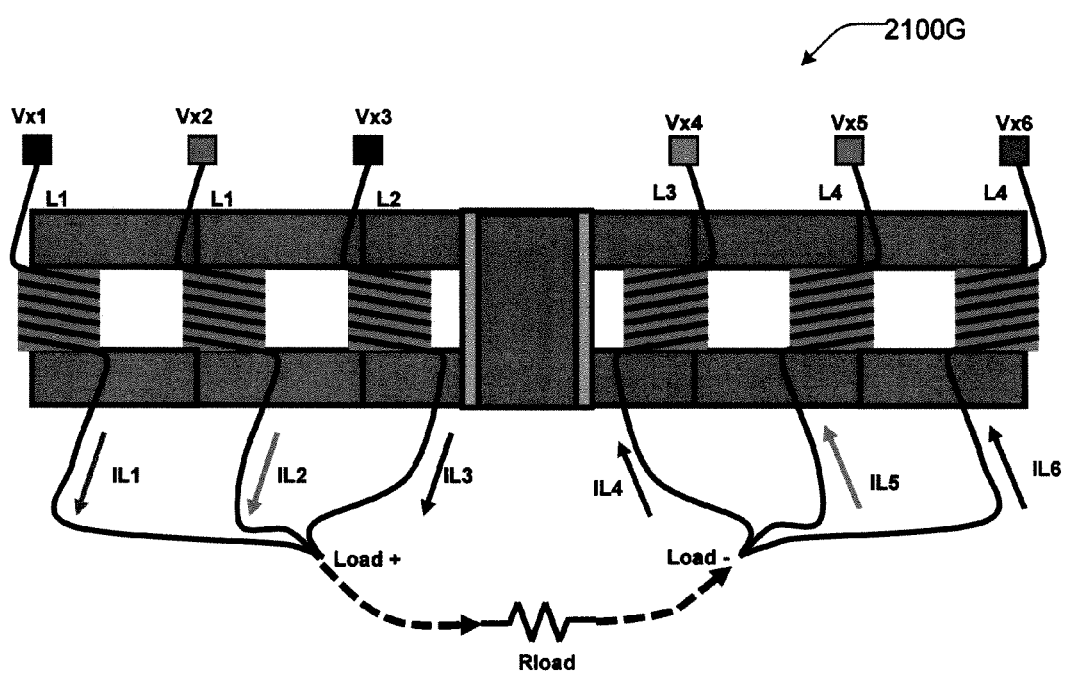

FIG. 46A shows a D-inductor design 2100E, in which all of the windings are reverse coupled, i.e., out of phase, to each other, given the shown direction of the currents. The D-inductor design 2100E may be modified to improve the layout. For example, as shown in FIG. 46B, a half of the windings may be mirrored such that all of the load connections are on the same side, and all of the Vx connections are also on the same side. All of the windings may be still reverse coupled, i.e., out of phase, to each other, given the shown direction of the currents. This arrangement may improve the layout because the D inductor 2100F may be placed between the power stages and the load with output filter capacitors. FIG. 47 shows a D-inductor design 2100G according to another embodiment of the invention, which shows the layout improvement shown in FIG. 46B applied to the D-inductor design 2100G with an increased number of phases, e.g., 2×3. Further, similar to FIG. 46B, a half of the windings may be mirrored such that the load connections are on the same side and the Vx connections are also on the same side. All of the windings may be still reverse coupled, i.e., out of phase, to each other.

Accordingly, the D-inductor design in class D amplifiers may allow minimization of output filters since two independent inductors are changed into a single one where DC flux cancels out and AC flux has more than two-fold improvement in amplitude for the two phase D-inductor, and larger improvement for a larger number of D-inductor phases. The more than two-fold improvement in the current ripple of the output stage may be traded for better efficiency and thermal performance while still maintaining low SNR at the output. This may contribute to saving energy in general and increasing the battery life in portable devices. The unique D-inductor property that minimum current ripple occurs at zero crossing may offer a significantly better SNR and may open other possibilities for design optimization in terms of cost and performance.

Accordingly, the D-inductor design may be used in consumer electronics/audio applications, such as, e.g., home theater system, radio receiver, car audio, cell phone, telephone speaker, laptop audio, or mobile audio, and the like. Other audio applications can include distributed audio systems with multiple channels for buildings or parks, amplifiers for hearing aid. Also, the D-inductor design may be used to drive ultrasonic transducers and piezo devices, as noted above.

Other applications for the D-inductor design may include a DC-AC inverter for, e.g., solar or wind power, and the like, where DC voltage directly from the power source, such as, e.g., solar panel, wind turbine, or the like, or DC voltage at the output of possibly inserted maximum power point tracker or other power conditioning or regulating equipment, may be modulated at a power line frequency either for direct use as an AC power source, or injecting the generated power into the power grid.

The D-inductor design may also be used in a motor driver. For example, the D-inductor deign may be used to control a DC motor with varying DC voltage with a desired value and polarity for the targeted speed and direction of the motor rotation, which may be adjusted on demand. Further, the D-inductor design may be used for DC-AC applications to drive an AC motor.

While several particular forms of the invention have been illustrated and described, it will also be apparent that various modifications can be made without departing from the scope of the invention. It is also contemplated that various combinations or subcombinations of the specific features and aspects of the disclosed embodiments can be combined with or substituted for one another in order to form varying modes of the invention. Accordingly, it is not intended that the invention be limited, except as by the appended claims.

We claim:
1. A circuit comprising:
a first input terminal for receiving a first pulsed signal;
a second input terminal for receiving a second pulsed signal;
a load; and
a plurality of LC filters connected to each other in series, wherein one of the plurality of LC filters comprises a coupled inductor that comprises a first winding and a second winding that are at least partially magnetically coupled to each other in a manner that both couples the first pulsed signal and the second pulsed signal and presents differential inductance to the first pulsed signal and the second pulsed signal; and
wherein the second pulsed signal is a phase-shifted signal of the first pulsed signal, and wherein the coupling of the first pulsed signal and the second pulsed signal operates to combine the first pulsed signal and the second pulsed signal into one signal with less ripple than either the first pulsed signal and the second pulsed signal have separately.

2. The circuit of claim 1, wherein only one of the plurality of LC filters comprises the coupled inductor.

3. The circuit of claim 1, wherein the plurality of LC filters comprises:
a first LC filter comprising the coupled inductor; and
a second LC filter comprising one of an uncoupled inductor and a common mode choke.

4. The circuit of claim 1, wherein the circuit is referenced to a return current plane.

5. The circuit of claim 1, wherein the circuit is referenced to a common plane.

6. The circuit of claim 1, wherein a voltage applied across each of the first and second windings is an average of the first and second pulsed signals.

7. The circuit of claim 1, wherein a frequency of a first current flowing through the first winding is doubled by the second pulsed signal applied to the second winding.

8. An output filter comprising the circuit of claim 1.

9. An amplifier comprising the output filter of claim 8.

10. The amplifier of claim 9, wherein the amplifier comprises a class D amplifier.

11. The amplifier of claim 10, further comprising:
a first switch pair comprising first and second switches coupled in series and controlled by a first control signal to generate the first pulsed signal; and
a second switch pair comprising third and fourth switches coupled in series and controlled by a second control signal to generate the second pulsed signal,
wherein the first and second switch pairs are coupled in parallel between a voltage source and a ground, and
wherein the first input terminal is connected to a first node between the first and second switches, and the second input terminal is connected to a second node between the third and fourth switches.

12. The amplifier of claim 10, wherein the first switch is controlled by the first control signal, and the second switch is controlled by an inverted signal of the first control signal, and the third switch is controlled by an inverted signal of the second control signal, and the fourth switch is controlled by the second control signal.

13. The amplifier of claim 11, further comprising:
a first modulator configured to produce the first control signal based on a first ramp signal and an audio signal; and a second modulator configured to produce the second control signal based on a second ramp signal and the audio signal,
wherein the second ramp signal is a phase-shifted signal of the first ramp signal.

14. The amplifier of claim 11, wherein the second control signal is produced by delaying the first control signal.

15. A method of filtering a signal, said method comprising:
providing a plurality of LC filters connected to each other in series, wherein one of the plurality of LC filters comprises a coupled inductor that comprises a first winding and a second winding;
applying a first pulsed signal to the first winding;
applying a second pulsed signal to the second winding, wherein the first and second windings are at least partially magnetically coupled in a manner that both couples the first pulsed signal and the second pulsed signal and presents differential inductance to the first pulsed signal and the second pulsed signal,
providing an output current to a load coupled between the first and second windings, the output current being sourced from the first winding and sunk at the second winding,
wherein the second pulsed signal is a phase-shifted signal of the first pulsed signal, and wherein the coupling of the first pulsed signal and the second pulsed signal operates to combine the first pulsed signal and the second pulsed signal into one signal with less ripple than either the first pulsed signal and the second pulsed signal have separately.

16. The method of claim 15, further comprising generating the first and second pulsed signals based on first and second control signals, the second control signal comprising a phase-shifted signal of the first control signal.

17. The method of claim 16, further comprising generating the first and second control signals based on an input signal and first and second ramp signals, the second ramp signal comprising a phase-shifted signal of the first ramp signal.

18. The method of claim 16, wherein the first control signal is generated based on the first ramp signal and the input signal, and the second control signal is generated based on the second ramp signal and the input signal.

* * * * *